(12) United States Patent
Sinclair et al.

(10) Patent No.: US 8,214,583 B2
(45) Date of Patent: Jul. 3, 2012

(54) DIRECT FILE DATA PROGRAMMING AND DELETION IN FLASH MEMORIES

(75) Inventors: Alan W. Sinclair, Maddiston (GB); Peter J. Smith, Midlothian (GB)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/775,639

(22) Filed: May 7, 2010

(65) Prior Publication Data
US 2010/0223423 A1 Sep. 2, 2010

Related U.S. Application Data

(60) Continuation of application No. 11/342,170, filed on Jan. 26, 2006, which is a division of application No. 11/060,174, filed on Feb. 16, 2005.

(51) Int. Cl.
*G06F 12/00* (2006.01)
*G06F 13/00* (2006.01)
*G06F 13/28* (2006.01)
*G06F 9/26* (2006.01)
*G06F 9/34* (2006.01)

(52) U.S. Cl. . 711/103; 711/202; 711/206; 711/E12.058; 711/E12.059; 711/E12.008

(58) Field of Classification Search .................... 711/103
See application file for complete search history.

(56) References Cited

U.S. PATENT DOCUMENTS

| 4,800,520 A | 1/1989 | Iijima |
| 4,802,117 A | 1/1989 | Chrosny et al. |
| 5,226,155 A | 7/1993 | Iijima |
| 5,369,754 A | 11/1994 | Fandrich et al. |
| 5,388,083 A | 2/1995 | Assar et al. |
| 5,404,485 A | 4/1995 | Ban |
| 5,544,356 A | 8/1996 | Robinson et al. |
| 5,570,315 A | 10/1996 | Tanaka et al. |
| 5,592,662 A | 1/1997 | Sawada et al. |
| 5,592,669 A | 1/1997 | Robinson et al. |
| 5,602,987 A | 2/1997 | Harari et al. |

(Continued)

FOREIGN PATENT DOCUMENTS

CN 1466060 A 1/2004

(Continued)

OTHER PUBLICATIONS

Wu et al., Envy: A Non-Volatile, Main Memory Storage System, ACMSigplan Notices, vol. 29, No. 11, Nov. 1, 2994, pp. 86-97.*

(Continued)

*Primary Examiner* — Edward Dudek, Jr.
*Assistant Examiner* — Matthew Chrzanowski
(74) *Attorney, Agent, or Firm* — Davis Wright Tremaine LLP

(57) ABSTRACT

Host system data files are written directly to a large erase block flash memory system with a unique identification of each file and offsets of data within the file but without the use of any intermediate logical addresses or a virtual address space for the memory. Directory information of where the files are stored in the memory is maintained within the memory system by its controller, rather than by the host. The file based interface between the host and memory systems allows the memory system controller to utilize the data storage blocks within the memory with increased efficiency.

28 Claims, 32 Drawing Sheets

U.S. PATENT DOCUMENTS

| | | | |
|---|---|---|---|
| 5,619,690 A | 4/1997 | Matsumani et al. | |
| 5,628,014 A | 5/1997 | Cecchini et al. | |
| 5,634,050 A | 5/1997 | Krueger et al. | |
| 5,774,397 A | 6/1998 | Endoh et al. | |
| 5,799,168 A | 8/1998 | Ban | |
| 5,809,558 A | 9/1998 | Matthews et al. | |
| 5,832,493 A * | 11/1998 | Marshall et al. | 707/697 |
| 5,867,641 A | 2/1999 | Jenett | |
| 5,896,393 A | 4/1999 | Yard et al. | |
| 5,907,854 A | 5/1999 | Kerns | |
| 5,928,347 A | 7/1999 | Jones | |
| 5,933,846 A | 8/1999 | Endo | |
| 5,937,425 A | 8/1999 | Ban | |
| 5,953,538 A | 9/1999 | Duncan et al. | |
| 5,966,720 A | 10/1999 | Itoh et al. | |
| 5,978,893 A | 11/1999 | Bakshi et al. | |
| 5,987,478 A | 11/1999 | See et al. | |
| 5,996,047 A | 11/1999 | Peacock | |
| 6,014,724 A | 1/2000 | Jenett | |
| 6,021,415 A | 2/2000 | Cannon et al. | |
| 6,038,636 A | 3/2000 | Brown et al. | |
| 6,046,935 A | 4/2000 | Takeuchi et al. | |
| 6,069,827 A | 5/2000 | Sinclair | |
| 6,094,693 A | 7/2000 | Haneda | |
| 6,145,069 A | 11/2000 | Dye | |
| 6,148,354 A | 11/2000 | Ban et al. | |
| 6,216,204 B1 | 4/2001 | Thiriet | |
| 6,223,271 B1 | 4/2001 | Cepulis | |
| 6,226,728 B1 | 5/2001 | See et al. | |
| 6,256,690 B1 | 7/2001 | Carper | |
| 6,275,804 B1 | 8/2001 | Carl et al. | |
| 6,279,069 B1 | 8/2001 | Robinson et al. | |
| 6,373,746 B1 | 4/2002 | Takeuchi et al. | |
| 6,385,690 B1 | 5/2002 | Iida et al. | |
| 6,389,433 B1 | 5/2002 | Bolosky et al. | |
| 6,412,040 B2 | 6/2002 | Hasbun et al. | |
| 6,421,279 B1 | 7/2002 | Tobita et al. | |
| 6,426,893 B1 | 7/2002 | Conley et al. | |
| 6,446,140 B1 | 9/2002 | Nozu | |
| 6,456,528 B1 | 9/2002 | Chen | |
| 6,467,015 B1 | 10/2002 | Nolan et al. | |
| 6,467,021 B1 | 10/2002 | Sinclair | |
| 6,477,616 B1 | 11/2002 | Takahashi | |
| 6,480,935 B1 | 11/2002 | Carper et al. | |
| 6,484,937 B1 | 11/2002 | Devaux et al. | |
| 6,490,649 B2 | 12/2002 | Sinclair | |
| 6,493,811 B1 | 12/2002 | Blades et al. | |
| 6,504,846 B1 | 1/2003 | Yu et al. | |
| 6,522,580 B2 | 2/2003 | Chen et al. | |
| 6,535,949 B1 | 3/2003 | Parker | |
| 6,542,407 B1 | 4/2003 | Chen et al. | |
| 6,547,150 B1 | 4/2003 | Deo et al. | |
| 6,567,307 B1 | 5/2003 | Estakhri | |
| 6,598,114 B2 | 7/2003 | Funakoshi | |
| 6,604,168 B2 | 8/2003 | Ogawa | |
| 6,668,336 B2 | 12/2003 | Lasser | |
| 6,763,424 B2 | 7/2004 | Conley | |
| 6,766,432 B2 | 7/2004 | Saltz | |
| 6,771,536 B2 | 8/2004 | Li et al. | |
| 6,772,955 B2 | 8/2004 | Yoshimoto et al. | |
| 6,779,063 B2 | 8/2004 | Yamamoto | |
| 6,781,877 B2 | 8/2004 | Cernea et al. | |
| 6,823,417 B2 | 11/2004 | Spencer | |
| 6,834,331 B1 | 12/2004 | Liu | |
| 6,845,438 B1 | 1/2005 | Tanaka et al. | |
| 6,886,083 B2 | 4/2005 | Murakami | |
| 6,895,464 B2 | 5/2005 | Chow et al. | |
| 6,898,662 B2 | 5/2005 | Gorobets | |
| 6,925,007 B2 | 8/2005 | Harari et al. | |
| 6,938,116 B2 | 8/2005 | Kim et al. | |
| 6,965,963 B1 | 11/2005 | Nakanishi et al. | |
| 7,032,065 B2 | 4/2006 | Gonzalez et al. | |
| 7,054,991 B2 | 5/2006 | Tanaka et al. | |
| 7,092,911 B2 | 8/2006 | Yokota et al. | |
| 7,193,899 B2 | 3/2007 | Eggleston et al. | |
| 7,251,747 B1 | 7/2007 | Bean et al. | |
| 7,877,539 B2 | 1/2011 | Sinclair et al. | |
| 7,984,233 B2 | 7/2011 | Sinclair | |
| 2001/0034809 A1 * | 10/2001 | Ogawa | 711/103 |
| 2002/0078002 A1 | 6/2002 | Bottomley et al. | |
| 2002/0099904 A1 * | 7/2002 | Conley | 711/103 |
| 2003/0002432 A1 | 1/2003 | Morris et al. | |
| 2003/0065876 A1 | 4/2003 | Lasser | |
| 2003/0088812 A1 | 5/2003 | Lasser | |
| 2003/0109093 A1 | 6/2003 | Harari et al. | |
| 2003/0135514 A1 | 7/2003 | Patel et al. | |
| 2003/0147278 A1 | 8/2003 | Tanaka et al. | |
| 2003/0229753 A1 * | 12/2003 | Hwang | 711/103 |
| 2003/0229769 A1 | 12/2003 | Montemayor | |
| 2004/0019716 A1 | 1/2004 | Bychkov et al. | |
| 2004/0024921 A1 | 2/2004 | Peake, Jr. et al. | |
| 2004/0040018 A1 | 2/2004 | Fleming et al. | |
| 2004/0044873 A1 | 3/2004 | Wong et al. | |
| 2004/0073727 A1 * | 4/2004 | Moran et al. | 710/74 |
| 2004/0103241 A1 | 5/2004 | Chang et al. | |
| 2004/0133718 A1 | 7/2004 | Kodama et al. | |
| 2004/0157638 A1 | 8/2004 | Moran et al. | |
| 2004/0205289 A1 * | 10/2004 | Srinivasan | 711/103 |
| 2004/0248612 A1 * | 12/2004 | Lee et al. | 455/550.1 |
| 2005/0141312 A1 | 6/2005 | Sinclair et al. | |
| 2005/0141313 A1 | 6/2005 | Gorobets et al. | |
| 2005/0144357 A1 | 6/2005 | Sinclair | |
| 2005/0144358 A1 | 6/2005 | Conley et al. | |
| 2005/0144360 A1 | 6/2005 | Bennett et al. | |
| 2005/0144363 A1 | 6/2005 | Sinclair | |
| 2005/0144365 A1 | 6/2005 | Gorobets et al. | |
| 2005/0144367 A1 | 6/2005 | Sinclair | |
| 2005/0166087 A1 | 7/2005 | Gorobets | |
| 2006/0004951 A1 * | 1/2006 | Rudelic et al. | 711/103 |
| 2006/0020744 A1 | 1/2006 | Sinclair et al. | |
| 2006/0020745 A1 | 1/2006 | Conley et al. | |
| 2006/0031593 A1 | 2/2006 | Sinclair | |
| 2006/0155920 A1 | 7/2006 | Smith et al. | |
| 2006/0155921 A1 | 7/2006 | Gorobets et al. | |
| 2006/0155922 A1 | 7/2006 | Gorobets et al. | |
| 2006/0161728 A1 | 7/2006 | Bennett et al. | |
| 2006/0168395 A1 | 7/2006 | Deng et al. | |
| 2006/0184718 A1 * | 8/2006 | Sinclair et al. | 711/103 |
| 2006/0184719 A1 | 8/2006 | Sinclair | |
| 2006/0184720 A1 | 8/2006 | Sinclair et al. | |
| 2006/0184722 A1 | 8/2006 | Sinclair | |
| 2007/0030734 A1 | 2/2007 | Sinclair et al. | |
| 2007/0033323 A1 | 2/2007 | Gorobets | |
| 2007/0033324 A1 | 2/2007 | Sinclair | |
| 2007/0033326 A1 | 2/2007 | Sinclair | |
| 2007/0033328 A1 | 2/2007 | Sinclair et al. | |
| 2007/0033329 A1 | 2/2007 | Sinclair et al. | |
| 2007/0033330 A1 | 2/2007 | Sinclair et al. | |
| 2007/0033332 A1 | 2/2007 | Sinclair et al. | |
| 2007/0033374 A1 | 2/2007 | Sinclair et al. | |

FOREIGN PATENT DOCUMENTS

| | | |
|---|---|---|
| DE | 10234971 A1 | 2/2004 |
| EP | 0852765 B1 | 9/2001 |
| EP | 1100001 B1 | 8/2003 |
| EP | 1 571 557 A1 | 9/2005 |
| JP | 62-283496 | 12/1987 |
| JP | H10-124384 | 5/1998 |
| JP | 2002-251310 A | 9/2002 |
| JP | 2005-122439 | 5/2005 |
| WO | WO 00/49488 | 8/2000 |
| WO | WO 02/29575 A2 | 4/2002 |
| WO | WO 2004/012027 A2 | 2/2004 |
| WO | WO 2004/040453 | 5/2004 |
| WO | WO 2004/040455 A2 | 5/2004 |
| WO | WO 2004/046937 A1 | 6/2004 |
| WO | WO 2005/066793 | 7/2005 |

OTHER PUBLICATIONS

Imamiya et al. or Kevin Conley et al. "A 125-mm2 1-Gb NAND Flash Memory With 10-Mbyte/s Program Speed" Nov. 2002. IEEE Journal of Solid-State Circuits, vol. 37, No. 11. pages 1493-1501.*

Microsoft Computer Dictionary, Microsoft Press, 2002, Fifth Edition, pp. 151, 215.*

U.S. Office Action for U.S. Appl. No. 12/774,109 mailed Aug. 17, 2010, 85 pages.

Appeal Brief for U.S. Appl. No. 11/060,249 filed Apr. 26, 2010, 29 pages.
Notice of Allowance and Issue Fees Due for U.S. Appl. No. 11/060,249 mailed Sep. 21, 2010, 37 pages.
Notification of Reasons for Refusal for Japanese Patent Application No. 2007-556210 dated Jun. 7, 2011, 6 pages.
Second Office Action for Chinese Application No. 200680008922.0 dated May 6, 2011, 14 pages.
Office Action for European Patent Application No. 06734659.3 dated Jan. 11, 2011, 6 pages.
Office Action for European Patent Application No. 06720547.6 dated Jan. 12, 2011, 6 pages.
Third Office Action for Chinese Patent Application No. 200680008922.0 dated. Aug. 25, 2011, 5 pages.
Second Office Action for Chinese Patent Application No. 200680009222.3 dated. Sep. 30, 2011, 12 pages.
Second Office Action for Chinese Patent Application No. 200680008989.4 dated Jul. 4, 2011, 25 pages.
Communication Pursuant to Article 94(3) EPC for European Patent Application No. 06 734 695.7 dated Nov. 15, 2011, 5 pages.
Notice of Allowance and Fees Due for U.S. Appl. No. 11/060,249 mailed. Sep. 21, 2010, 36 pages.
Notice of Allowance and Fees Due for U.S. Appl. No. 12/774,109 mailed May 3, 2011, 39 pages.
Ban, Amir, "Inside Flash File Systems—Part 1", IC Card Systems & Design, Jul./Aug. 1993, pp. 15-16,18.
Ban, Amir, "Inside Flash File Systems—Part II", IC Card Systems & Design, Sep./Oct. 1993, pp. 21-24.
Ban, Amir, "Local Flash Disks: Two Architectures Compared," M-Systems Flash Disk Pioneers, White Paper, Rev. 1.0, Aug. 2001, 9 pages.
Chiang et al., Cleaning Policies in Mobile Computers Using Flash Memory, *Journal of Systems & Software*, vol. 48, 1999, pp. 213-231.
Chiang, Mei-Ling et al., "Data Management in a Flash Memory Based Storage Server", National Chiao-Tung University, Hsinchu, Taiwan, Dept. of Computer and Information Science, 8 pages. 1998.
China State Intellectual Property Office, "First Office Action," corresponding Chinese Patent Application No. 200680009222.3, mailed on Jul. 22, 2009, 7 pages.
China State Intellectual Property Office, "First Office Action," corresponding Chinese Patent Application No. 2006800089822.0, mailed on Aug. 5, 2009, 7 pages.
China State Intellectual Property Office, "Office Action," corresponding Chinese Patent Application No. 200680089894, mailed on Apr. 24, 2009, 25 pages (including translation.).
EPO, "Examiner's First Report," corresponding European Patent Application No. 06 734 659.3, mailed on Jun. 23, 2008, 3 pages.
EPO, "Office Action," corresponding European Patent Application No. 06 734 695.7, mailed on May 19, 2008, 5 pages.
EPO, "Office Action," corresponding European Patent Application No. 06 720 547.6, mailed on May 19, 2008, 4 pages.
EPO/ISA, "Notification of Transmittal of the International Search Report and the Written Opinion of the International Searching Authority, or the Declaration," mailed in International Application No. PCT/US2006/004585 on Aug. 23, 2006, 11 pages.
EPO/ISA, "Notification of Transmittal of the International Search Report and the Written Opinion of the International Searching Authority, or the Declaration," mailed in International Application No. PCT/US2006/004585 on Aug. 17, 2006, 10 pages.
Imamiya et al., "A 125-mm2 I-Gb NAND Flash Memory with 10-Mbyte/s Program Speed" Nov. 2002, IEEE Journal of Solid-State Circuits, vol. 37, No. 11, pp. 1493-1501.

Intel AP-686 Application Note, "Flash File System Selection Guide," Dec. 1998, 18 pages.
Kim et al., A Space-Efficient Flash Translation Layer for CompactFlash Systems, *IEEE Transactions on Consumer Electronics*, vol. 48, No. 2, May 2002, pp. 366-375.
Kim, Han-Joon et al., "A New Flash Memory Management for Flash Storage System", Computer Software and Applications Conference, 1999. Compsac '99 Proceedings. IEEE Comput. Soc., pp. 284-289.
Kjelso et al., Memory Management in Flash-Memory Disks with Data Compression, 1995, *Springer Verlag*, pp. 399-413.
Lim et al., An Efficient NAND Flash File System for Flash Memory Storage, *IEEE Transactions on Computer*, vol. 55, No. 7, Jul. 1, 2006, pp. 906-912.
Microsoft Computer Dictionary, Microsoft Press, 2002, Fifth Edition, p. 151.
Microsoft Computer Dictionary, Microsoft Press, 2002, Fifth Edition, p. 215.
Notification of Transmittal of the International Search Report and the Written Opinion of the International Searching Authority, or the Declaration, in corresponding PCT/US2006/004555, dated Oct. 4, 2006, 11 pages.
Office Action for U.S. Appl. No. 11/060,174 mailed Mar. 27, 2007, 27 pages.
Office Action for U.S. Appl. No. 11/060,248 mailed Apr. 5, 2007, 38 pages.
Office Action for U.S. Appl. No. 11/060,249 mailed Apr. 13, 2007, 39 pages.
Office Action for U.S. Appl. No. 11/342,168 mailed Nov. 23, 2009, 48 pages.
PNY Technologies Attache Flash Product, http://web.archive.org/web/20030704092223/http://www.pny.com/products/flash/attache.asp.07/04/2003. pp. 1-2.
Rankl, Wolfgang et al., "Smart Card Handbook, Third Edition (translated by Kenneth Cox)", John Wiley & Sons, Ltd., 2004, pp. 52-93, 233-369, and 435-490.
USPTO, "Office Action," mailed in related U.S. Appl. No. 11/060,174 on Jul. 24, 2008, 38 pages.
USPTO, "Office action," mailed in related U.S. Appl. No. 11/342,168 on Dec. 26, 2007, 31 pages.
USPTO, "Office action," mailed in related U.S. Appl. No. 11/342,168 on Aug. 19, 2008, 27 pages.
USPTO, "Office Action," mailed in related U.S. Appl. No. 11/342,168 on Mar. 4, 2009, 46 pages.
USPTO, "Office Action," mailed in related U.S. Appl. No. 11/060,174 on Dec. 12, 2007, 31 pages.
USPTO, "Office Action," mailed in related U.S. Appl. No. 11/060,248 on Dec. 26, 2007, 56 pages.
USPTO, "Office Action," mailed in related U.S. Appl. No. 11/060,248 on Aug. 14, 2008, 59 pages.
USPTO, "Office Action," mailed in related U.S. Appl. No. 11/060,174 on Apr. 28, 2009, 50 pages.
USPTO, "Office Action," mailed in related U.S. Appl. No. 11/060,248 on Apr. 28, 2009, 58 pages.
USPTO, "Office Action," mailed in U.S. Appl. No. 11/060,249 on Dec. 26, 2007, 42 pages.
USPTO, "Office Action," mailed in U.S. Appl. No. 11/060,249 on Aug. 4, 2008, 62 pages.
USPTO, "Office Action," mailed in U.S. Appl. No. 11/060,249 on Apr. 8, 2009, 58 pages.
Wu et al., Envy: A Non-Volatile, Main Memory Storage System, *ACM Sigplan Notices*, vol. 29, No. 11, Nov. 1, 2994, pp. 86-97.

* cited by examiner

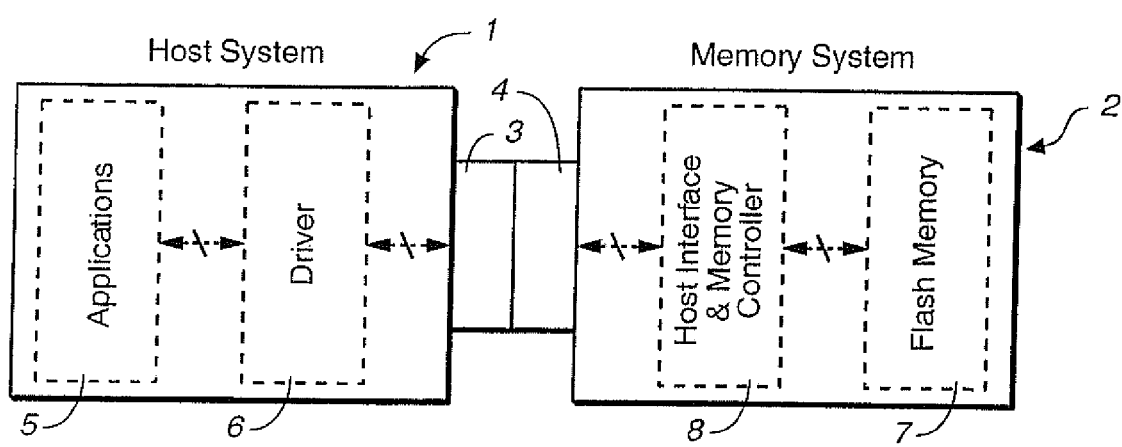
FIG._1

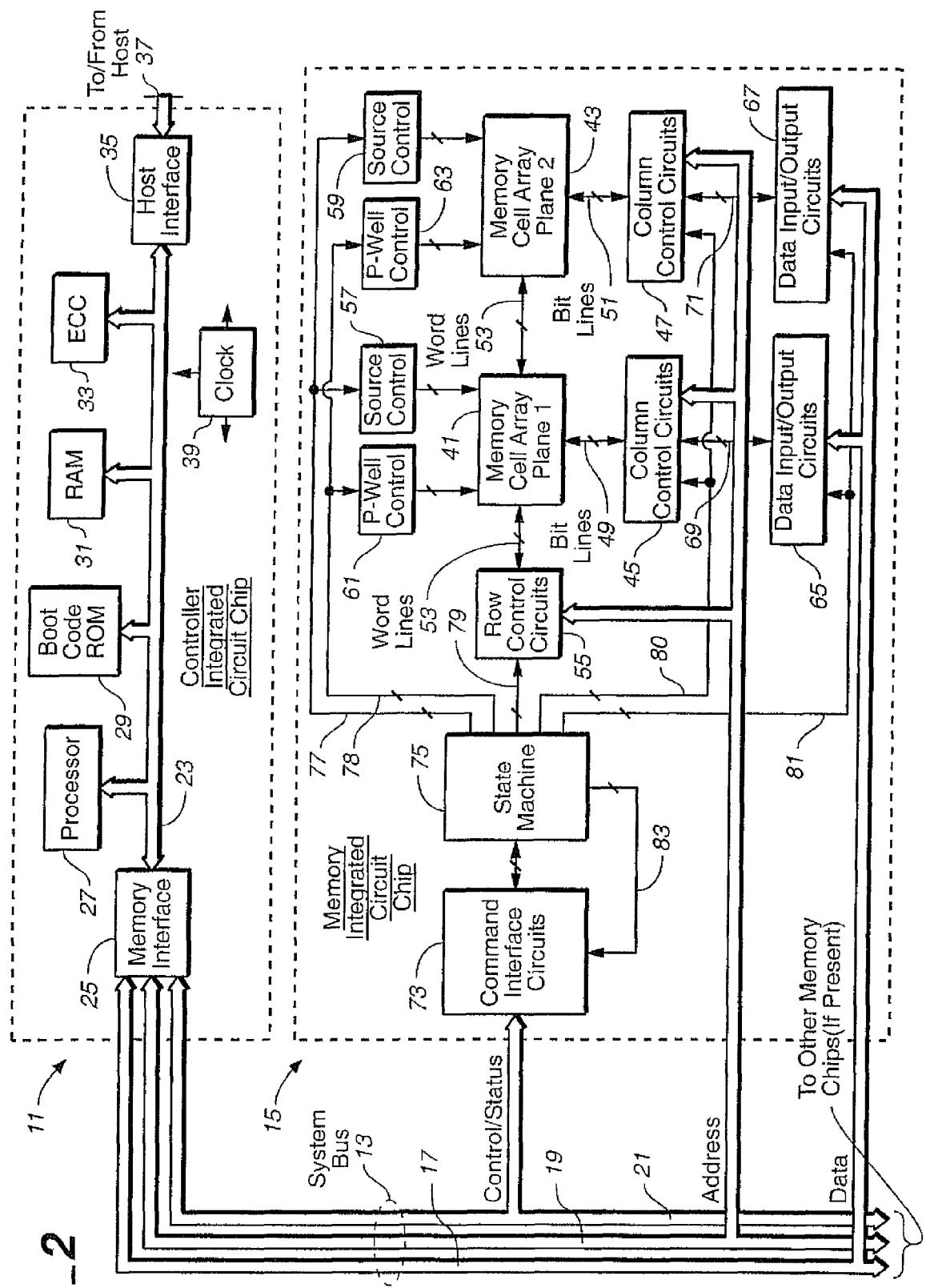
FIG._2

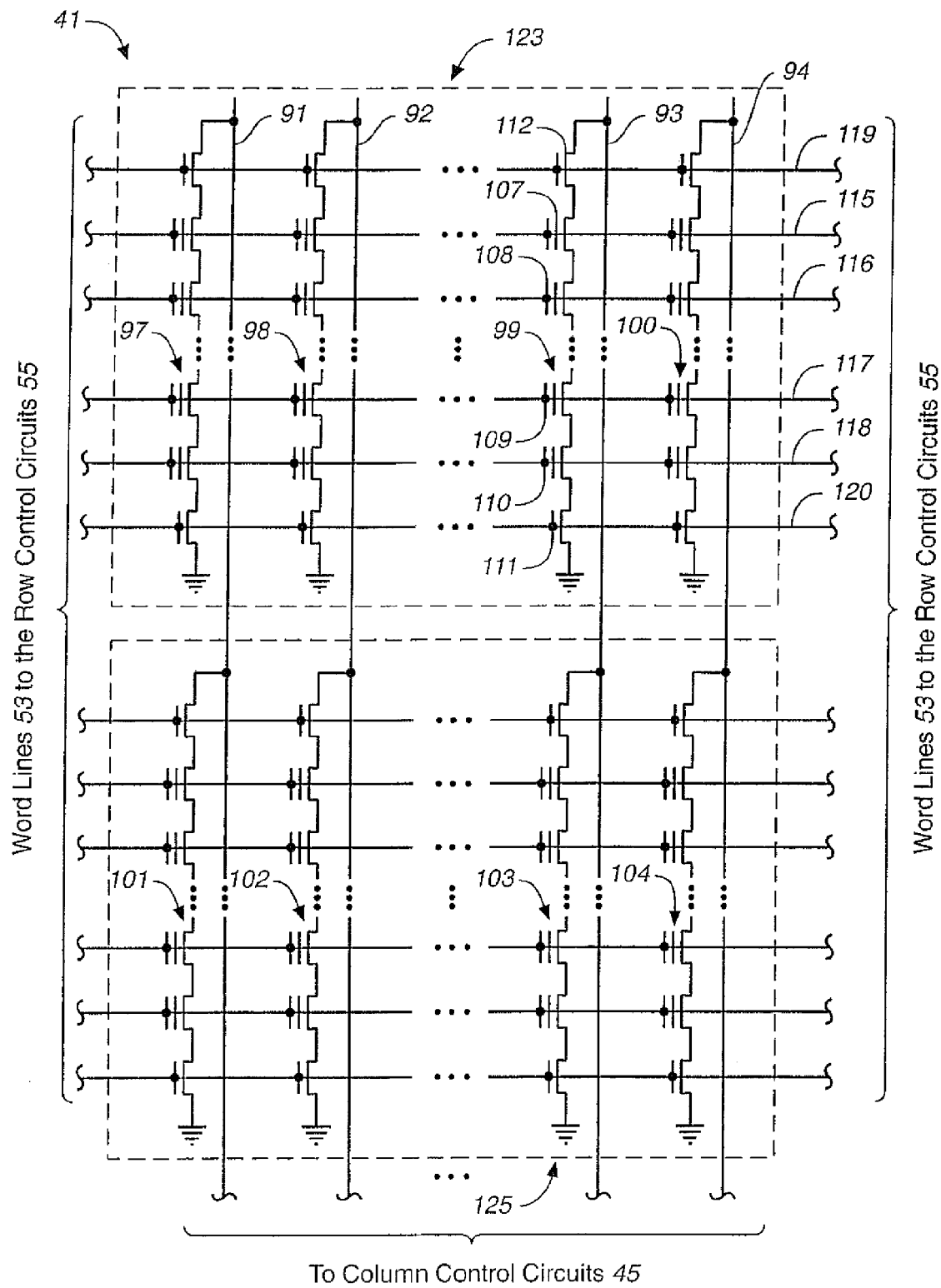
FIG._3

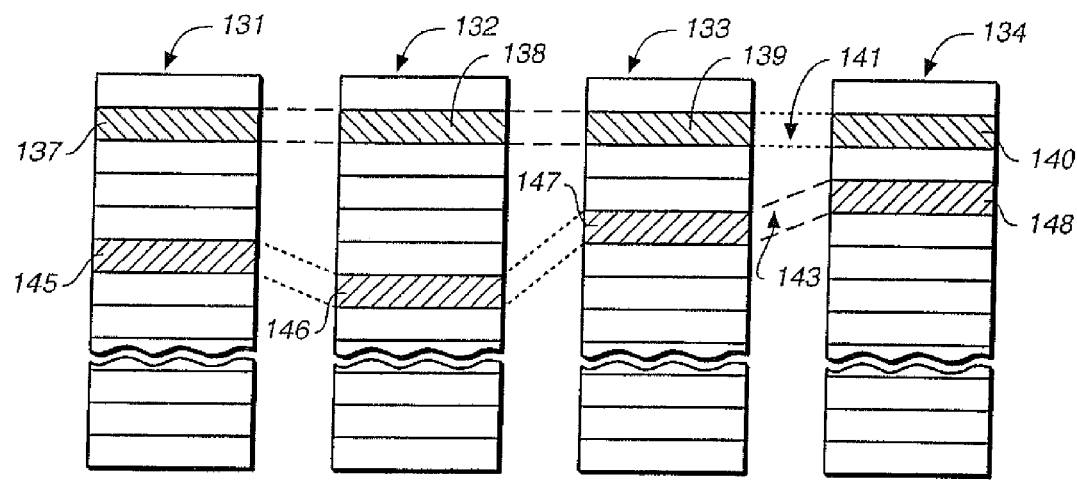
FIG._4
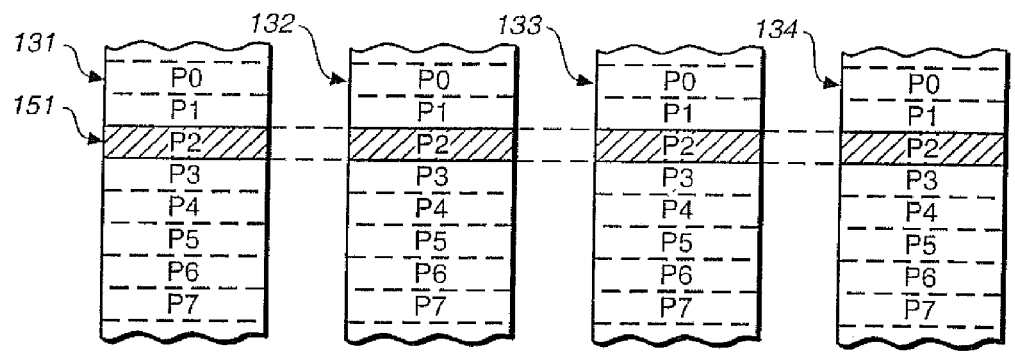
FIG._5
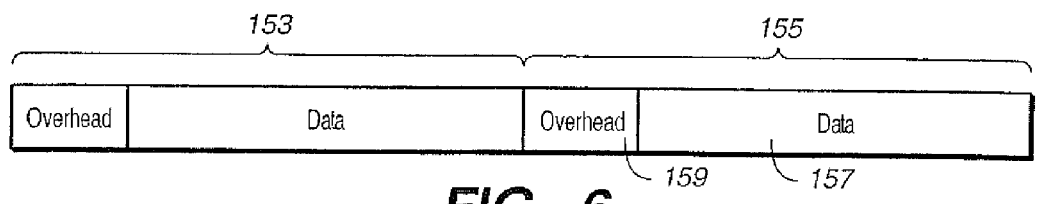
FIG._6

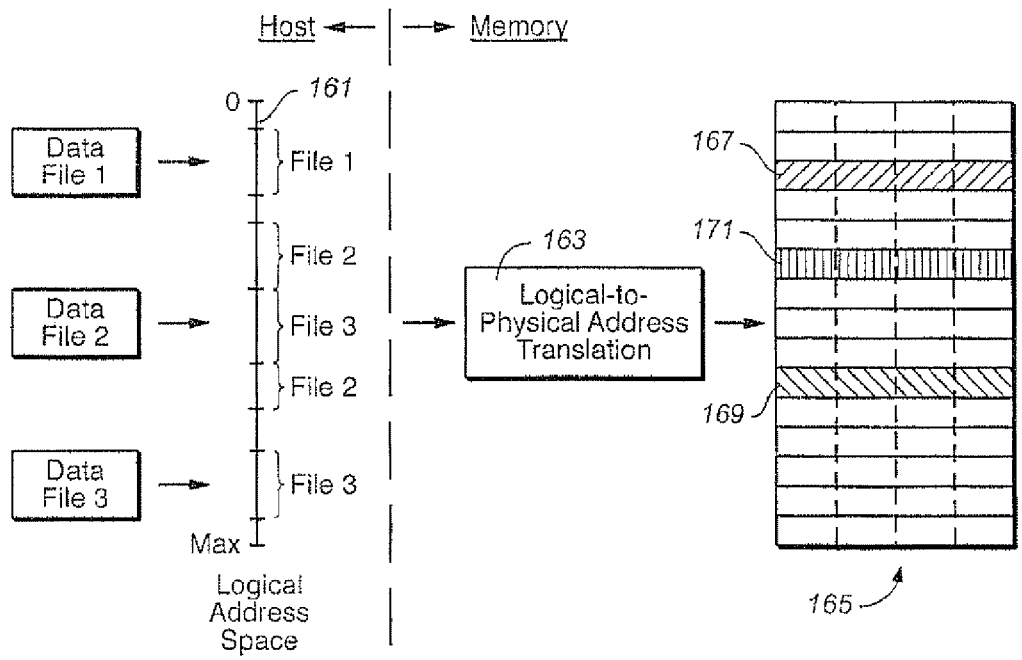
FIG._7 (PRIOR ART)
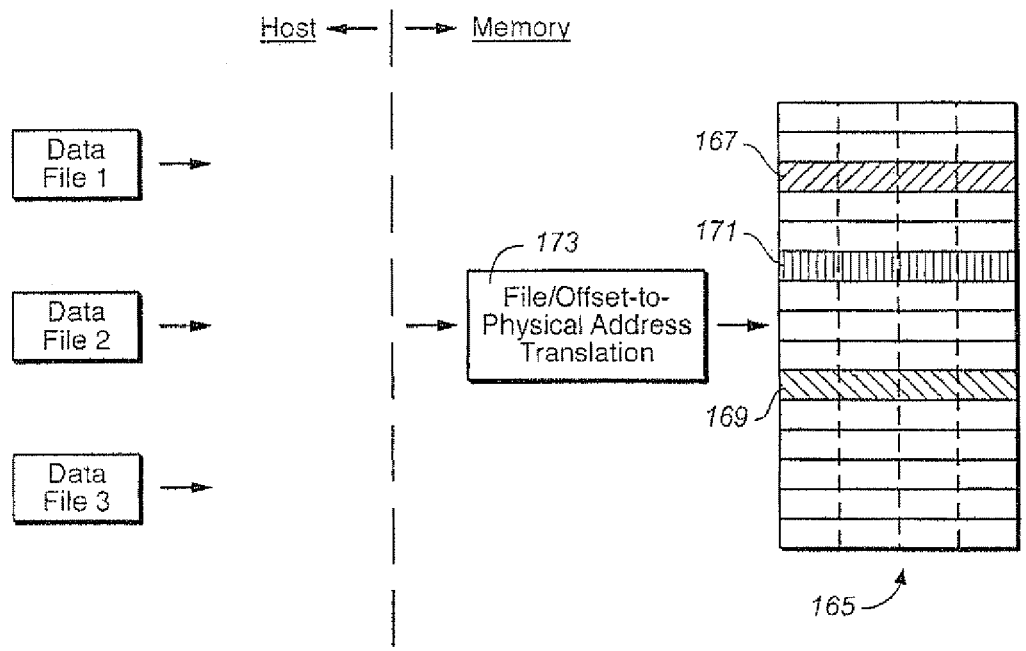
FIG._9

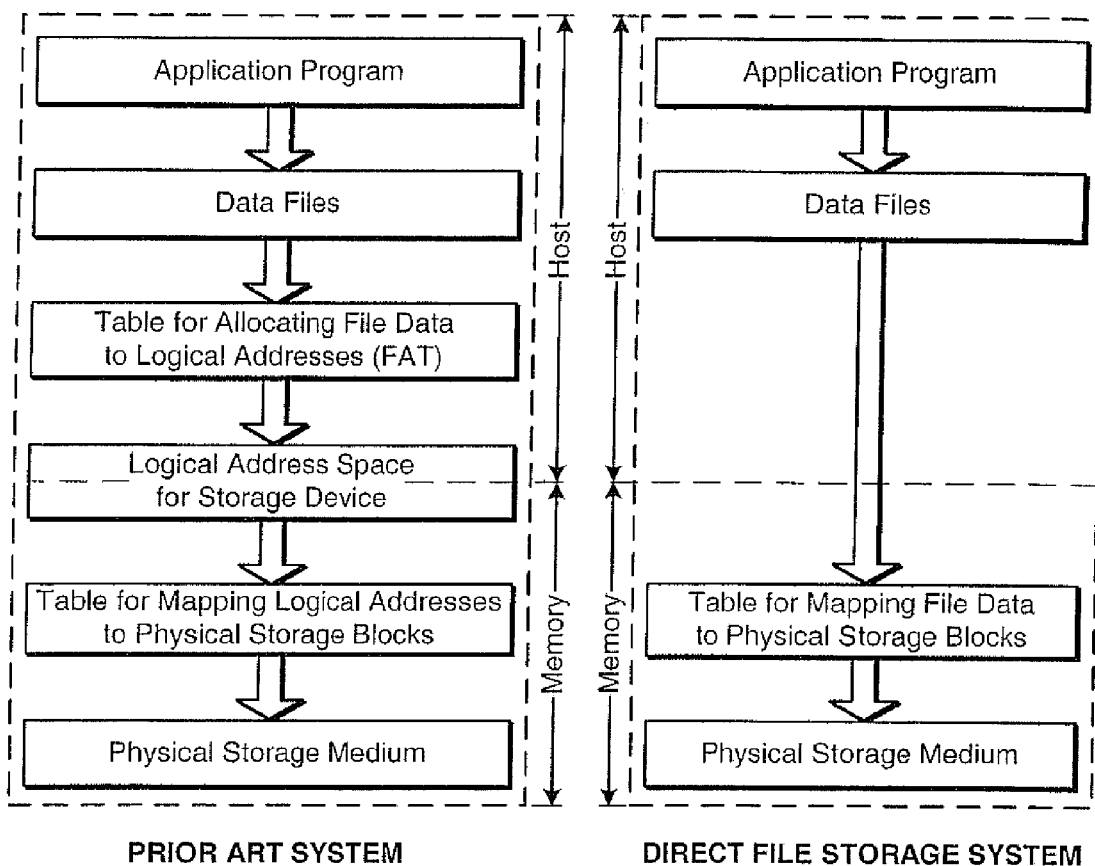
FIG._8 PRIOR ART SYSTEM
FIG._10 DIRECT FILE STORAGE SYSTEM

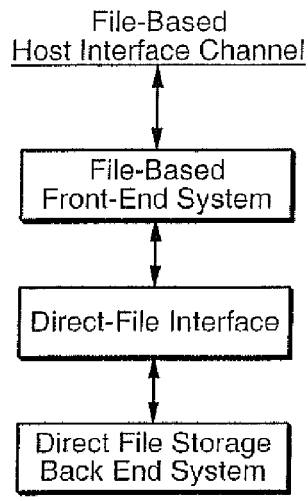

FIG._11

DATA COMMANDS

| Command | Parameters | Description |
|---|---|---|
| Write | < fileID > | Appends data to end of the specified file. |
| Insert | < fileID >  < offset > | Inserts data within specified file at < offset > from start. |
| Update | < fileID >  < offset > | Overwrites data in specified file at < offset > from start. |
| Read | < fileID >  < offset > | Reads data from specified file at < offset > from start. |
| Remove | < fileID >  < offset 1 >  < offset 2 > | Removes data within specified file between < offset 1 > and < offset 2 > from start. |

FIG._12A

FILE COMMANDS

| Command | Parameters | Description |
| --- | --- | --- |
| Open | < fileID > | Requests resources to be made available for writing to the specified file. |
| Close | < fileID > | Resources may be removed immediately from the specified file, and the file may be scheduled for garbage collection. |
| Close_after | < fileID >  < length > | Resources may be removed from the specified file after further transfer of < length> of file data from host, at which time the file may be scheduled for gabage collection. |
| Delete | < fileID > | Indicates that table entries and data for the specified file should be deleted. File data may be erased. |
| Erase | < fileID > | Indicates that table entries and data for the specified file should be deleted and that file data should be erased immediately. |

*FIG._12B*

DIRECTORY COMMANDS

| Command | Parameters | Description |
| --- | --- | --- |
| List | < directoryID > | Request from the host for the device to report directory and file infomation. |
| Current | < directoryID > | Definition by host of a current directory within which a new file is opened, a new directory is created, or a directory is deleted. |
| Create | < directoryID > | Request from the host for a new directory to be created. |
| Delete | < directoryID > | Request from the host for a directory to be deleted. Subdirectories and files within the directory are also deleted. |
| Erase | < directoryID > | Request from the host for a directory to be deleted. Subdirectories and files within the directory are also deleted. Data for specified files should be erased immediately. |

*FIG._12C*

STATE COMMANDS

| Command | Parameters | Description |
|---|---|---|
| Idle | | The host interface is entering an idle state, within which the device may perform internal operations.<br><br>The idle state may be ended by transmission of another command by the host, whether or not the device is busy with an internal operation.<br><br>Upon receipt of such other command, any internal operation in progress in the device should be terminated within a specified time. |
| Standby | | The host interface is entering a standby state, within which the device may not perform internal operations.<br><br>The standby state may be ended by transmission of another command by the host. |
| Shut-down | | The host interface will be shut down and power will be removed from the card when the device is next in a not-busy state. |

*FIG._12D*

MEMORY SYSTEM COMMAND

| Command | Parameters | Description |
|---|---|---|
| Size | | Request from host for the device to report the available capacity for new file data. |
| Status | | Request from host for the device to report its current status. |

*FIG._12E*

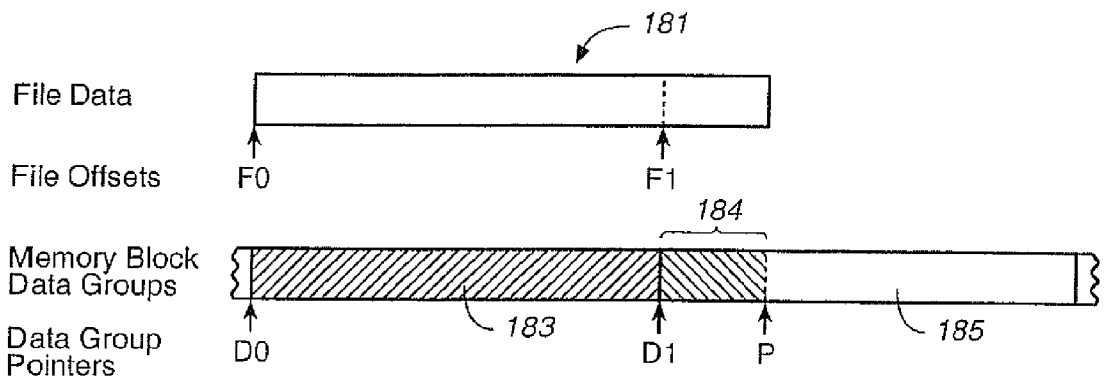
FIG._13A Write
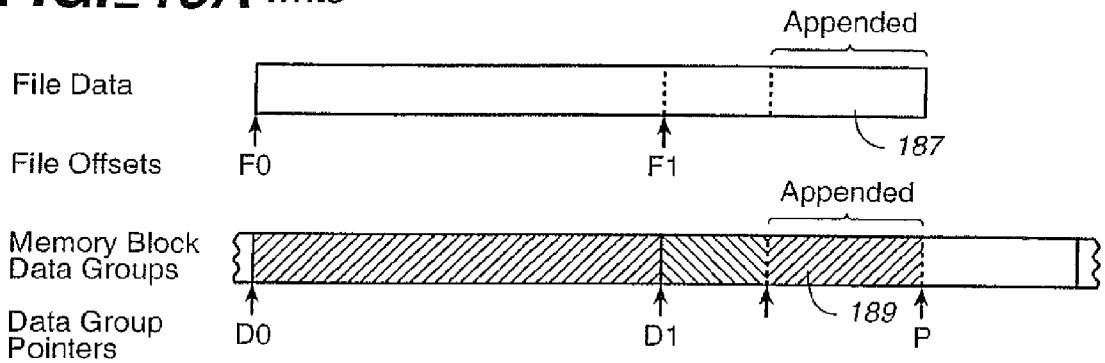
FIG._13B Write
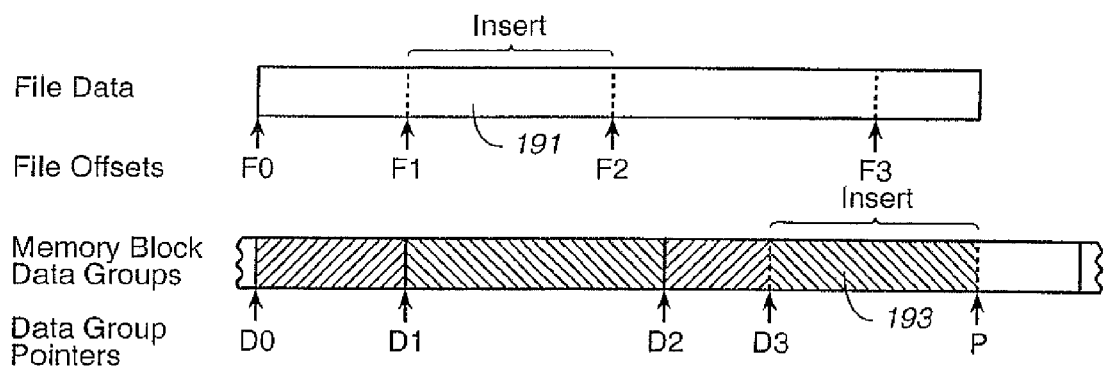
FIG._13C Insert
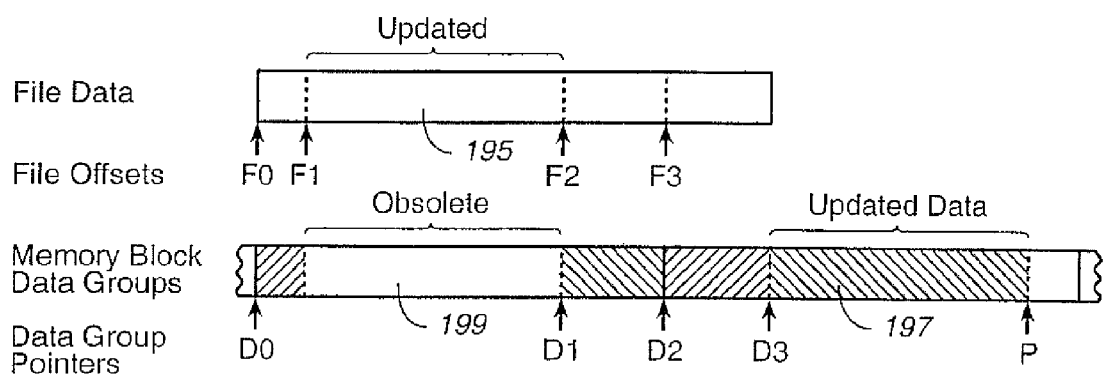
FIG._13D Update

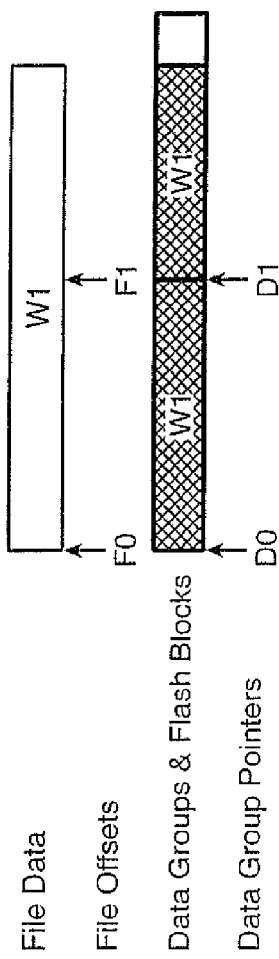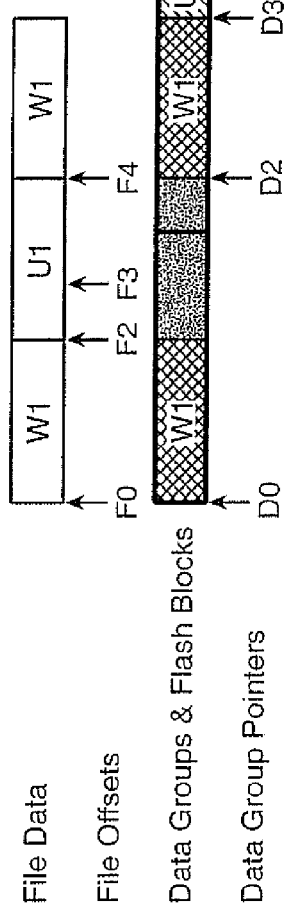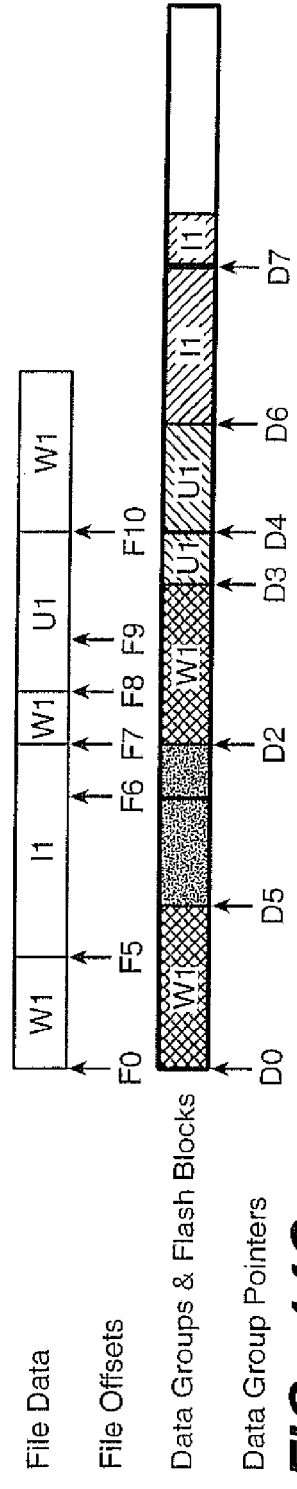
FIG._14A Write
FIG._14B Update
FIG._14C Insert

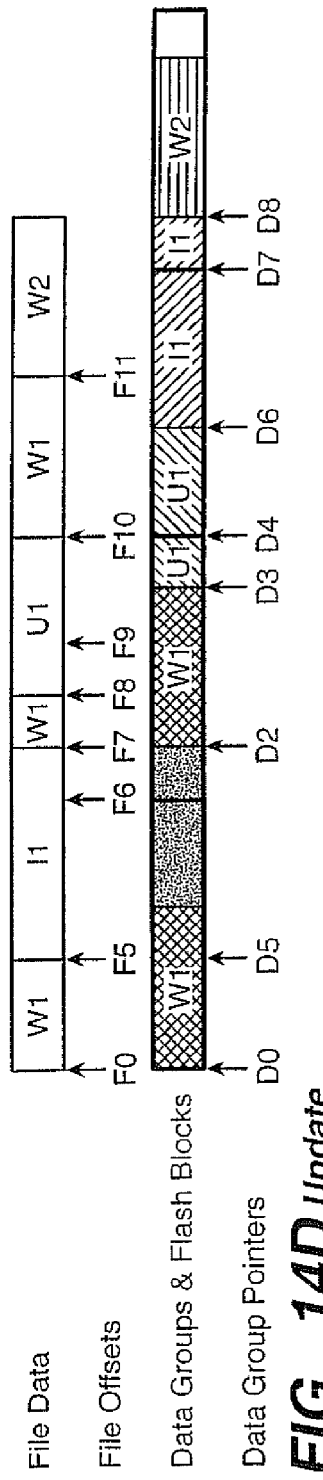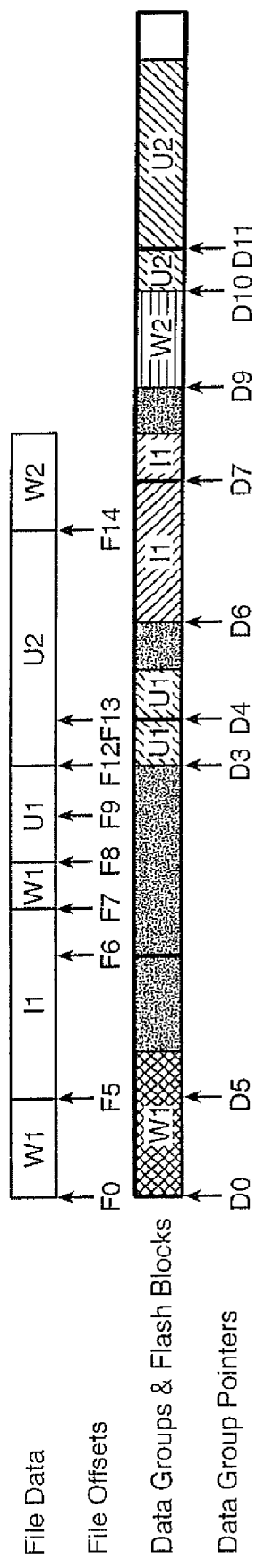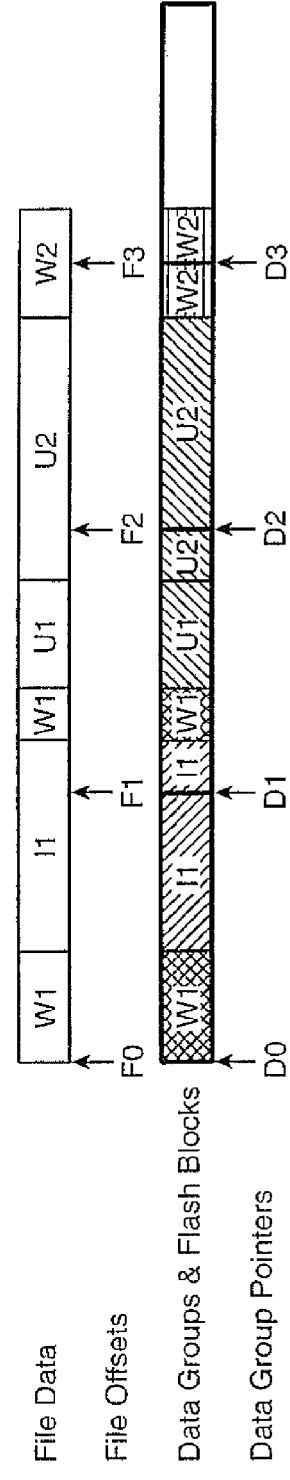

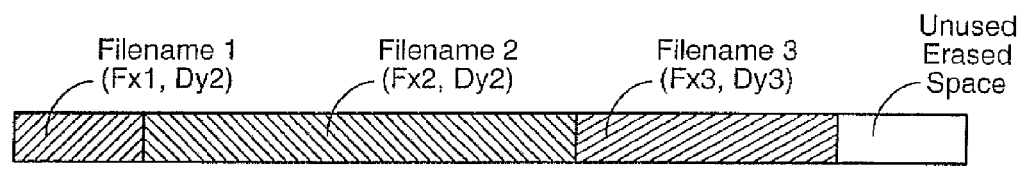
FIG._16
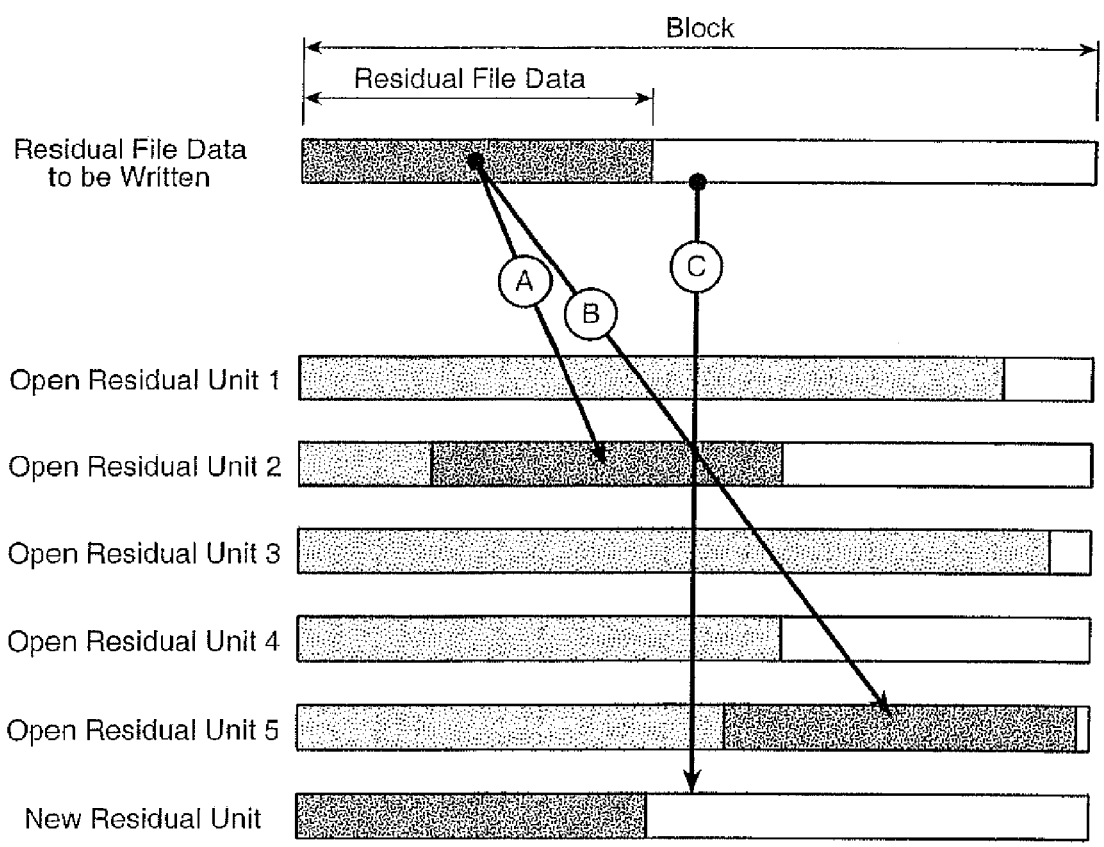
FIG._17

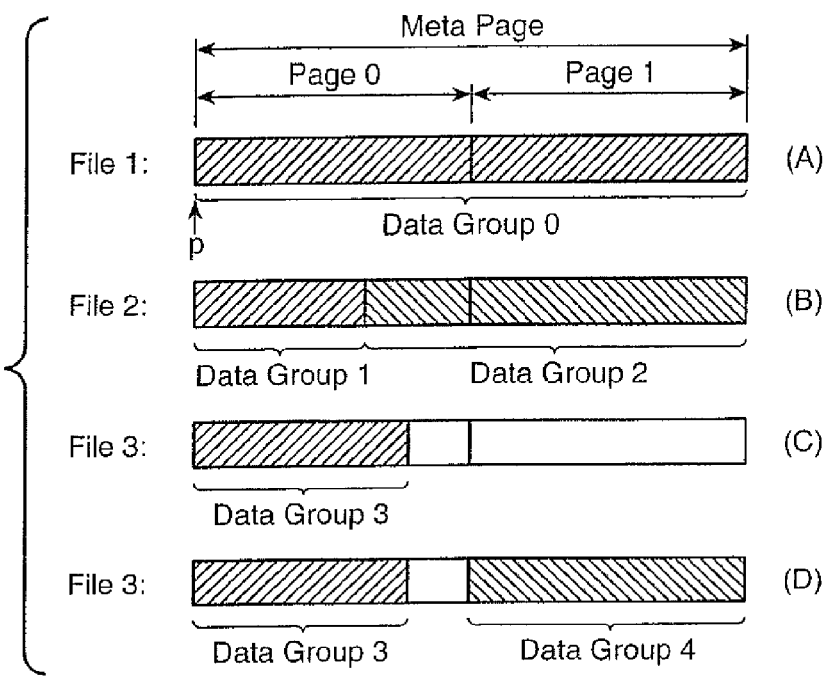

File Index Table (FIT)

| | OFFSET | BLOCK | BYTE | LENGTH |
|---|---|---|---|---|
| Time 0 (Fig. 14A) | F0<br>F1 | 001<br>002 | D0<br>D1 | ——<br>—— |
| Time 2 (Fig. 14C) | F0<br>F5<br>F6<br>F7<br>F8<br>F9<br>F10 | 001<br>003<br>004<br>001<br>002<br>003<br>002 | D0<br>D6<br>D7<br>D5<br>D3<br>D4<br>D2 | ——<br>——<br>——<br>——<br>——<br>——<br>—— |
| Time 4 (Fig. 14E) | F0<br>F5<br>F6<br>F7<br>F8<br>F9<br>F12<br>F13<br>F14 | 001<br>003<br>004<br>001<br>002<br>003<br>004<br>005<br>004 | D0<br>D6<br>D7<br>D5<br>D3<br>D4<br>D10<br>D11<br>D9 | ——<br>——<br>——<br>——<br>——<br>——<br>——<br>——<br>—— |
| Time 5 (Fig. 15) | F0<br>F1<br>F2<br>F3 | 001<br>002<br>003<br>004 | D0<br>D1<br>D2<br>D3 | ——<br>——<br>——<br>—— |

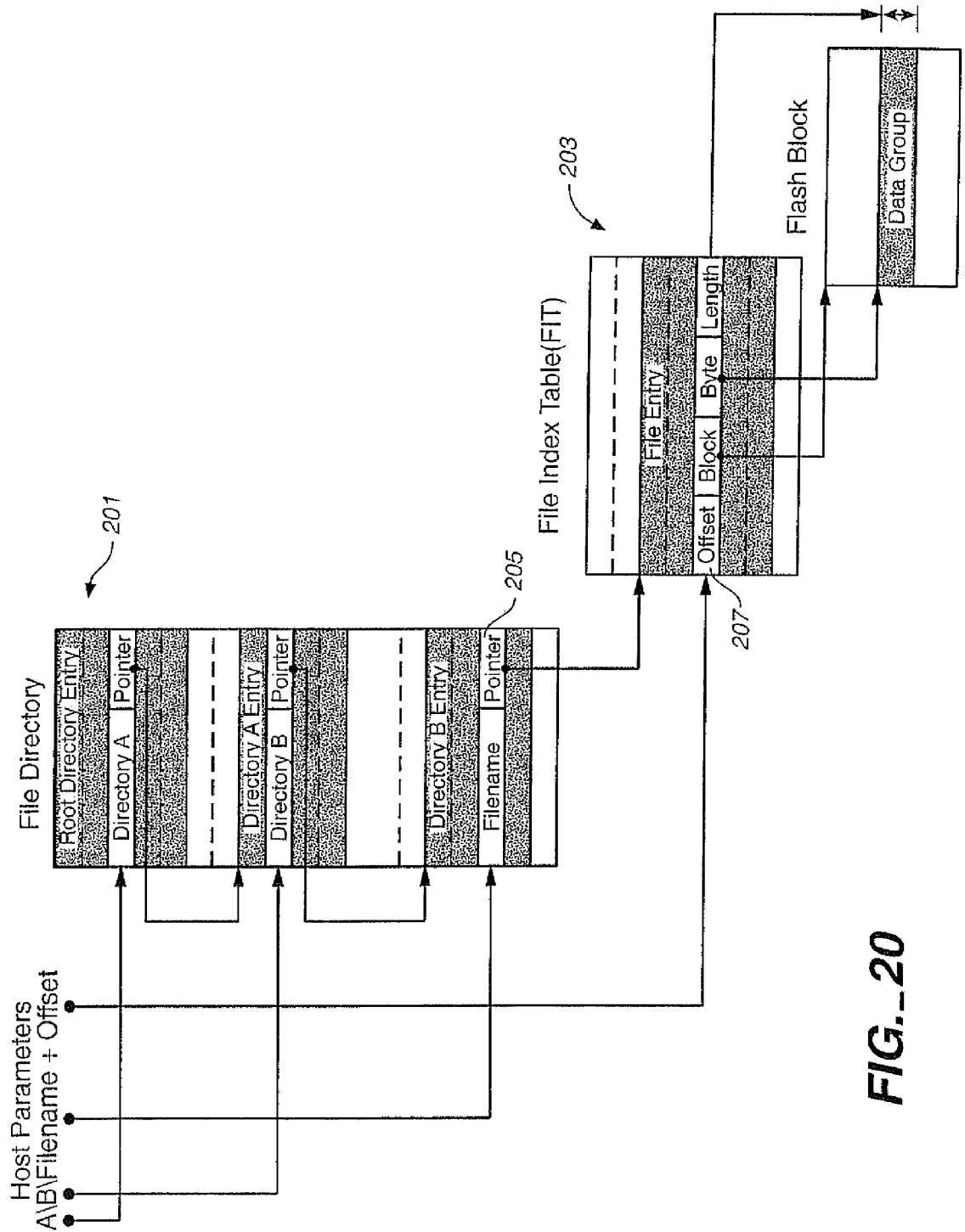
FIG._20

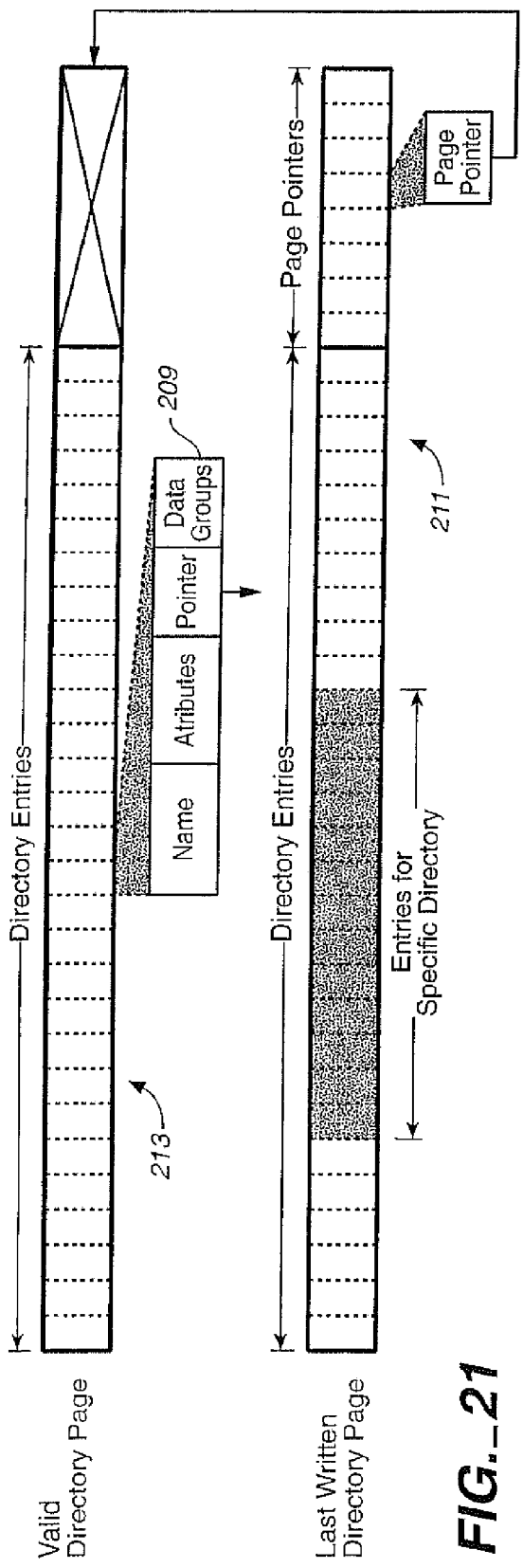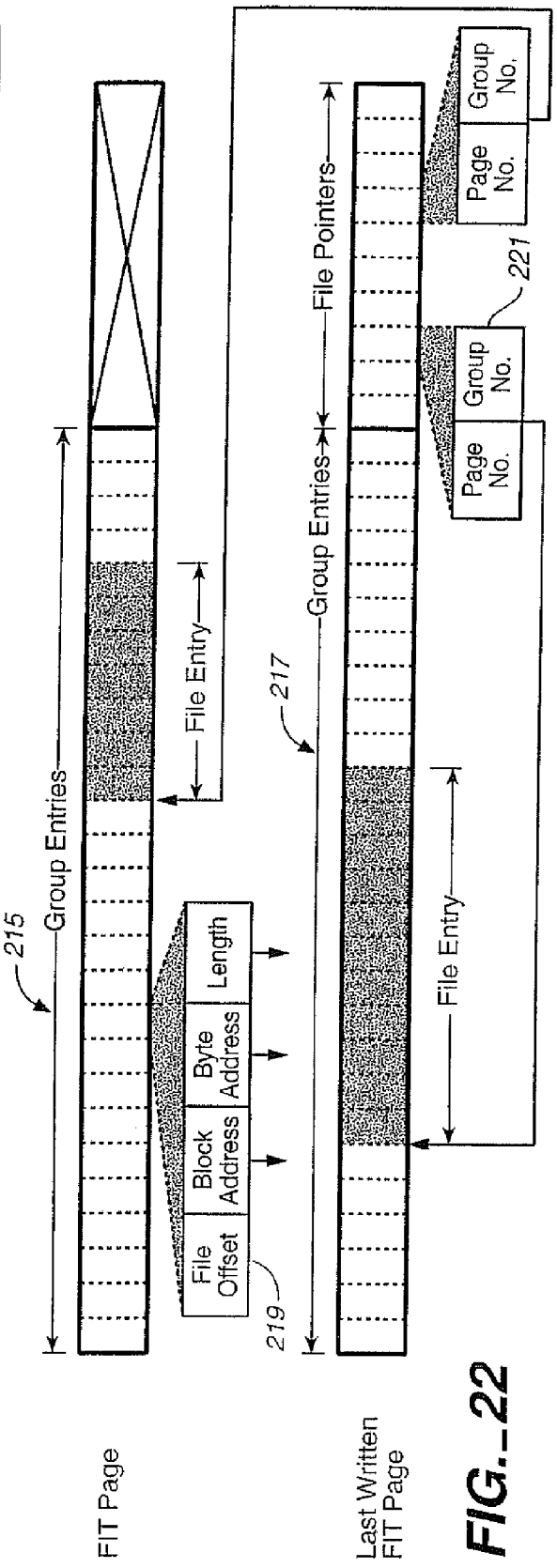
FIG._21
FIG._22

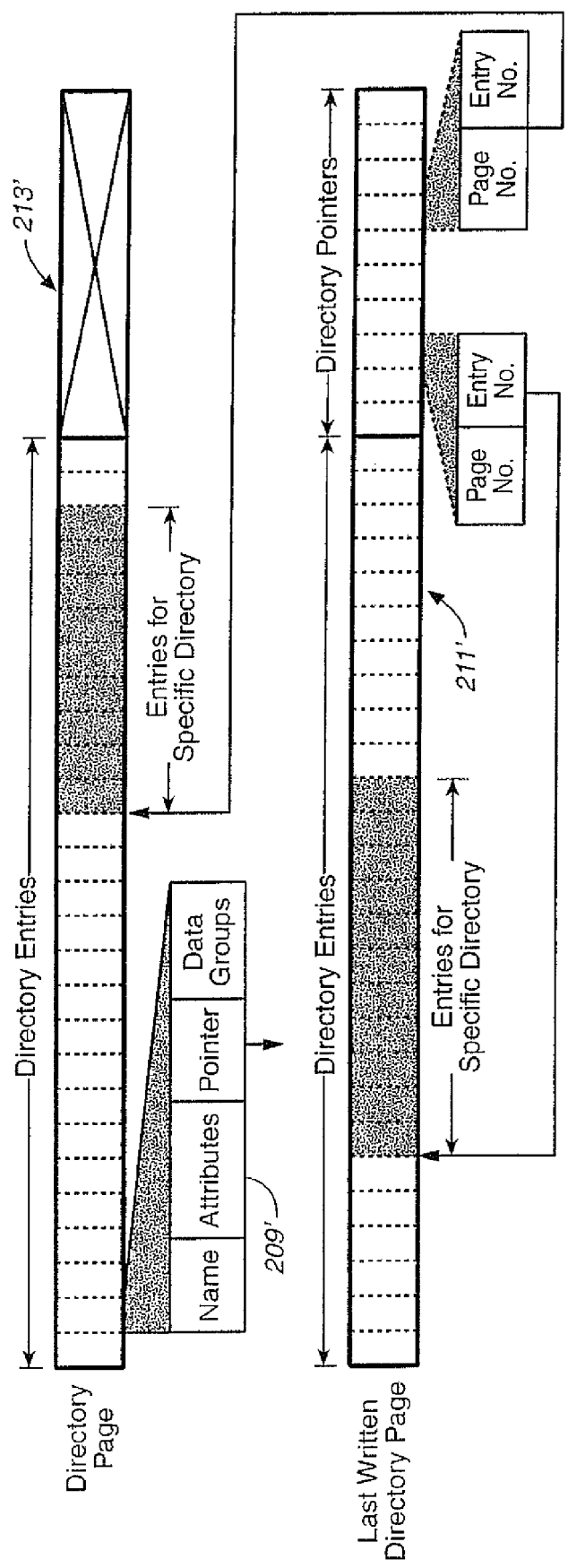
FIG._23

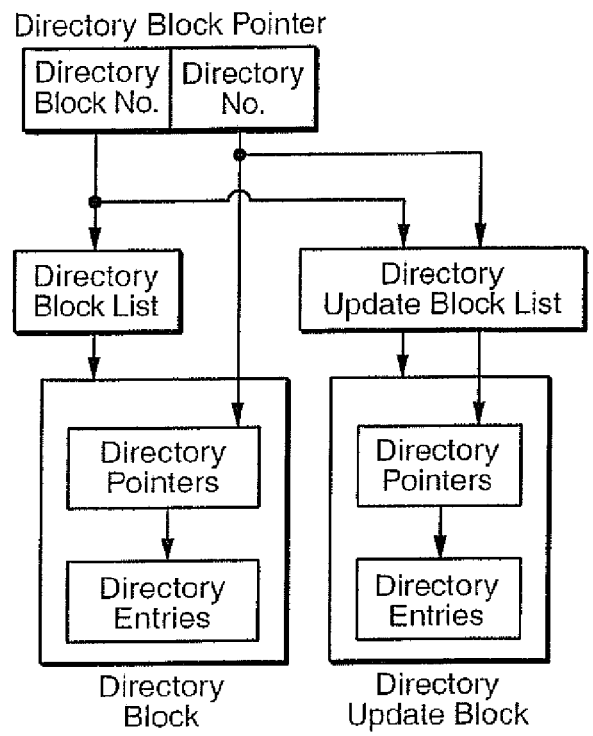
FIG._24
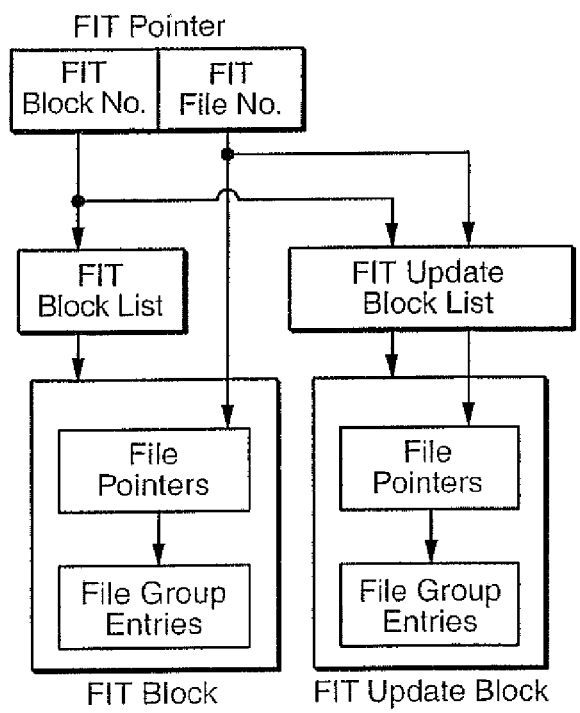
FIG._25

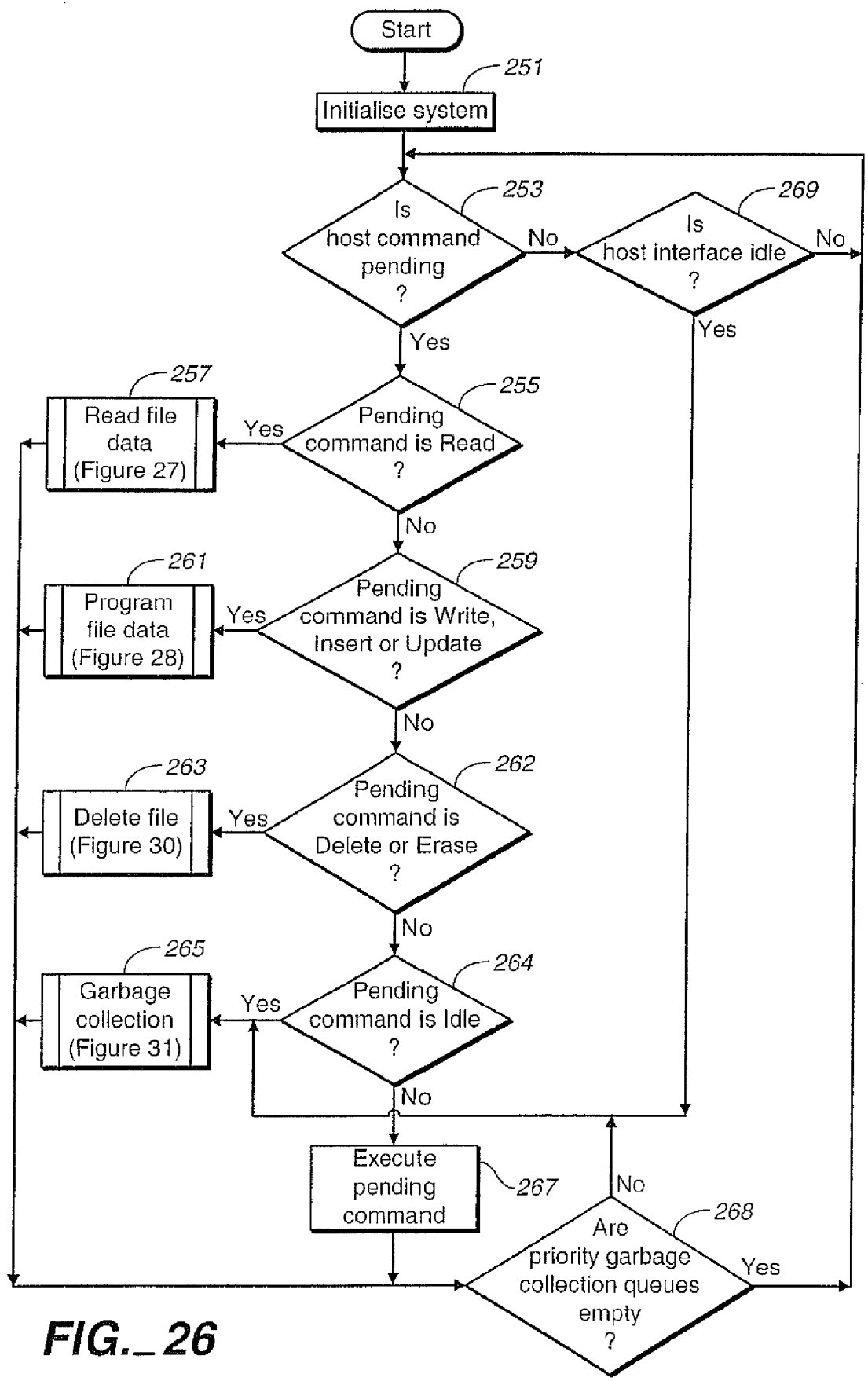
FIG._26

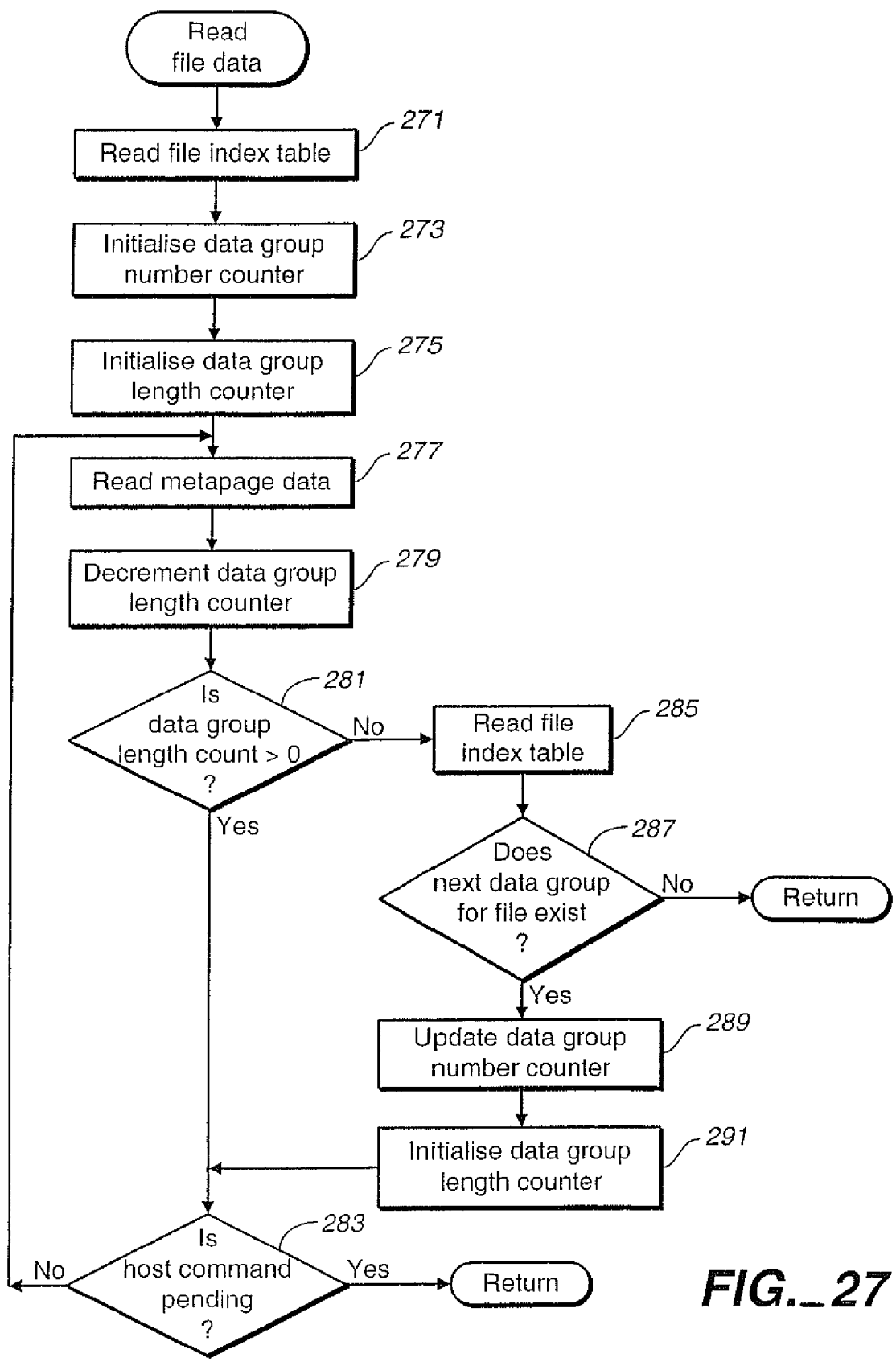
FIG._27

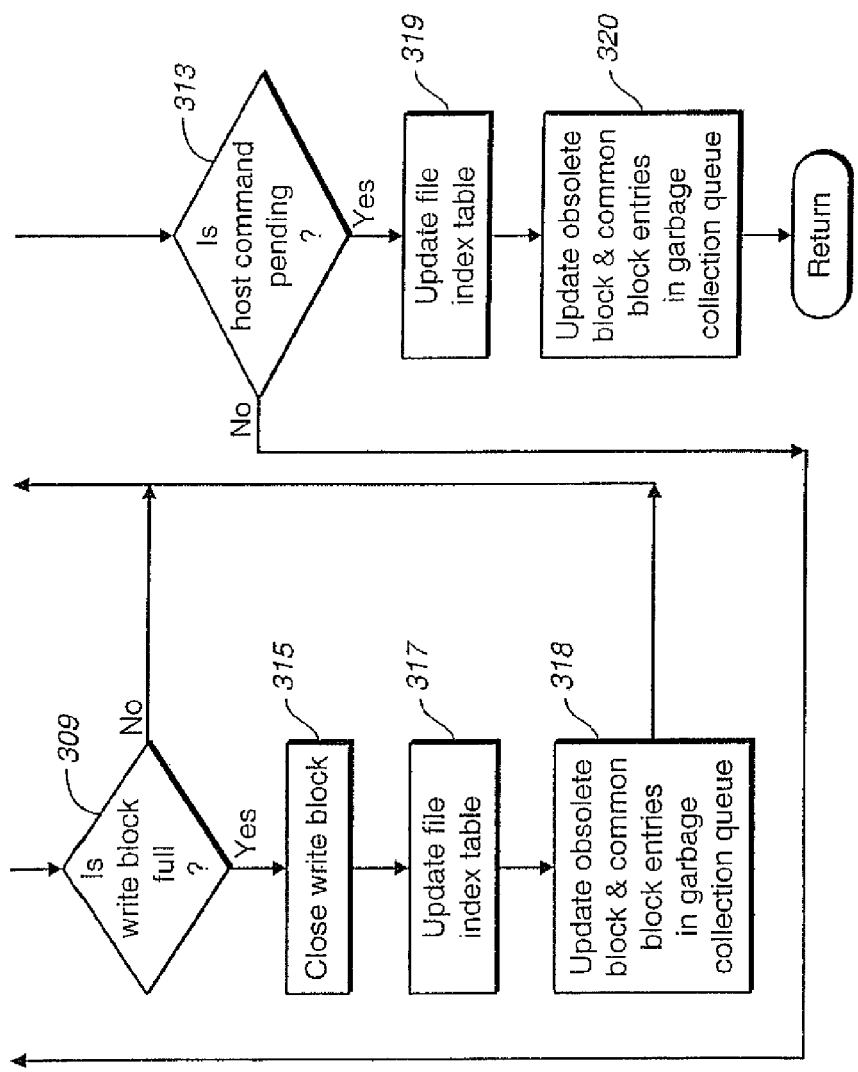
FIG._28B

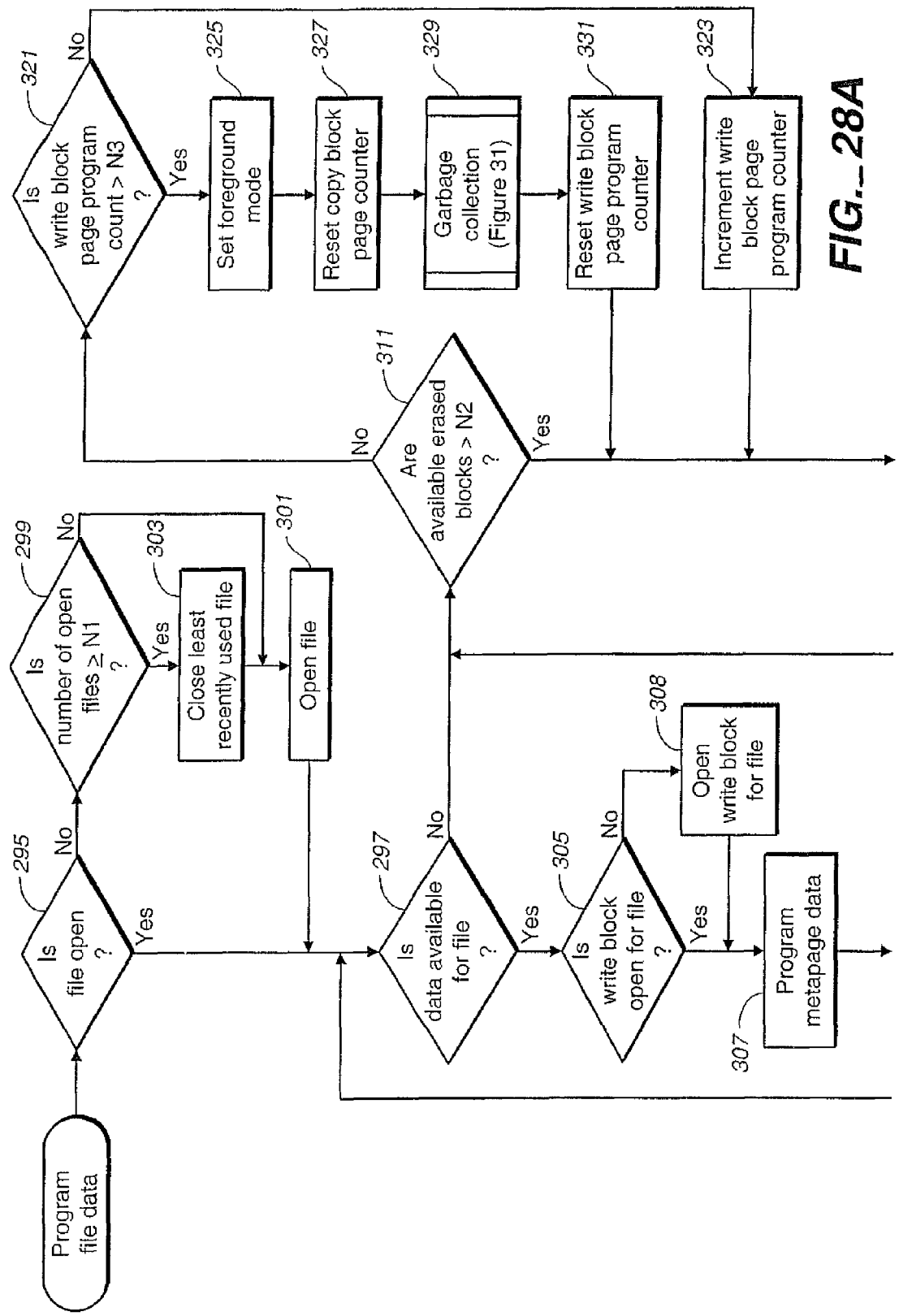
FIG._28A

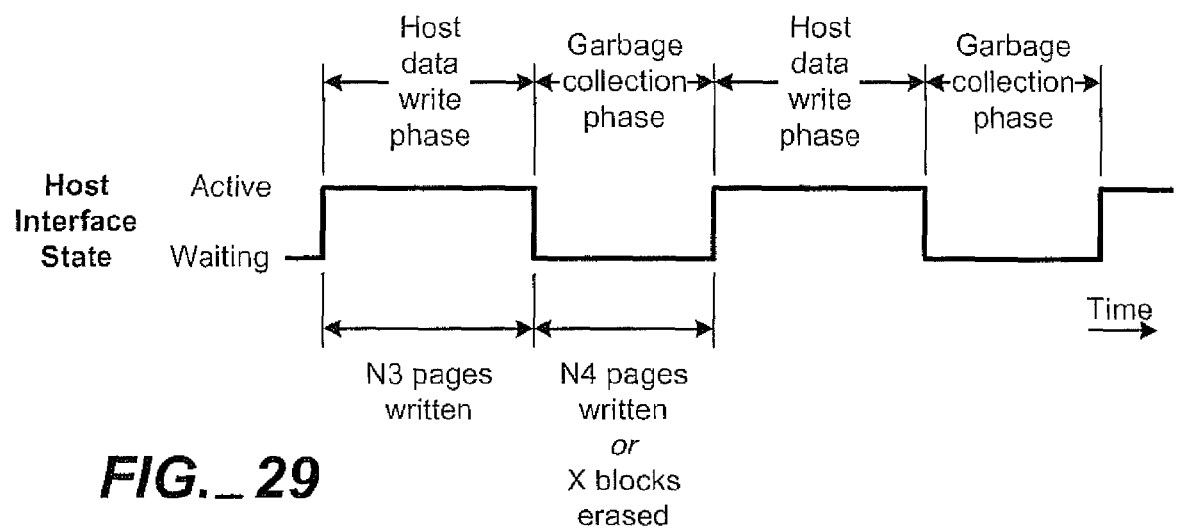
FIG._29
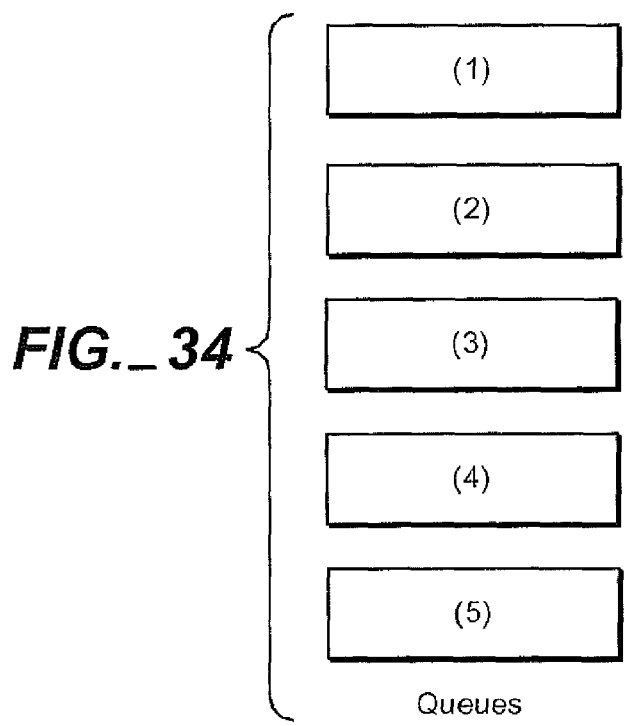
Queues
FIG._34

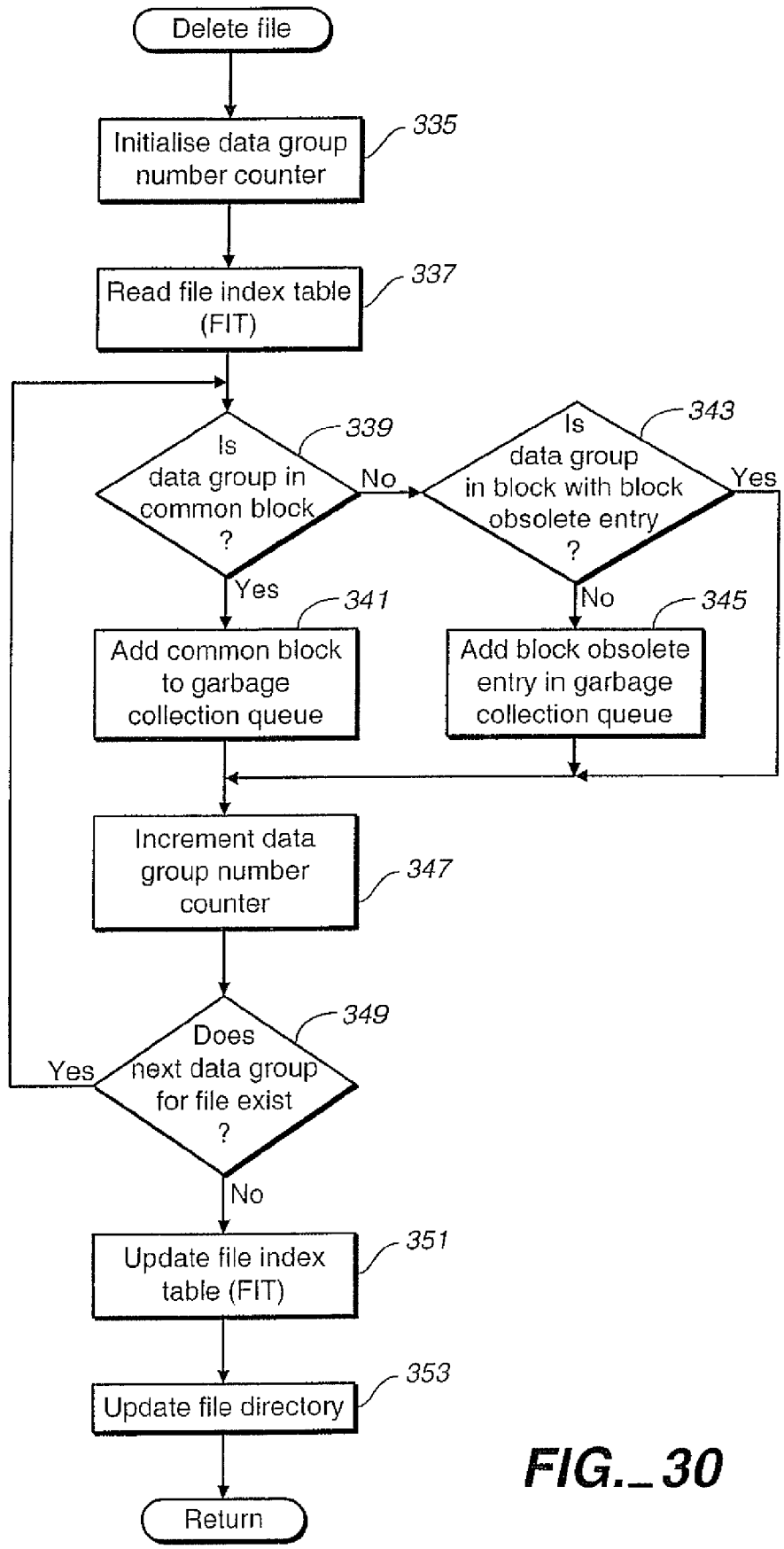
FIG._30

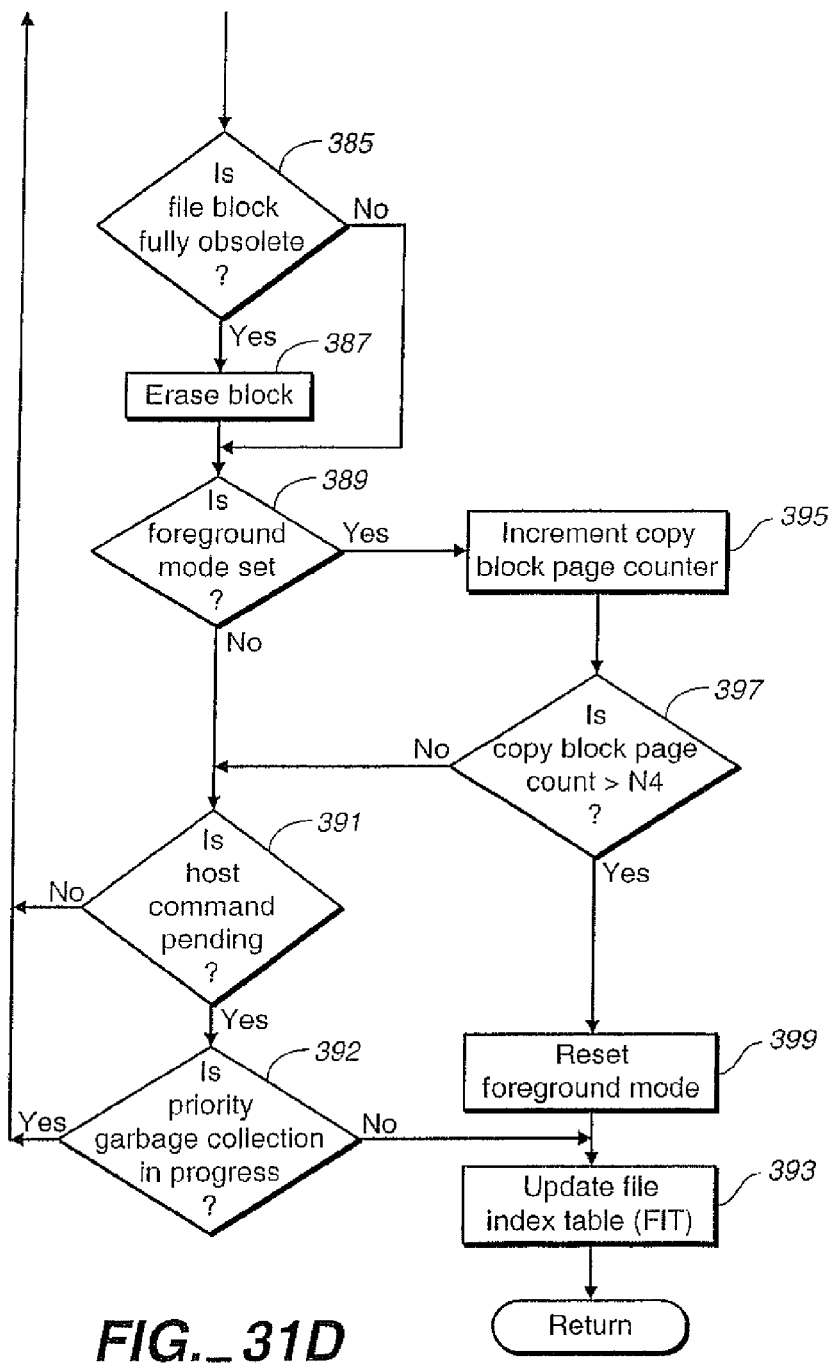
FIG._31D
FIG._31

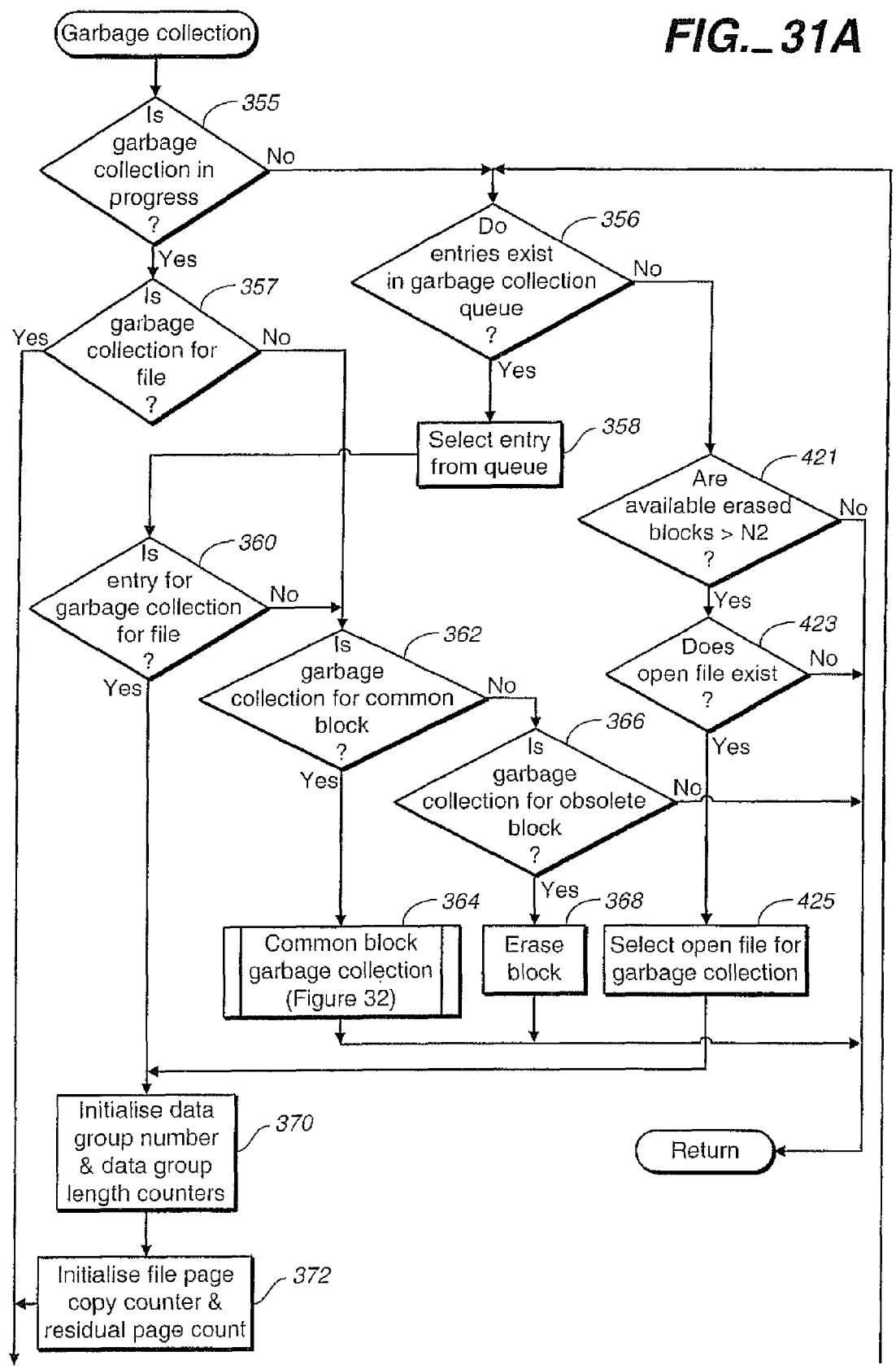
FIG._31A

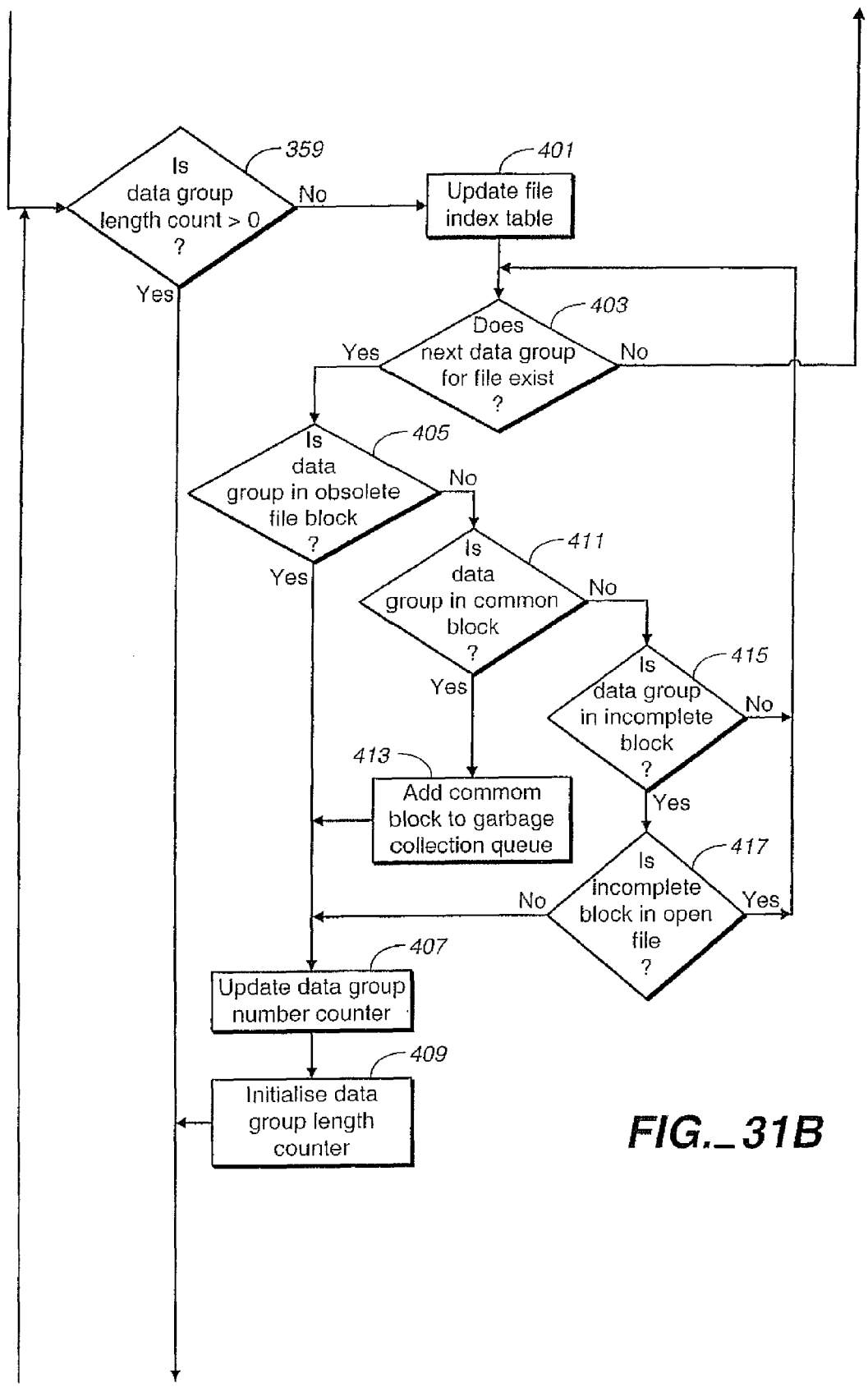
FIG._31B

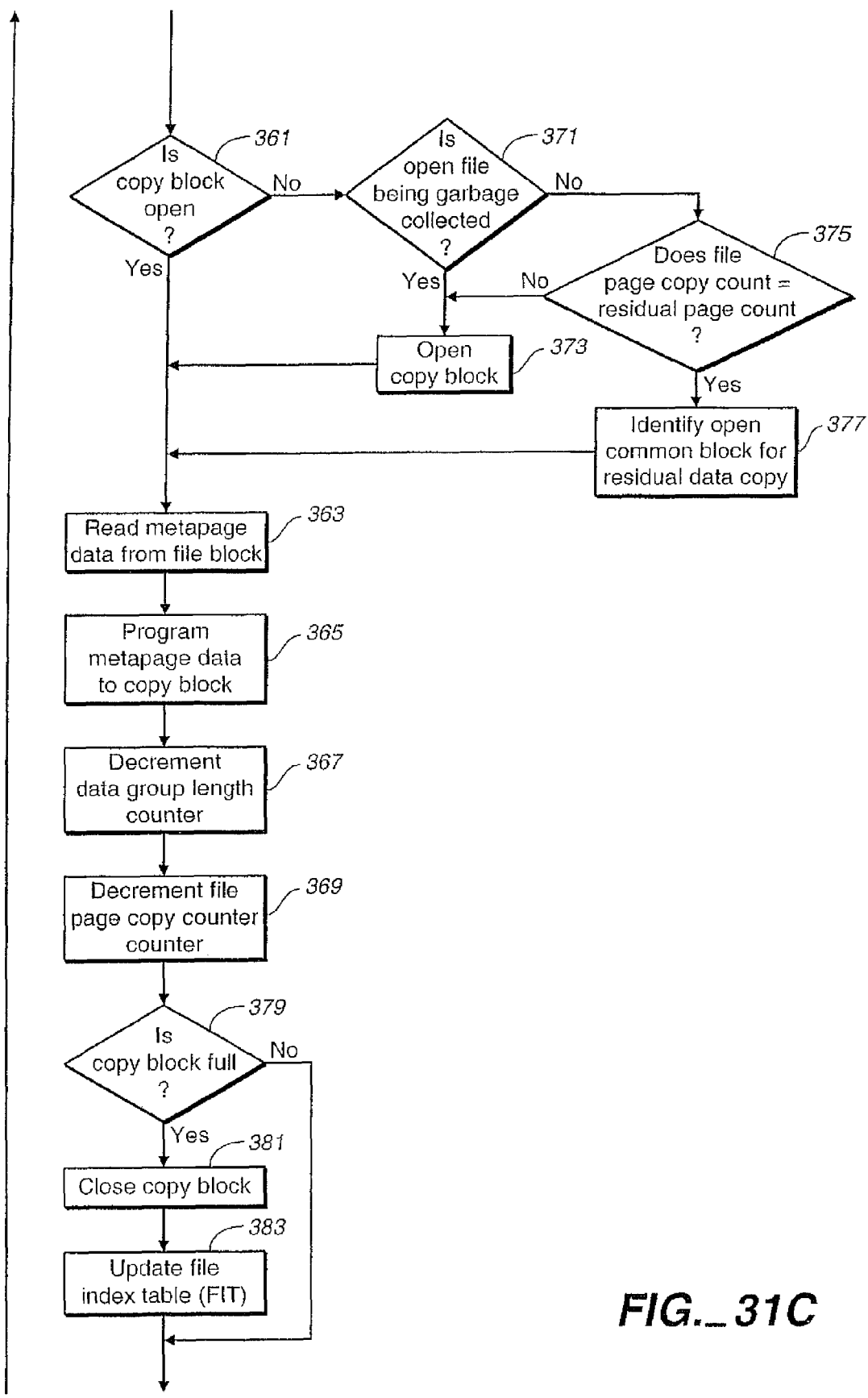
FIG._31C

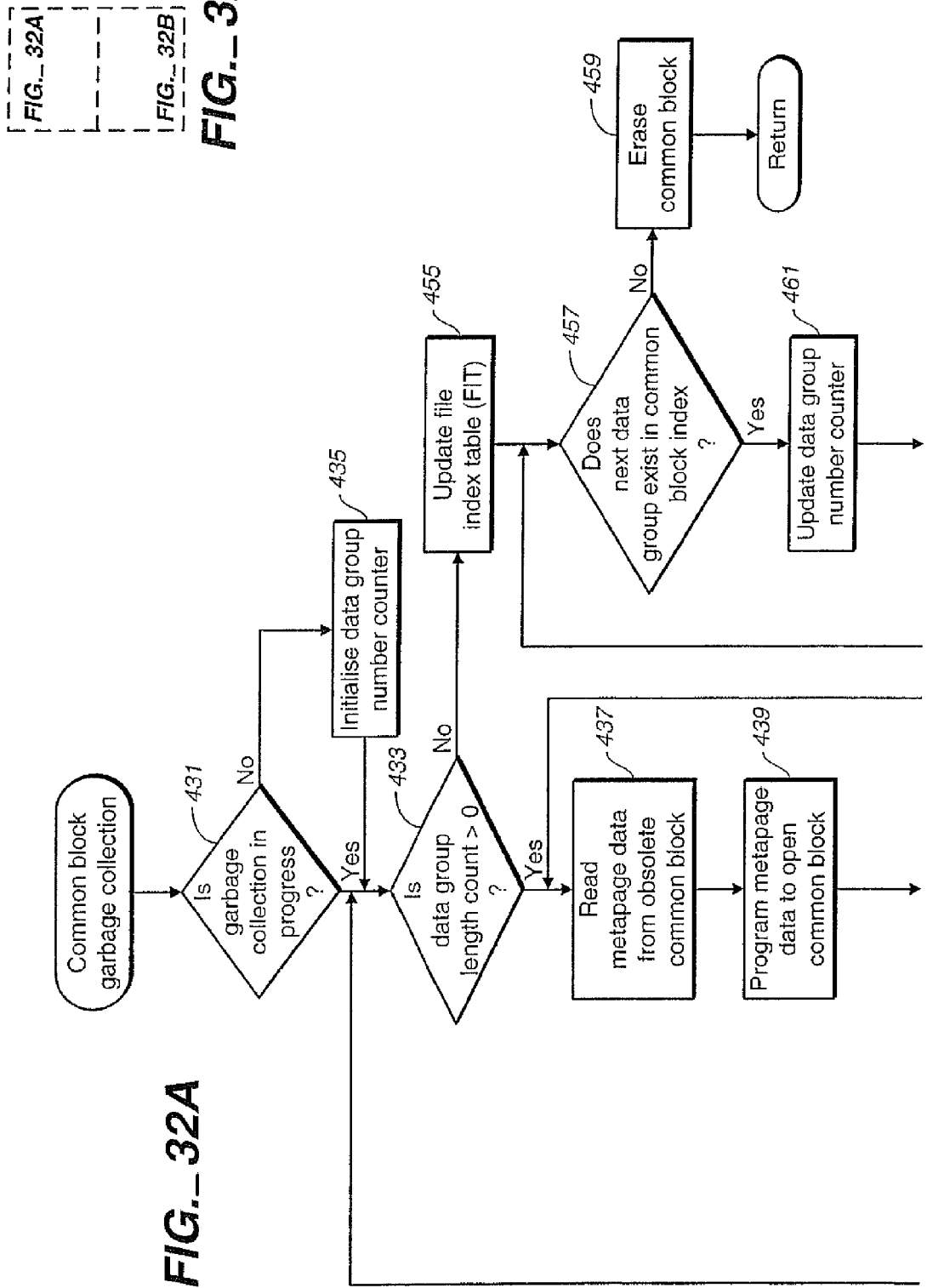

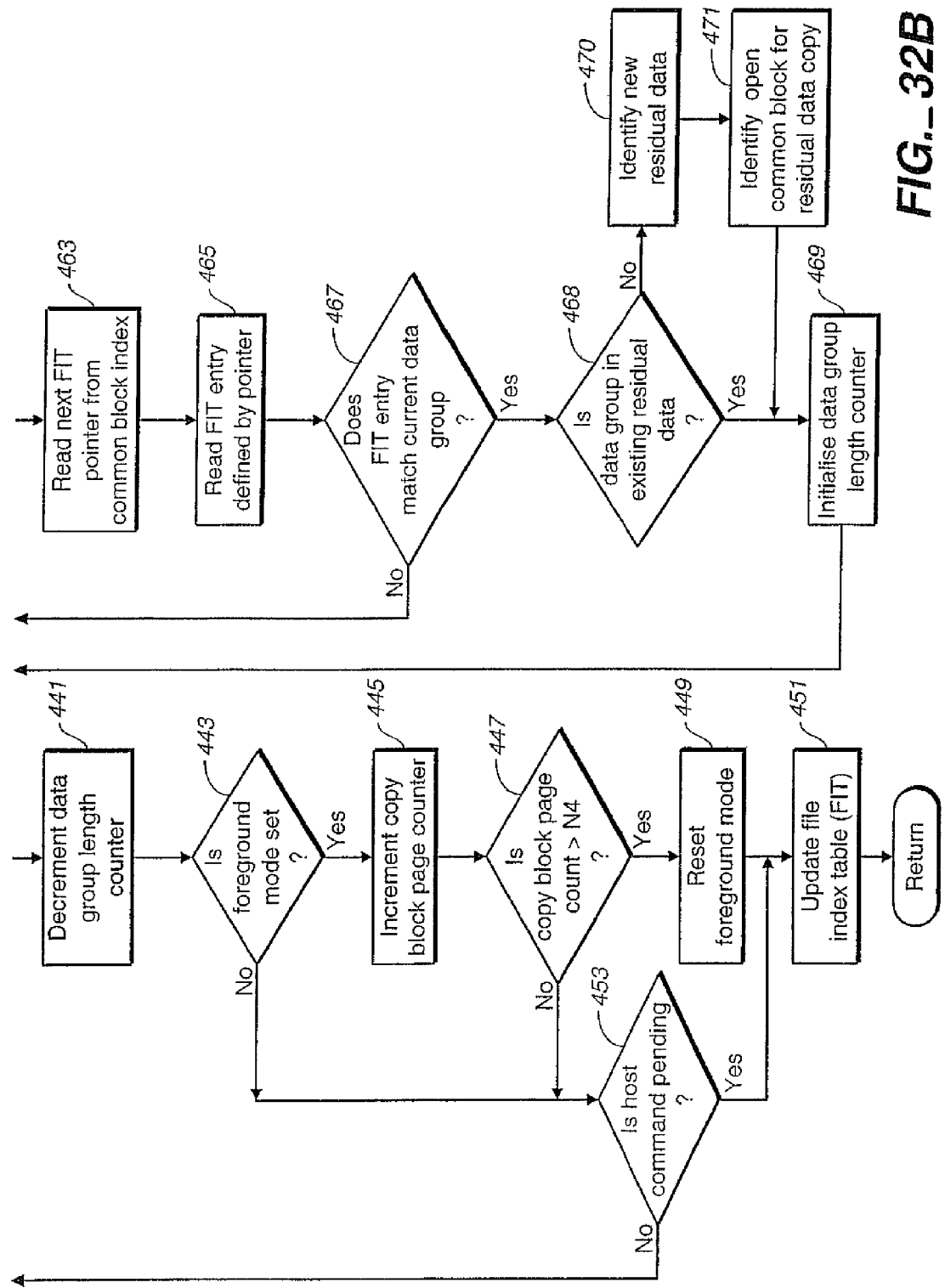
FIG._32B

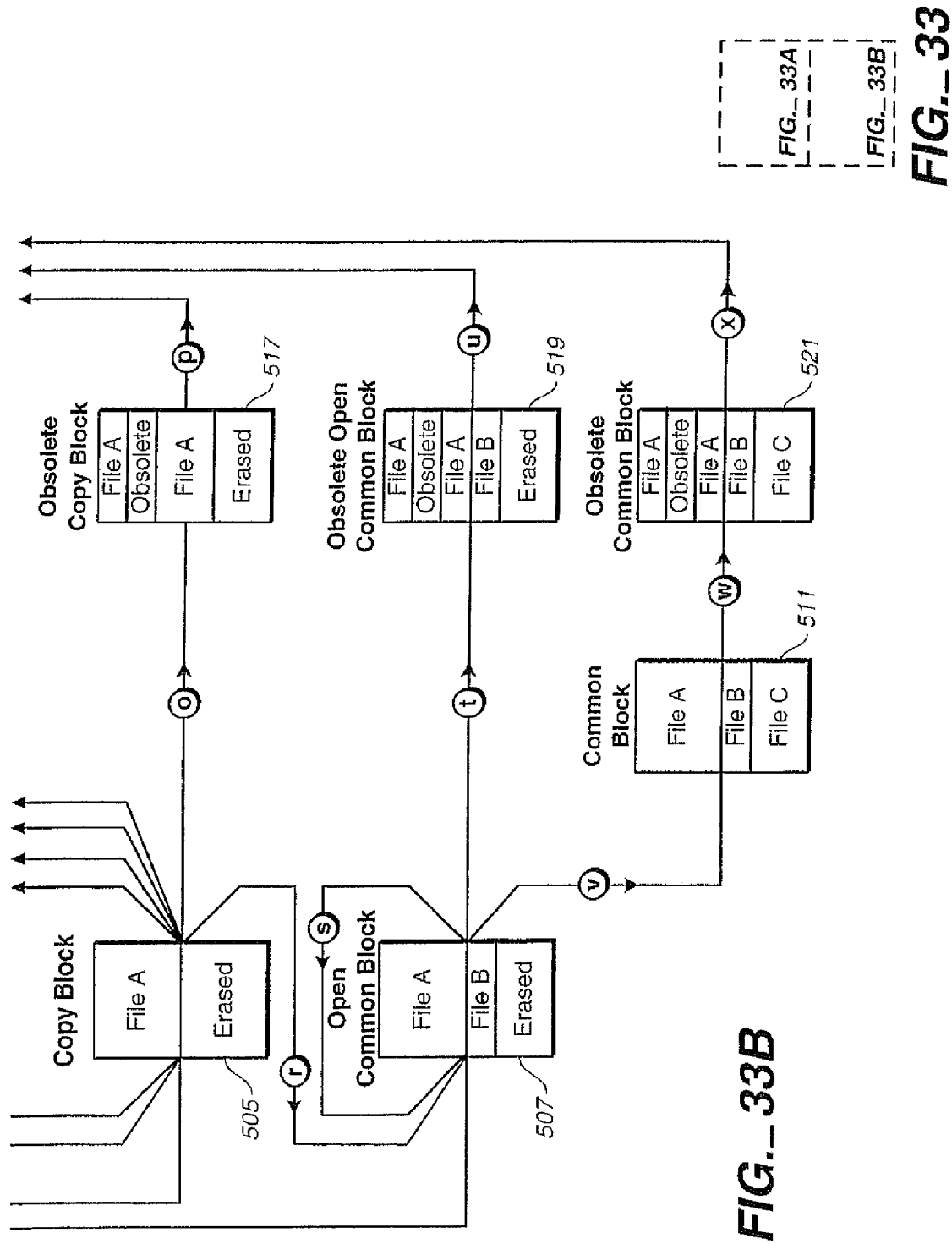

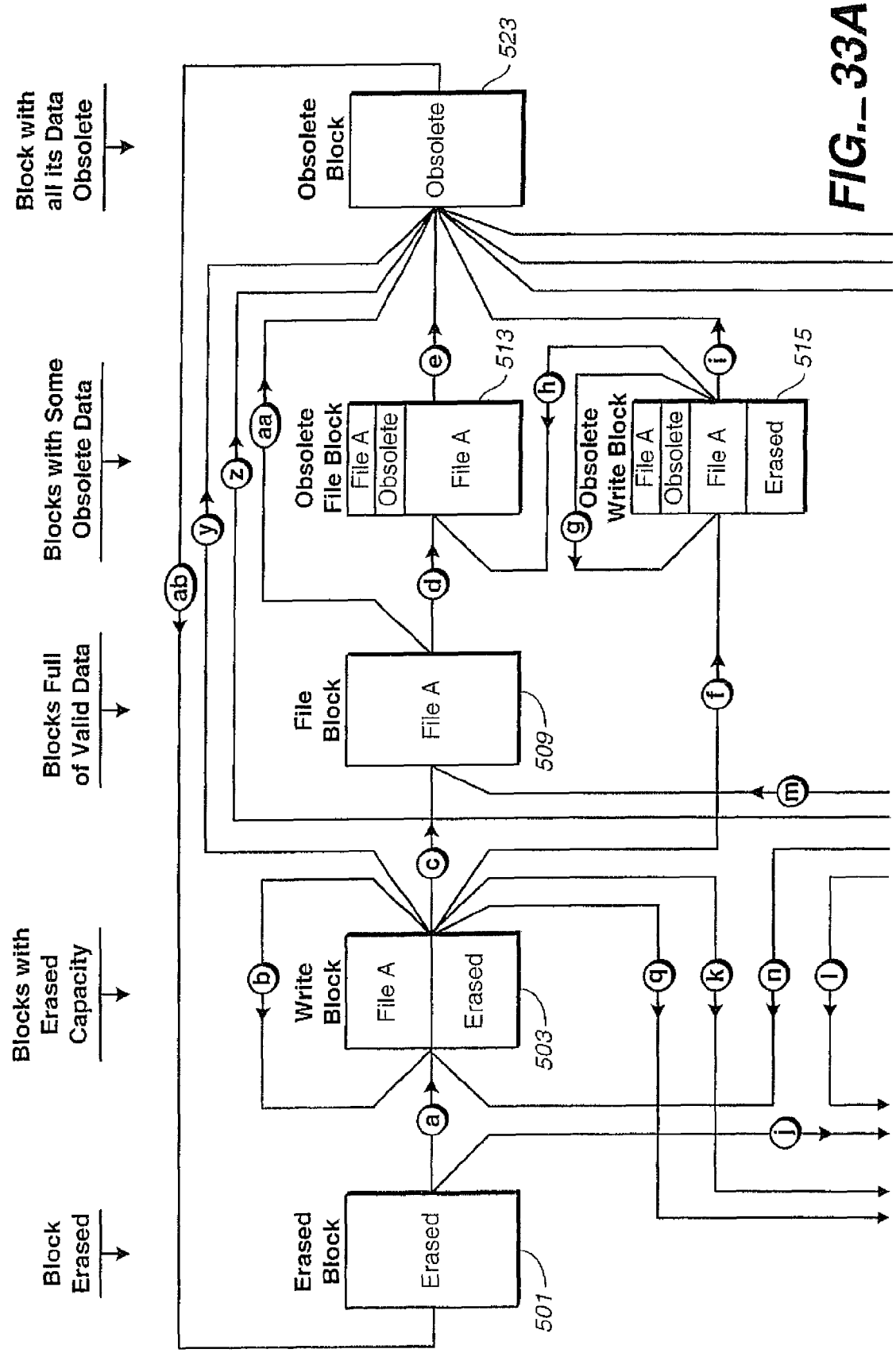

DIRECT FILE DATA PROGRAMMING AND DELETION IN FLASH MEMORIES

CROSS REFERENCE TO RELATED APPLICATION

This application is a continuation of U.S. application Ser. No. 11/342,170 filed Jan. 26, 2006, which is a divisional of U.S. application Ser. No. 11/060,174, filed Feb. 16, 2005, which applications are incorporated herein in their entirety by this reference.

GENERAL BACKGROUND

This application relates to the operation of re-programmable non-volatile memory systems such as semiconductor flash memory, and, more specifically, to the management of the interface between a host device and the memory. All patents, patent applications, articles and other publications, documents and things referenced herein are hereby incorporated herein by this reference in their entirety for all purposes.

In an early generation of commercial flash memory systems, a rectangular array of memory cells were divided into a large number of groups of cells that each stored the amount of data of a standard disk drive sector, namely 512 bytes. An additional amount of data, such as 16 bytes, are also usually included in each group to store an error correction code (ECC) and possibly other overhead data relating to the user data and/or to the memory cell group in which it is stored. The memory cells in each such group are the minimum number of memory cells that are erasable together. That is, the erase unit is effectively the number of memory cells that store one data sector and any overhead data that is included. Examples of this type of memory system are described in U.S. Pat. Nos. 5,602,987 and 6,426,893. It is a characteristic of flash memory that the memory cells need to be erased prior to re-programming them with data.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In later generations of flash memory systems, the size of the erase unit was increased to a block of enough memory cells to store multiple sectors of data. Even though host systems with which the memory systems are connected may program and read data in small minimum units such as sectors, a large number of sectors are stored in a single erase unit of the flash memory. It is common for some sectors of data within a block to become obsolete as the host updates or replaces logical sectors of data. Since the entire block must be erased before any data stored in the block can be overwritten, new or updated data are typically stored in another block that has been erased and has remaining capacity for the data. This process leaves the original block with obsolete data that take valuable space within the memory. But that block cannot be erased if there are any valid data remaining in it.

Therefore, in order to better utilize the memory's storage capacity, it is common to consolidate or collect valid partial block amounts of data by copying them into an erased block so that the block(s) from which these data are copied may then be erased and their entire storage capacity reused. It is also desirable to copy the data in order to group data sectors within a block in the order of their logical addresses since this increases the speed of reading the data and transferring the read data to the host. If such data copying occurs too frequently, the operating performance of the memory system can be degraded. This particularly affects operation of memory systems where the storage capacity of the memory is little more than the amount of data addressable by the host through the logical address space of the system, a typical case. In this case, data consolidation or collection may be required before a host programming command can be executed. The programming time is then increased.

The sizes of the blocks are increasing in successive generations of memory systems in order to increase the number of bits of data that may be stored in a given semiconductor area. Blocks storing 256 data sectors and more are becoming common. Additionally, two, four or more blocks of different arrays or sub-arrays are often logically linked together into metablocks in order to increase the degree of parallelism in data programming and reading. Along with such large capacity operating units come challenges in operating them efficiently.

SUMMARY OF THE INVENTION

Many techniques have been developed that overcome to various degrees certain of the problems encountered in efficiently operating such large erase block flash memory systems. The present invention, on the other hand, takes a more fundamental approach by changing the data transfer interface between the memory and host system. Rather than communicating data between them by the use of logical addresses within a virtual address space, as is currently done, a data file is identified by a filename assigned by the host and an offset address within the file. The memory system then knows the host file to which each sector or other unit of data belongs. The file unit being discussed herein is a set of data that is ordered, such as by having sequential offset addresses, and which is created and uniquely identified by an application program operating in a host computing system.

This is not employed by current commercial memory systems since hosts now identify data to the memory system within all files by a common set of logical addresses without identifying the files. By identifying host data by file objects instead of using logical addresses, the memory system controller can store the data in a manner that reduces the need for such frequent data consolidation and collection. The frequency of data copy operations and the amount of data copied are thus significantly reduced, thereby increasing the data programming and reading performance of the memory system. Further, the memory system controller maintains directory and index table information of the memory blocks into which host files are stored. It is then unnecessary for the host to maintain the file allocation table (FAT) that is currently necessary for managing a logical address interface.

An implementation of such a file based interface utilizes a host command to delete a file that is executed by the memory system by rendering the stored file data obsolete in all the memory cell blocks in which they are stored. Memory blocks that then contain only obsolete data as a result of the delete command can be either immediately erased or scheduled for an early erasure. Any memory blocks containing both obsolete data of the deleted file and valid data of another file may be garbage collected as part of the normal operation of the memory system to free up unused memory space for use.

A delete command is not part of existing logical address host/memory interfaces, where the memory system instead typically learns of the deletion of data by the host when the host attempts to write new data to a logical address of existing data. The existing data stored at overwritten logical addresses are then known to be obsolete but the full extent of the host's deletion is not known. Since, by the techniques herein, the memory system keeps track of files, it is directly informed by the host when a file is deleted. The memory controller then identifies the locations of all the data rendered obsolete as a result of the file's deletion, which allows space taken by obsolete data to be reclaimed and prepared to receive new data before it is needed. New data may then be written into pre-erased memory block capacity.

This significantly increases the number of pre-erased memory blocks available for programming and significantly decreases instances of garbage collection being necessarily performed in response to a data write command in order to have enough erased blocks to store the data. Since the block erasures may be done in the background without interfering with programming and reading operations, the performance of the memory system is thereby significantly increased.

Other aspects, advantages, features and details of the present invention are included in a description of exemplary examples thereof that follows, which description should be taken in conjunction with the accompanying drawings.

BRIEF DESCRIPTION OF THE DRAWINGS

FIG. 1 schematically illustrates a host and a connected non-volatile memory system as currently implemented;

FIG. 2 is a block diagram of an example flash memory system for use as the non-volatile memory of FIG. 1;

FIG. 3 is a representative circuit diagram of a memory cell array that may be used in the system of FIG. 2;

FIG. 4 illustrates an example physical memory organization of the system of FIG. 2;

FIG. 5 shows an expanded view of a portion of the physical memory of FIG. 4;

FIG. 6 shows a further expanded view of a portion of the physical memory of FIGS. 4 and 5;

FIG. 7 illustrates a common prior art logical address interface between a host and a re-programmable memory system;

FIG. 8 illustrates in a different manner than FIG. 7 a common prior art logical address interface between a host and a re-programmable memory system;

FIG. 9 illustrates a direct file storage interface between a host and a re-programmable memory system, according to the present invention;

FIG. 10 illustrates in a different manner than FIG. 9 a direct file storage interface between a host and a re-programmable memory system, according to the present invention;

FIG. 11 shows a functional hierarchy of an example memory system;

FIGS. 12A-12E give an example set of direct file interface commands;

FIGS. 13A-13D show four different examples of writing data files directly into the memory;

FIGS. 14A-14E illustrate a sequence of writing a single data file directly into the memory;

FIG. 15 shows the result of garbage collecting the data file illustrated in FIG. 14E;

FIG. 16 gives an example of a common block;

FIG. 17 illustrates programming a common data group into one of several open common blocks;

FIG. 18 shows several examples of metapages of data programmed into the non-volatile memory in different files;

FIG. 19 illustrates a structure for a file index table (FIT) and entries from the examples of FIGS. 14A, 14C, 14E and 15;

FIG. 20 conceptually illustrates an example file indexing data structure;

FIG. 21 shows a structure for pages of the file directory of FIG. 20;

FIG. 22 shows a structure for pages of the file index table of FIG. 20;

FIG. 23 shows a structure for pages of the file directory of FIG. 20, as an alternative to that of FIG. 21;

FIG. 24 illustrates an operation of the file directories of FIGS. 21 and 23;

FIG. 25 illustrates an operation of the file index table of FIG. 22;

FIG. 26 is a flowchart showing an overall sequence of operations of a memory system described herein;

FIG. 27 is a flowchart of the "Read file data" block of FIG. 26;

FIG. 28 is a flowchart of the "Program file data" block of FIG. 26;

FIG. 29 illustrates a relative timing of two operations included in the flowchart of FIG. 28;

FIG. 30 is a flowchart of the "Delete file" block of FIG. 26;

FIG. 31 is a flowchart of the "Garbage collection" block of FIG. 26;

FIG. 32 is a flowchart of the "Common block garbage collection" block of FIG. 31; and FIG. 33 is a state diagram of the memory cell blocks during the described operation of the example memory system herein.

FIG. 34 illustrates five different queues maintained by the memory system controller.

FLASH MEMORY SYSTEM GENERAL DESCRIPTION

A current flash memory system and a typical operation with host devices are described with respect to FIGS. 1-8. It is in such a system that the various aspects of the present invention may be implemented. A host system 1 of FIG. 1 stores data into and retrieves data from a flash memory 2. Although the flash memory can be embedded within the host, the memory 2 is illustrated to be in the more popular form of a card that is removably connected to the host through mating parts 3 and 4 of a mechanical and electrical connector. There are currently many different flash memory cards that are commercially available, examples being the CompactFlash (CF), the MultiMediaCard (MMC), Secure Digital (SD), miniSD, Memory Stick, SmartMedia and TransFlash cards. Although each of these cards has a unique mechanical and/or electrical interface according to its standardized specifications, the flash memory included in each is very similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that use such memory cards and flash drives are many and varied. They include personal computers (PCs), laptop and other portable computers, cellular telephones, personal digital assistants (PDAs), digital still cameras, digital movie cameras and portable audio players. The host typically includes a built-in receptacle for one or more types of memory cards or flash drives but some require adapters into which a memory card is plugged.

The host system 1 of FIG. 1 may be viewed as having two major parts, insofar as the memory 2 is concerned, made up of a combination of circuitry and software. They are an applications portion 5 and a driver portion 6 that interfaces with the memory 2. In a personal computer, for example, the applications portion 5 can include a processor running word processing, graphics, control or other popular application software. In a camera, cellular telephone or other host system that is primarily dedicated to performing a single set of functions, the applications portion 5 includes the software that operates the camera to take and store pictures, the cellular telephone to make and receive calls, and the like.

The memory system 2 of FIG. 1 includes flash memory 7, and circuits 8 that both interface with the host to which the card is connected for passing data back and forth and control the memory 7. The controller 8 typically converts between logical addresses of data used by the host 1 and physical addresses of the memory 7 during data programming and reading.

Referring to FIG. 2, circuitry of a typical flash memory system that may be used as the non-volatile memory 2 of FIG. 1 is described. The system controller is usually implemented on a single integrated circuit chip 11 that is connected in parallel with one or more integrated circuit memory chips over a system bus 13, a single such memory chip 15 being shown in FIG. 2. The particular bus 13 that is illustrated includes a separate set of conductors 17 to carry data, a set 19 for memory addresses and a set 21 for control and status signals. Alternatively, a single set of conductors may be time shared between these three functions. Further, other configurations of system buses can be employed, such as a ring bus that is described in U.S. patent application Ser. No. 10/915, 039, filed Aug. 9, 2004, entitled "Ring Bus Structure and It's Use in Flash Memory Systems."

A typical controller chip 11 has its own internal bus 23 that interfaces with the system bus 13 through interface circuits 25. The primary functions normally connected to the bus are a processor 27 (such as a microprocessor or micro-controller), a read-only-memory (ROM) 29 containing code to initialize ("boot") the system, read-only-memory (RAM) 31 used primarily to buffer data being transferred between the memory and a host, and circuits 33 that calculate and check an error correction code (ECC) for data passing through the controller between the memory and the host. The controller bus 23 interfaces with a host system through circuits 35, which, in the case of the system of FIG. 2 being contained within a memory card, is done through external contacts 37 of the card that are part of the connector 4. A clock 39 is connected with and utilized by each of the other components of the controller 11.

The memory chip 15, as well as any other connected with the system bus 13, typically contains an array of memory cells organized into multiple sub-arrays or planes, two such planes 41 and 43 being illustrated for simplicity but more, such as four or eight such planes, may instead be used. Alternatively, the memory cell array of the chip 15 may not be divided into planes. When so divided however, each plane has its own column control circuits 45 and 47 that are operable independently of each other. The circuits 45 and 47 receive addresses of their respective memory cell array from the address portion 19 of the system bus 13, and decode them to address a specific one or more of respective bit lines 49 and 51. The word lines 53 are addressed through row control circuits 55 in response to addresses received on the address bus 19. Source voltage control circuits 57 and 59 are also connected with the respective planes, as are p-well voltage control circuits 61 and 63. If the memory chip 15 has a single array of memory cells, and if two or more such chips exist in the system, the array of each chip may be operated similarly to a plane or sub-array within the multi-plane chip described above.

Data are transferred into and out of the planes 41 and 43 through respective data input/output circuits 65 and 67 that are connected with the data portion 17 of the system bus 13. The circuits 65 and 67 provide for both programming data into the memory cells and for reading data from the memory cells of their respective planes, through lines 69 and 71 connected to the planes through respective column control circuits 45 and 47.

Although the controller 11 controls the operation of the memory chip 15 to program data, read data, erase and attend to various housekeeping matters, each memory chip also contains some controlling circuitry that executes commands from the controller 11 to perform such functions. Interface circuits 73 are connected to the control and status portion 21 of the system bus 13. Commands from the controller are provided to a state machine 75 that then provides specific control of other circuits in order to execute these commands. Control lines 77-81 connect the state machine 75 with these other circuits as shown in FIG. 2. Status information from the state machine 75 is communicated over lines 83 to the interface 73 for transmission to the controller 11 over the bus portion 21.

A NAND architecture of the memory cell arrays 41 and 43 is currently preferred, although other architectures, such as NOR, can also be used instead. Examples of NAND flash memories and their operation as part of a memory system may be had by reference to U.S. Pat. Nos. 5,570,315, 5,774,397, 6,046,935, 6,373,746, 6,456,528, 6,522,580, 6,771,536 and 6,781,877 and United States patent application publication no. 2003/0147278.

An example NAND array is illustrated by the circuit diagram of FIG. 3, which is a portion of the memory cell array 41 of the memory system of FIG. 2. A large number of global bit lines are provided, only four such lines 91-94 being shown in FIG. 2 for simplicity of explanation. A number of series connected memory cell strings 97-104 are connected between one of these bit lines and a reference potential. Using the memory cell string 99 as representative, a plurality of charge storage memory cells 107-110 are connected in series with select transistors 111 and 112 at either end of the string. When the select transistors of a string are rendered conductive, the string is connected between its bit line and the reference potential. One memory cell within that string is then programmed or read at a time.

Word lines 115-118 of FIG. 3 individually extend across the charge storage element of one memory cell in each of a number of strings of memory cells, and gates 119 and 120 control the states of the select transistors at each end of the strings. The memory cell strings that share common word and control gate lines 115-120 are made to form a block 123 of memory cells that are erased together. This block of cells contains the minimum number of cells that are physically erasable at one time. One row of memory cells, those along one of the word lines 115-118, are programmed at a time. Typically, the rows of a NAND array are programmed in a prescribed order, in this case beginning with the row along the word line 118 closest to the end of the strings connected to ground or another common potential. The row of memory cells along the word line 117 is programmed next, and so on, throughout the block 123. The row along the word line 115 is programmed last.

A second block 125 is similar, its strings of memory cells being connected to the same global bit lines as the strings in the first block 123 but having a different set of word and control gate lines. The word and control gate lines are driven to their proper operating voltages by the row control circuits 55. If there is more than one plane or sub-array in the system, such as planes 1 and 2 of FIG. 2, one memory architecture uses common word lines extending between them. There can alternatively be more than two planes or sub-arrays that share common word lines. In other memory architectures, the word lines of individual planes or sub-arrays are separately driven.

As described in several of the NAND patents and published application referenced above, the memory system may be operated to store more than two detectable levels of charge in each charge storage, element or region, thereby to store more than one bit of data in each. The charge storage elements of the memory cells are most commonly conductive floating gates but may alternatively be non-conductive dielectric charge trapping material, as described in United States patent application publication no. 2003/0109093.

FIG. 4 conceptually illustrates an organization of the flash memory cell array 7 (FIG. 1) that is used as an example in further descriptions below. Four planes or sub-arrays 131-134 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 4 by rectangles, such as blocks 137, 138, 139 and 140, located in respective planes 131-134. There can be dozens or hundreds of blocks in each plane. As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 137-140 are shown to form one metablock 141. All of the cells within a metablock are typically erased together. The blocks used to form a metablock need not be restricted to the same relative locations within their respective planes, as is shown in a second metablock 143 made up of blocks 145-148. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

The individual blocks are in turn divided for operational purposes into pages of memory cells, as illustrated in FIG. 5. The memory cells of each of the blocks 131-134, for example, are each divided into eight pages P0-P7. Alternatively, there may be 16, 32 or more pages of memory cells within each block. The page is the unit of data programming and reading within a block, containing the minimum amount of data that are programmed at one time. In the NAND architecture of FIG. 3, a page is formed of memory cells along a word line within a block. However, in order to increase the memory system operational parallelism, such pages within two or more blocks may be logically linked into metapages. A metapage 151 is illustrated in FIG. 5, being formed of one physical page from each of the four blocks 131-134. The metapage 151, for example, includes the page P2 in of each of the four blocks but the pages of a metapage need not necessarily have the same relative position within each of the blocks. Although it is preferable to program and read the maximum amount of data in parallel across all four planes, for high system performance, the memory system can also be operated to form metapages of any or all of one, two or three pages in separate blocks in different planes. This allows the programming and reading operations to adaptively match the amount of data that may be conveniently handled in parallel and reduces the occasions when part of a metapage remains unprogrammed with data.

A metapage formed of physical pages of multiple planes, as illustrated in FIG. 5, contains memory cells along word line rows of those multiple planes. Rather than programming all of the cells in one word line row at the same time, they are more commonly alternately programmed in two or more interleaved groups, each group storing a page of data (in a single block) or a metapage of data (across multiple blocks). By programming alternate memory cells at one time, a unit of peripheral circuits including data registers and a sense amplifier need not be provided for each bit line but rather are time-shared between adjacent bit lines. This economizes on the amount of substrate space required for the peripheral circuits and allows the memory cells to be packed with an increased density along the rows. Otherwise, it is preferable to simultaneously program every cell along a row in order to maximize the parallelism available from a given memory system.

With reference to FIG. 3, the simultaneous programming of data into every other memory cell along a row is most conveniently accomplished by providing two rows of select transistors (not shown) along at least one end of the NAND strings, instead of the single row that is shown. The select transistors of one row then connect every other string within a block to their respective bit lines in response to one control signal, and the select transistors of the other row connect intervening every other string to their respective bit lines in response to another control signal. Two pages of data are therefore written into each row of memory cells.

The amount of data in each logical page is typically an integer number of one or more sectors of data, each sector containing 512 bytes of data, by convention. FIG. 6 shows a logical data page of two sectors 153 and 155 of data of a page or metapage. Each sector usually contains a portion 157 of 512 bytes of user or system data being stored and another number of bytes 159 for overhead data related either to the data in the portion 157 or to the physical page or block in which it is stored. The number of bytes of overhead data is typically 16 bytes, making the total 528 bytes for each of the sectors 153 and 155. The overhead portion 159 may contain an ECC calculated from the data portion 157 during programming, its logical address, an experience count of the number of times the block has been erased and re-programmed, one or more control flags, operating voltage levels, and/or the like, plus an ECC calculated from such overhead data 159. Alternatively, the overhead data 159, or a portion of it, may be stored in different pages in other blocks.

As the parallelism of memories increases, data storage capacity of the metablock increases and the size of the data page and metapage also increase as a result. The data page may then contain more than two sectors of data. With two sectors in a data page, and two data pages per metapage, there are four sectors in a metapage. Each metapage thus stores 2048 bytes of data. This is a high degree of parallelism, and can be increased even further as the number of memory cells in the rows are increased. For this reason, the width of flash memories is being extended in order to increase the amount of data in a page and a metapage.

The physically small re-programmable non-volatile memory cards and flash drives identified above are commercially available with data storage capacity of 512 megabytes (MB), 1 gigabyte (GB), 2 GB and 4 GB, and may go higher. FIG. 7 illustrates the most common interface between a host and such a mass memory system. The host deals with data files generated or used by application software or firmware programs executed by the host. A word processing data file is an example, and a drawing file of computer aided design (CAD) software is another, found mainly in general computer hosts such as PCs, laptop computers and the like. A document in the pdf format is also such a file. A still digital video camera generates a data file for each picture that is stored on a memory card. A cellular telephone utilizes data from files on an internal memory card, such as a telephone directory. A PDA stores and uses several different files, such as an address file, a calendar file, and the like. In any such application, the memory card may also contain software that operates the host.

A common logical interface between the host and the memory system is illustrated in FIG. 7. A continuous logical address space 161 is large enough to provide addresses for all the data that may be stored in the memory system. The host address space is typically divided into increments of clusters of data. Each cluster may be designed in a given host system to contain a number of sectors of data, somewhere between 4 and 64 sectors being typical. A standard sector contains 512 bytes of data.

Three Files 1, 2 and 3 are shown in the example of FIG. 7 to have been created. An application program running on the host system creates each file as an ordered set of data and identifies it by a unique name or other reference. Enough available logical address space not already allocated to other files is assigned by the host to File 1. File 1 is shown to have been assigned a contiguous range of available logical addresses. Ranges of addresses are also commonly allocated for specific purposes, such as a particular range for the host operating software, which are then avoided for storing data even if these addresses have not been utilized at the time the host is assigning logical addresses to the data.

When a File 2 is later created by the host, the host similarly assigns two different ranges of contiguous addresses within the logical address space 161, as shown in FIG. 7. A file need not be assigned contiguous logical addresses but rather can be fragments of addresses in between address ranges already allocated to other files. This example then shows that yet another File 3 created by the host is allocated other portions of the host address space not previously allocated to the Files 1 and 2 and other data.

The host keeps track of the memory logical address space by maintaining a file allocation table (FAT), where the logical addresses the host assigns to the various host files are maintained. The FAT table is typically stored in the non-volatile memory, as well as in a host memory, and is frequently updated by the host as new files are stored, other files deleted, files modified and the like. When a host file is deleted, for example, the host then deallocates the logical addresses previously allocated to the deleted file by updating the FAT table to show that they are now available for use with other data files.

The host is not concerned about the physical locations where the memory system controller chooses to store the files. The typical host only knows its logical address space and the logical addresses that it has allocated to its various files. The memory system, on the other hand, through a typical host/card interface, only knows the portions of the logical address space to which data have been written but does not know the logical addresses allocated to specific host files, or even the number of host files. The memory system controller converts the logical addresses provided by the host for the storage or retrieval of data into unique physical addresses within the flash memory cell array where host data are stored. A block 163 represents a working table of these logical-to-physical address conversions, which is maintained by the memory system controller.

The memory system controller is programmed to store data files within the blocks and metablocks of a memory array 165 in a manner to maintain the performance of the system at a high level. Four planes or sub-arrays are used in this illustration. Data are preferably programmed and read with the maximum degree of parallelism that the system allows, across an entire metablock formed of a block from each of the planes. At least one metablock 167 is usually allocated as a reserved block for storing operating firmware and data used by the memory controller. Another metablock 169, or multiple metablocks, may be allocated for storage of host operating software, the host FAT table and the like. Most of the physical storage space remains for the storage of data files. The memory controller does not know, however, how the data received has been allocated by the host among its various file objects. All the memory controller typically knows from interacting with the host is that data written by the host to specific logical addresses are stored in corresponding physical addresses as maintained by the controller's logical-to-physical address table 163.

In a typical memory system, a few extra blocks of storage capacity are provided than are necessary to store the amount of data within the address space 161. One or more of these extra blocks may be provided as redundant blocks for substitution for other blocks that may become defective during the lifetime of the memory. The logical grouping of blocks contained within individual metablocks may usually be changed for various reasons, including the substitution of a redundant block for a defective block originally assigned to the metablock. One or more additional blocks, such as metablock 171, are typically maintained in an erased block pool. When the host writes data to the memory system, the controller converts the logical addresses assigned by the host to physical addresses within a metablock in the erased block pool. Other metablocks not being used to store data within the logical address space 161 are then erased and designated as erased pool blocks for use during a subsequent data write operation.

Data stored at specific host logical addresses are frequently overwritten by new data as the original stored data become obsolete. The memory system controller, in response, writes the new data in an erased block and then changes the logical-to-physical address table for those logical addresses to identify the new physical block to which the data at those logical addresses are stored. The blocks containing the original data at those logical addresses are then erased and made available for the storage of new data. Such erasure often must take place before a current data write operation may be completed if there is not enough storage capacity in the pre-erased blocks from the erase block pool at the start of writing. This can adversely impact the system data programming speed. The memory controller typically learns that data at a given logical address has been rendered obsolete by the host only when the host writes new data to their same logical address. Many blocks of the memory can therefore be storing such invalid data for a time.

The sizes of blocks and metablocks are increasing in order to efficiently use the area of the integrated circuit memory chip. This results in a large proportion of individual data writes storing an amount of data that is less than the storage capacity of a metablock, and in many cases even less than that of a block. Since the memory system controller normally directs new data to an erased pool metablock, this can result in portions of metablocks going unfilled. If the new data are updates of some data stored in another metablock, remaining valid metapages of data from that other metablock having logical addresses contiguous with those of the new data metapages are also desirably copied in logical address order into the new metablock. The old metablock may retain other valid data metapages. This results over time in data of certain metapages of an individual metablock being rendered obsolete and invalid, and replaced by new data with the same logical address being written to a different metablock.

In order to maintain enough physical memory space to store data over the entire logical address space 161, such data are periodically compacted or consolidated (garbage collection). It is also desirable to maintain sectors of data within the metablocks in the same order as their logical addresses as much as practical, since this makes reading data in contiguous logical addresses more efficient. So data compaction and garbage collection are typically performed with this additional goal. Some aspects of managing a memory when receiving partial block data updates and the use of metablocks are described in U.S. Pat. No. 6,763,424.

Data compaction typically involves reading all valid data metapages from a metablock and writing them to a new block, ignoring metapages with invalid data in the process. The metapages with valid data are also preferably arranged with a physical address order that matches the logical address order of the data stored in them. The number of metapages occupied in the new metablock will be less than those occupied in the old metablock since the metapages containing invalid data are not copied to the new metablock. The old block is then erased and made available to store new data. The additional metapages of capacity gained by the consolidation can then be used to store other data.

During garbage collection, metapages of valid data with contiguous or near contiguous logical addresses are gathered from two or more metablocks and re-written into another metablock, usually one in the erased block pool. When all valid data metapages are copied from the original two or more metablocks, they may be erased for future use.

Data consolidation and garbage collection take time and can affect the performance of the memory system, particularly if data consolidation or garbage collection needs to take place before a command from the host can be executed. Such operations are normally scheduled by the memory system controller to take place in the background as much as possible but the need to perform these operations can cause the controller to have to give the host a busy status signal until such an operation is completed. An example of where execution of a host command can be delayed is where there are not enough pre-erased metablocks in the erased block pool to store all the data that the host wants to write into the memory and data consolidation or garbage collection is needed first to clear one or more metablocks of valid data, which can then be erased. Attention has therefore been directed to managing control of the memory in order to minimize such disruptions. Many such techniques are described in the following U.S. patent application Ser. No. 10/749,831, filed Dec. 30, 2003, entitled "Management of Non-Volatile Memory Systems Having Large Erase Blocks"; Ser. No. 10/750,155, filed Dec. 30, 2003, entitled "Non-Volatile Memory and Method with Block Management System"; Ser. No. 10/917,888, filed Aug. 13, 2004, entitled "Non-Volatile Memory and Method with Memory Planes Alignment"; Ser. No. 10/917,867, filed Aug. 13, 2004; Ser. No. 10/917,889, filed Aug. 13, 2004, entitled "Non-Volatile Memory and Method with Phased Program Failure Handling"; and Ser No. 10/917,725, filed Aug. 13, 2004, entitled "Non-Volatile Memory and Method with Control Data Management."

One challenge to efficiently control operation of memory arrays with very large erase blocks is to match and align the number of data sectors being stored during a given write operation with the capacity and boundaries of blocks of memory. One approach is to configure a metablock used to store new data from the host with less than a maximum number of blocks, as necessary to store a quantity of data less than an amount that fills an entire metablock. The use of adaptive metablocks is described in U.S. patent application Ser. No. 10/749,189, filed Dec. 30, 2003, entitled "Adaptive Metablocks." The fitting of boundaries between blocks of data and physical boundaries between metablocks is described in patent application Ser. No. 10/841,118, filed May 7, 2004, and Ser. No. 11/016,271, filed Dec. 16, 2004, entitled "Data Run Programming."

The memory controller may also use data from the FAT table, which is stored by the host in the non-volatile memory, to more efficiently operate the memory system. One such use is to learn when data has been identified by the host to be obsolete by deallocating their logical addresses. Knowing this allows the memory controller to schedule erasure of the blocks containing such invalid data before it would normally learn of it by the host writing new data to those logical addresses. This is described in U.S. patent application Ser. No. 10/897,049, filed Jul. 21, 2004, entitled "Method and Apparatus for Maintaining Data on Non-Volatile Memory Systems." Other techniques include monitoring host patterns of writing new data to the memory in order to deduce whether a given write operation is a single file, or, if multiple files, where the boundaries between the files lie. U.S. patent application Ser. No. 11/022,369, filed Dec. 23, 2004, entitled "FAT Analysis for Optimized Sequential Cluster Management," describes the use of techniques of this type.

To operate the memory system efficiently, it is desirable for the controller to know as much about the logical addresses assigned by the host to data of its individual files as it can. Data files can then be stored by the controller within a single metablock or group of metablocks, rather than being scattered among a larger number of metablocks when file boundaries are not known. The result is that the number and complexity of data consolidation and garbage collection operations are reduced. The performance of the memory system improves as a result. But it is difficult for the memory controller to know much about the host data file structure when the host/memory interface includes the logical address space 161 (FIG. 7), as described above.

Referring to FIG. 8, the typical logical address host/memory interface as already shown in FIG. 7 is illustrated differently. The host generated data files are allocated logical addresses by the host. The memory system then sees these logical addresses and maps them into physical addresses of blocks of memory cells where the data are actually stored.

DESCRIPTION OF EXEMPLARY FILE-BASED INTERFACE EMBODIMENTS

The improved interface between a host and memory system for the storage of mass amounts of data eliminates use of the logical address space. The host instead logically addresses each file by a unique fileID (or other unique reference) and offset addresses of units of data (such as bytes) within the file.

This file address is given directly to the memory system controller, which then keeps its own table of where the data of each host file are physically stored. This new interface can be implemented with the same memory system as described above with respect to FIGS. 2-6. The primary difference with what is described above is the manner in which that memory system communicates with a host system.

This file-based interface is illustrated in FIG. 9, which should be compared with the logical address interface of FIG. 7. An identification of each of the Files 1, 2 and 3 and offsets of data within the files of FIG. 9 are passed directly to the memory controller. This logical address information is then translated by a memory controller function 173 into physical addresses of metablocks and metapages of the memory 165.

The file-based interface is also illustrated by FIG. 10, which should be compared with the logical address interface of FIG. 8. The logical address space and host maintained FAT table of FIG. 8 are not present in FIG. 10. Rather, data files generated by the host are identified to the memory system by file number and offsets of data within the file. The memory system then directly maps the files to the physical blocks of the memory cell array.

With reference to FIG. 11, functional layers of an example mass storage system being described herein are illustrated. It is the "Direct File Storage Back End System" that is primarily the subject of this description. This is internal to operation of the memory system, and communicates through a "Direct-File Interface" and a "File-Based Front-End System" with a host system over a file-based interface channel. Each host file is uniquely identified, such as by a file name. Data within a file are identified by an offset address within a linear address space that is unique to the file. There is no need for a logical address space to be defined for the memory system.

Commands

A set of direct file interface commands from the host system supports the operation of the memory system. An example set of such commands is given in FIGS. 12A-12E. These are only briefly summarized here, for reference throughout the remaining portion of this description. FIG. 12A list the host commands used to cause data to be transferred between the host and memory systems, according to a defined protocol. Data within a designated file (<fileID>) at a particular offset (<offset>) within the file is either written to or read from the memory system. Transmission of a Write, Insert or Update command is followed by transmission of data from the host to the memory system, and the memory system responds by writing the data in its memory array. Transmission of a Read command by the host causes the memory system to respond by sending data of the designated file to the host. A data offset need not be sent with the Write command if the memory system maintains a pointer identifying the next storage location where additional data of the file may be stored. However, if a Write command includes an offset address within the file already written, the memory device may interpret that to be a command to update the file data beginning at the offset address, thereby eliminating the need for a separate Update command. For the Read command, a data offset need not be specified by the host if the entire file is to be read. Execution of one of these FIG. 12A data commands is terminated in response to the transmission by the host system of any other command.

Another data command is a Remove command. Unlike the other data commands of FIG. 12A, the Remove command is not followed by the transmission of data. Its effect is to cause the memory system to mark data between the specified offset1 and offset2 as obsolete. These data are then removed during the next data compaction or garbage collection of the file or block in which the obsolete data exits.

FIG. 12B lists host commands that manage files within the memory system. When the host is about to write data of a new file in the memory system, it first issues an Open command and the memory system responds by opening a new file. A number of files that can remain open at one time will usually be specified. When the host closes a file, a Close command tells the memory system that its resources used to maintain the open file can be redirected. The memory system will typically immediately schedule such a file for garbage collection. With the direct file interface being described, garbage collection is logically managed and performed primarily on files, not physically with individual memory cell blocks. The Close_after command gives the memory system advanced notice that a file is about to be closed. The file Delete command causes the memory system to immediately schedule the memory cell blocks containing data from the deleted file to be erased, in accordance with specified priority rules. An Erase command specifies that data of the specified file be immediately erased from the memory.

The primary difference between the Delete and Erase commands is the priority given to erasing the designated file data. The host may use the Erase command to remove secure or sensitive data from the memory at the earliest practical time, while the Delete command causes such data to be erased with a lower priority. Use of the Erase command when powering down the memory system removes sensitive data before the memory device is removed from the host and thus prevents dissemination of that data to other users or host systems during a subsequent use of the memory device. Both of these commands are preferably executed in the background; i.e., without slowing down execution of the primary data commands (FIG. 12A). In any event, receipt of another command from the host will usually cause the memory controller to terminate any background operation.

Host commands that relate to directories within the memory system are listed in FIG. 12C. Each directory command includes an identification (<directoryID>) of the directory to which the command pertains. Although the memory system controller maintains the directories, commands with respect to the directories and designations of the directories are provided by the host system. The memory controller executes these commands, with the host supplied directory designations, pursuant to the firmware stored in the memory system.

The <fileID> parameter can be either a full pathname for the file, or some shorthand identifier for the file, referenced herein as a file_handle. A file pathname is provided to the Direct-File Interface of FIG. 11 in association with certain commands. This allows a fully explicit entry to be created in the file directory when a file is opened for the first time, and allows the correct existing entry in the file directory to be accessed when an existing file is opened. The file pathname syntax may conform to the standard used by the DOS file system. The pathname describes a hierarchy of directories and a file within the lowest level of directory. Path segments may be delimited by "\". A path prefixed by "\" is relative to the root directory. A path not prefixed by "\" is relative to the current directory. A segment path of ".." indicates the parent directory of the current directory.

Open files may alternatively be identified by a file_handle parameter, which is assigned by the storage device when the file is first created. The storage device can then communicate the shorthand file designation to the host each time the host opens the file. The host may then use the file_handle with the Write, Insert, Update, Read, Close and Close_after commands of an open file. Access to the file by the host will typically be quicker than if a full pathname is used since the hierarchy of the file directory need not be navigated. When a file is first opened by use of the Open command, the full pathname is usually used since a file_handle has likely not yet been assigned to that file by the memory system. But a file_handle can be used if already available. For the remaining Delete and Erase commands of FIGS. 12A and 12B that utilize a fileID, use of a complete file pathname is preferred as security against an incorrect file_handle being supplied by the host. It is more difficult for the host to inadvertently generate an incorrect pathname that matches one of an existing but unintended file.

The directory commands of FIG. 12C are similarly received by the Direct-File Interface of FIG. 11 with a <directoryID> identification of the directory to which they pertain. A full pathname is the preferred directoryID that is received with a directory command.

The file_handle is a shortform identifier that is returned at the Direct-File Interface to the host by the mass storage device in response to an Open command. It is convenient to define the file_handle as being the pointer to the FIT that exists in the directory entry for the file. This pointer defines the logical FIT block number and logical file number within that block for the file. Using this as a file_handle allows the file FIT entries to be accessed without first having to search for the file in the file directory. For example, if the memory device can have up to 64 FIT blocks, and each FIT block can index up to 64 files, then a file with file_handle 1107 has the pointer to its data group entries in the FIT set to logical file 7 in FIT block 11. This file_handle is generated by the memory system controller when directory and FIT entries for a file are created in response to an Open command and becomes invalid in response to a Close command.

FIG. 12D give host commands that manage the state of the interface between the host and memory systems. The Idle command tells the memory system that it may perform internal operations such as data erasure and garbage collection that have previously been scheduled. In response to receiving the Standby command, the memory system will stop performing background operations such as garbage collection and data erasure. The Shut-down command gives the memory controller advance warning of an impending loss of power, which allows completion of pending memory operations including writing data from volatile controller buffers into non-volatile flash memory.

A Size command, shown in FIG. 12E, will typically be issued by a host before a Write command. The memory system, in response, reports to the host the available capacity for further file data to be written. This may be calculated on the basis of available unprogrammed physical capacity minus physical capacity required to manage storage of the defined file data capacity.

When the host issues a Status command (FIG. 12E), the memory device will respond with its current status. This response may be in the form of a binary word or words with different fields of bits providing the host with various specific items of information about the memory device. For example, one two-bit field can report whether the device is busy, and, if so, provide more than one busy status depending upon what the memory device is busy doing. One busy status can indicate that the memory device is dealing with executing a host write or read command to transfer data, a foreground operation. A second busy status indication can be used to tell the host when the memory system is performing a background housekeeping operation, such as data compaction or garbage collection. The host can decide whether to wait until the end of this second busy before sending another command to the memory device. If another command is sent before the housekeeping operation is completed, the memory device will end the housekeeping operation and execute the command.

The host can use the second device busy in combination with the Idle command to allow housekeeping operations to take place within the memory device. After the host sends a command, or a series of commands, that likely creates the need for the device to do a housekeeping operation, the host can send the Idle command. As described later, the memory device can be programmed to respond to an Idle command by initiating a housekeeping operation and at the same time start the second busy described above. A Delete command, for example, creates the need to perform garbage collection, according to the algorithms described below. An Idle command from the host after having issued a series of Delete commands then allows the device time to perform garbage collection that may be necessary for the memory device to be able to respond to a subsequent host Write command. Otherwise, the garbage collection may need to be performed after receiving the next Write command but before it can be executed, thereby significantly slowing down execution of that command.

Writing Data

When a new data file is programmed into the memory, the data are written into an erased block of memory cells beginning with the first physical location in the block and proceeding through the locations of the block sequentially in order. The data are programmed in the order received from the host, regardless of the order of the offsets of that data within the file. Programming continues until all data of the file have been written into the memory. If the amount of data in the file exceeds the capacity of a single memory block, then, when the first block is full, programming continues in a second erased block. The second memory block is programmed in the same manner as the first, in order from the first location until either all the data of the file are stored or the second block is full. A third or additional blocks may be programmed with any remaining data of the file. Multiple blocks or metablocks storing data of a single file need not be physically or logically contiguous. For ease of explanation, unless otherwise specified, it is intended that the term "block" as used herein refer to either the block unit of erase or a multiple block "metablock," depending upon whether metablocks are being used in a specific system.

Referring to FIG. 13A, the writing of a data file to the memory system is illustrated. A data file 181, in this example, is larger than the storage capacity of one block or metablock 183 of the memory system, which is shown to extend between solid vertical lines. A portion 184 of the data file 181 is therefore also written into a second block 185. These memory cell blocks are shown to be physically contiguous but they need not be. Data from the file 181 are written as they are received streaming from the host until all the data of the file have been written into the memory. In the example of FIG. 13A, the data 181 are the initial data for file, received from the host after a Write command of FIG. 12A.

A preferred way for the memory system to manage and keep track of the stored data is with the use of variable sized data groups. That is, data of a file are stored as a plurality of groups of data that may be chained together in a defined order to form the complete file. Preferably, however, the order of the data groups within the file is maintained by the memory system controller through use of a file index table (FIT). As a stream of data from the host are being written, a new data group is begun whenever there is a discontinuity either in the logical offset addresses of the file data or in the physical space in which the data are being stored. An example of such a physical discontinuity is when data of a file fills one block and begins to be written into another block. This is illustrated in FIG. 13A, wherein a first data group fills the first block 183 the remaining portion 184 of the file is stored in the second block 185 as a second data group. The first data group can be represented by (F0,D0), where F0 is the logical offset of the beginning of the data file and D0 is the physical location within memory where the file begins. The second data group is represented as (F1,D1), where F1 is the logical file offset of data that is stored at the beginning of the second block 185 and D1 is the physical location where that data are stored.

The amount of data being transferred through the host-memory interface may be expressed in terms of a number of bytes of data, a number of sectors of data, or with some other granularity. A host most often defines data of its files with byte granularity but then groups bytes into sectors of 512 bytes each, or into clusters of multiple sectors each, when communicating with a large capacity memory system through a current logical address interface. This is usually done to simplify operation of the memory system. Although the file-based host-memory interface being described herein may use some other unit of data, the original host file byte granularity is generally preferred. That is, data offsets, lengths, and the like, are preferably expressed in terms of byte(s), the smallest reasonable unit of data, rather than by sector(s), cluster(s) or the like. This allows more efficient use of the capacity of the flash memory storage with the techniques described herein.

In common existing logical address interfaces, the host also specifies the length of the data being written. This can also be done with the file-based interface described herein but since it is not necessary for execution of the Write command (FIG. 12A), it is preferred that the host not provide the length of data being written.

The new file written into the memory in the manner illustrated in FIG. 13A is then represented in a FIT as a sequence of index entries (F0,D0); (F1,D1) for the data groups, in that order. That is, whenever the host system wants to access a particular file, the host sends its fileID or other identification to the memory system, which then accesses its FIT to identify the data groups that make up that file. The length <length> of the individual data groups may also be included in their individual entries, for convenience of operation of the memory system. When used, the memory controller calculates and stores the lengths of the data groups.

So long as the host maintains the file of FIG. 13A in an opened state, a physical write pointer P is also preferably maintained to define the location for writing any further data received from the host for that file. Any new data for the file are written at the end of the file in the physical memory regardless of the logical position of the new data within the file. The memory system allows multiple files to remain open at one time, such as 4 or 5 such files, and maintains a write pointer P for each of them. The write pointers for different files point to locations in different memory blocks. If the host system wants to open a new file when the memory system limit of a number of open files already exists, one of the opened files is first closed and the new file is then opened. After a file has been closed, there is no longer any need to maintain the write pointer P for that file.

FIG. 13B illustrates the appending of data by the host to the end of the previously written but still open file of FIG. 13A, also by use of the Write command (FIG. 12A). Data 187 are shown to be added by the host system to the end of the file, which are also written in the second block 185 at the end of the data for that file. The appended data becomes part of the data group (F1,D1), which therefore now contains more data, since there is neither a logical nor a physical address discontinuity between the existing data group 184 and the appended data 189. The full file is thus still represented as a sequence of index entries (F0,D0), (F1,D1) in the FIT. The address of the pointer P is also changed to that of the end of the stored appended data.

An example of the insertion of a block of data 191 into the previously written file of FIG. 13A is shown in FIG. 13C. Although the host is inserting the data 191 into the file, the memory system appends the inserted data at a location 193 at the end of the file data previously written. It is not necessary to rewrite the data of the file in their logical order when data are being inserted into an open file, although this may be done later in the background after the host closes the file. Since the inserted data is stored entirely within the second memory block 185, if forms a single new group (F1,D3). But the making of this insert results in the previous data group (F0, D0) of FIG. 13A being divided into two groups, one (F0,D0) before the insert and one (F2,D1) after the insert. This is because a new data group needs to be formed whenever there is a logical discontinuity of the data, such as occurs at the beginning F1 of the insert and at the end F2 of the insert. The group (F3,D2) is the result of physical address D2 being the beginning of the second block 185. The groups (F1,D3) and (F3,D2) are maintained separate, even though they are stored in the same memory block, because there is a discontinuity in the offsets of the data stored in them. The original file with the insert is then represented in the memory system FIT by data group index entries (F0,D0), (F1,D3), (F2,D1), (F3,D2), in that order. It should be noted from the examples of FIGS. 13A, 13B and 13C, that new data for a new or existing file may be written without making obsolete any data in the memory. That is, execution of the Write and Insert commands (FIG. 12A) do not cause any other data to be rendered invalid or obsolete.

FIG. 13D illustrates another example, wherein a certain portion of the data originally written in the manner shown in FIG. 13A is updated, using the Update command (FIG. 12A). A portion 195 of the data file is shown to be updated. Rather than rewriting the entire file in the memory system with the update, an updated portion 197 of the file is appended to the data previously written. A portion 199 of the data previously written is now obsolete. Although it is usually desirable to consolidated the updated file in order to free up space taken by obsolete data, this is usually not done while the host maintains the file opened but rather may be done in the background after the file is closed. After updating, the file is represented in the memory system FIT by data groups index entries (F0,D0), (F1,D3), (F2,D1), (F3,D2), in that order. The single data group (F0,D0) of FIG. 13A is again divided into pieces in FIG. 13D, one before the updated portion, the updated portion and one after the updated portion.

To further illustrate the use of variable length data groups, a sequence of several write operations involving the same file is shown by FIGS. 14A-14E in order. The original file data W1 is first written into two blocks of the memory system, as shown in FIG. 14A, with use of the Write command (FIG. 12A). The file is then defined by two data groups, the first group starting at the beginning of a physical memory block and the second group being required after a physical memory block boundary. The file of FIG. 14A is then described by the following sequence of index entries for the data groups: (F0, D0), (F1,D1).

In FIG. 14B, the file data written in FIG. 14A are updated by use of the Update command (FIG. 12A), Updated file data U1 are written immediately following the previous group (F1,D1), with the previous version of the updated data becoming obsolete. Previous group (F0,D0) of FIG. 14A is shortened to a revised group (F0,D0) of FIG. 14B, and previous group (F1,D1) is shortened to group (F4,D2). The updated data are written in two groups (F2,D3) and (F3,D4) because they overlap a boundary of memory blocks. Some of the data are stored in a third memory block. The file is now described by the following sequence of index entries for the data groups: (F0,D0), (F2,D3), (F3,D4), (F4,D2).

The file of FIG. 14B is further modified in FIG. 14C by the insertion of new file data I1, using of the Insert command (FIG. 12A). The new data I1 is written into the memory immediately following the previous group (F4,D2) of FIG. 14B, as new groups (F5,D6) and (F6,D7) of FIG. 14C because the inserted data overlap a boundary of memory blocks. A fourth memory block is used. Previous group (F0,D0) of FIG. 14B is split into shortened groups (F0,D0) and (F7,D5) in FIG. 14C, because of the insertion of the new data I1. The file is now described by the following sequence of index entries for the data groups: (F0,D0), (F5,D6), (F6,D7), (F7,D5), (F8, D3), (F9,D4), (F10,D2).

FIG. 14D shows the further modification of the data file of FIG. 14C that appends new data W2 to the end of the file, using the Write command (FIG. 12A). New data W2 are written immediately following the previous group (F10,D2) of FIG. 14C, as new group (F11,D8) of FIG. 14D. The file is now described by the following sequence of index entries for the data groups: (F0,D0), (F5,D6), (F6,D7), (F7,D5), (F8, D3), (F9,D4), (F10,D2), (F11,D8).

A second update to the open file is shown in FIG. 14E, where updated file data U2 are written to the file of FIG. 14D by the host issuing an Update command (FIG. 12A). The updated data U2 are written in FIG. 14E immediately following the previous group (F11,D8) of FIG. 14D, with the previous version of that data becoming obsolete. Previous group (F9,D4) of FIG. 14D is shortened to a revised group (F9,D4) in FIG. 14E, previous group (F10,D2) becomes fully obsolete, and previous group (F11,D8) is shortened to form a new group (F14,D9). The updated data are written in new groups (F12,D10) and (F13,D11) of FIG. 14E, overlapping a block boundary. A fifth block is now needed to store the file. The file is now described by the following sequence of index entries for the data groups: (F0,D0), (F5,D6), (F6,D7), (F7,D5), (F8, D3), (F9,D4), (F12,D10), (F13,D11), (F14,D9).

The offsets of the data of each file are preferably maintained continuous in the correct logical order after the file's creation or modification according to the preceding description. Therefore, as part of executing an Insert command, for example, offsets of the inserted data provided by the host are continuous from the offset immediately preceding the insert and data already in the file after the insert are incremented by an amount of the inserted data. The Update command most commonly results in data within a given address range of an existing file being replaced by a like amount of updated data, so the offsets of other data of the file usually need not be replaced. In place of a separate Update command, data of a file may alternatively be updated by use of the Write command since receipt of data from the host with a range of offsets that already exist in the stored file data can be interpreted by the memory system as an instruction to update the data in that offset range.

It will be noted that all of the data allocation and indexing functions described above and illustrated by FIGS. 13 and 14 are performed by the controller of the memory system. Along with one of the commands Write, Insert or Update of FIG. 12A, the host merely communicates the fileID and offsets of data within the file that are being sent to the memory system. The memory system does the rest.

An advantage of directly writing file data from the host into the flash memory in the manner just described is that the granularity or resolution of the data so stored may be maintained the same as that of the host. If a host application writes file data with a one-byte granularity, for example, that data may be also be written into the flash memory with a one-byte granularity. The amount and location of data within an individual data group is then measured in a number of bytes. That is, the same offset unit of data that is separately addressable within the host application file is also separately addressable within that file when stored in the flash memory. Any boundaries between data groups of the same file within a block are then specified in the index table to the nearest byte or other host offset unit. Similarly, boundaries between data groups of different files within a block are defined in the unit of the host offset.

Although not used to write data, it is relevant to consider use of the Delete command to delete a portion of a file since such an operation is converse of the Insert command. The Delete command can be applied to a range of file offset addresses, with the following format: Delete <fileID><offset><length>. Data within the portion of the file beginning with the <offset> and continuing from that address for the <length> of the deletion are deleted. Offset addresses of the remaining data of the file after the deletion are then decremented by the host in order to maintain contiguous offset addresses throughout the file. This is the converse of the Insert command, where the host adds data to the middle of a file and then increments the offsets of the remaining file data after the insert so that the offsets of the modified file are continuous.

Garbage Collection

It will be noted from FIGS. 14B and 14E that the Update command results in the physical space necessary to store the file being greater than the amount of data in the file. This is because data that have been replaced by the updates remain stored in the memory. It is therefore highly desirable to consolidate (garbage collect) the data of the file into less physical storage space by eliminating the obsolete, invalid data. More storage space therefore becomes available for other data.

It may also be noted that in addition to the file data updates of FIGS. 14B and 14E, the data insert of FIG. 14C results in the file data being stored out of order. That is, updates and inserts are added to the end of the file stored in memory at the time they are made, while they are nearly always logically positioned somewhere within the file. This is the case of the examples of FIGS. 14B, 14C and 14E. It can therefore be desirable to reorder the data of the file stored in the memory to match the order of the offsets within the file. This then improves the speed of reading the stored data since reading the pages and blocks in sequence will give the data of the file in their offset order. This also provides the maximum possible defragmentaion of the file. But reordering the file data to make reading more efficient is not as important to the performance of the memory system as is file data consolidation, which potentially frees up one or more memory blocks for use to store other data. Reordering of the data in a file will therefore usually not be done by itself, where the benefit is not worth the added operating overhead, but can be done as part of many garbage collection operations with little or no added operating overhead.

The file of FIG. 14E includes obsolete data groups (gray portions) stored in the memory because of the two data updates U1 and U2 having been made. The amount of memory capacity being used to store the file is, as a result, substantially greater than the size of the file, as is apparent from FIG. 14E. Garbage collection is therefore appropriate.

FIG. 15 provides an illustration of the result of garbage collecting the data file of FIG. 14E. That file, before garbage collection, takes up nearly five blocks of storage capacity (FIG. 14E), while the same file after garbage collection fits within slightly more than three memory cell blocks (FIG. 15). As part of the garbage collection operation, data are copied from the blocks where they are initially written into other erased blocks, and the original blocks then erased. If an entire file is data collected, its data may be copied into the new blocks with a physical order that is the same as the data logical offset order within the file. The updates U1 and U2, and the insert 11, for example, are stored after garbage collection (FIG. 15) in the same order as they appear in the host file.

Garbage collection also normally results in the formation of new and different data groups within the file being consolidated. In the case of FIG. 15, the file is described by the following new sequence of index entries for the new data groups: (F0,D0), (F1,D1), (F2,D2), (F3,D3). This is a far fewer number of data groups than exist with the state of the file shown in FIG. 14E. There is now one data group for each of the memory cell blocks into which data of the file have been copied. As part of the garbage collection operation, the file index table (FIT) is updated to reflect the new data groups forming the file.

When a file is a candidate for garbage collection, the FIT data group entries for that file are examined to determine whether the file meets set criteria for garbage collection. Garbage collection will proceed when any of the memory cell blocks containing data of the file also contain obsolete data. If not, garbage collection is not necessary. That the file of FIG. 14E contains obsolete data is apparent from the sequence of data group index entries given above. For example, it can be seen from the two successive data groups (F7,D5) and (F8, D3) that obsolete data exist in the first two blocks where the file data are stored. The difference in physical address locations D5 and D3 is much greater that the difference in the logical offsets F7 and F8. It is also apparent from the file index data group entries that the data have not been stored in the logical offset order. Alternatively, the individual FIT entries for a file may retain records of obsolete data groups of that file that are referenced as obsolete. The controller then simply scans the FIT entries for each file to identify any obsolete data groups and the physical blocks in which they are stored.

Garbage collection should usually not be performed on an opened file since the host can continue to make updates or inserts to the file that generate further obsolete data and/or store the data out of logical offset order. Many such garbage collection operations could then result. But in the case where the number of erased pool blocks falls below a set level, garbage collection of open files may be necessary to provide enough erased blocks for storing new data or other operations.

The closing of a file by the host normally causes garbage collection to be considered for that file. Garbage collection is preferably not performed immediately after a file is closed but rather a closed file is scheduled by the memory controller for garbage collection in the background when it will not interfere with current memory operations. A garbage collection queue may be kept, where a file is added to the queue after closure and then, when there are no other memory system operations of higher priority to be carried out, the file that has been in the queue the longest is selected by the memory controller and garbage collected if that is needed. Such a selection and garbage collection operation can be made, for example, in response to receipt from the host of an Idle command (FIG. 12D).

Since copying data is the most time consuming part of garbage collection, particularly for large files, the task may be divided into components by copying only a portion of the data of a file at any one time in short bursts. Such partial file copying can then be interleaved with other memory operations, and even take place while the host is transferring data to or from the memory system. The length of the individual copy data bursts can also be increased in response to the number of erased blocks falling below some designated number.

The goal is to perform garbage collection totally in the background without interfering with or slowing down the primary operations of transferring data with the host system. But this is not always possible, particularly if the number of erased blocks that are available in the erased block pool for programming new data becomes less than some preset minimum. Garbage collection is then made a priority and any files in the queue may be garbage collected in the foreground as a priority in order to consolidate data so that additional erased blocks are made available for receiving new data from the host system. If there are no files in the queue, then open files may have to be garbage collected. When garbage collection becomes a priority, the host will usually receive a busy status signal from the memory system and will therefore suspend any programming of new data until an adequate number of erased blocks again exist. On the other hand, if there are a sufficient number or more of erased pool blocks, then the frequency of garbage collection operations may be reduced, and garbage collection that could affect performance of the memory system postponed.

It will be noted that garbage collection is performed on host data files. Garbage collection is initiated on a file in response to the state of the file. When initiated, the index entries of all the data groups of the file in the FIT are examined as part of the process. When a file is garbage collected, its data are copied one data group at a time from their existing block to a newly opened copy block, in the order specified in the data group index entries for the file. This is in contrast to existing flash memory garbage collection, which is based entirely on the status of individual memory cell blocks.

However, it a general rule that only the individual blocks storing data of the file that also contains obsolete data will be garbage collected. So not all blocks storing data of a file will be garbage collected. If a file is stored in only two blocks, for instance, and the first block contains obsolete data and the second block does not, then the first block will be garbage collected while data of the second block are left alone. Valid data are copied from the first block into an erased copy block, and the copy block will then have some erased pages or other capacity left over that is in about the amount of the obsolete data. Use of erased storage capacity less than one block is described below. In the example of FIG. 14E, the memory space before garbage collection has obsolete data (gray areas) in each of four of the five blocks containing data of the file.

As a modification of the general rule that only those blocks containing obsolete data are garbage collected, once it is determined that a given file is to be garbage collected, any data of the file in a partially filed block is included in the garbage collection operation. Therefore the U2 data in the fifth bock of FIG. 14E is included in the garbage collection operation even though there are no obsolete data in that block. The data in all five blocks are consolidated together by being copied into four erased blocks since by not including data of the fifth block, two of the resulting four copy blocks would be only partially filled with data. In the case of FIG. 15, only one copy block remains partially filled. Memory performance is improved by having fewer partially used blocks.

Certain file commands of FIG. 12B issued by the host system may initiate garbage collection. Receipt of the Close command for a file has already been described. The closed file is placed in the queue to be garbage collected. The Delete and Erase commands may also result in garbage collection. The deletion of a file can cause blocks containing the obsolete file data to be placed in the queue for garbage collection. The effect of garbage collecting a deleted file is that there is no valid data of the deleted file, so data copying to other blocks does not take place. All the blocks containing only data of the deleted file are simply erased as part of the garbage collection process. The Erase command has a similar effect except that the garbage collection of blocks containing only obsolete data of the erased file may occur immediately or on a priority basis such as by placing the blocks at the head of the garbage collection queue.

A significant advantage of the direct file storage system being discussed is that the memory learns immediately when the host deletes a file because the command to do so goes directly to the memory system. The memory controller can then erase the blocks storing data of the deleted file as soon as it can be done without adversely affecting other operations of the memory. The erased blocks are then made available for the storage of new data.

In the implementation being described, either of the commands to Delete or Erase a file causes data of that file to be erased as a direct response. In a typical logical based interface, on the other hand, such a command does not reach the memory controller directly. Rather, the host merely frees up certain segments of the memory logical address space that were occupied by the deleted or erased file. Only when the host later writes data to one or more of those same logical addresses does the memory system know that the data at the reused logical address segments have been obsolete. The memory still does not know that data of other logical address segments occupied by the file have been deleted or erased. The memory only knows when the host writes data to those other logical addresses that the data formerly written to those logical segments have been obsoleted.

Common Blocks

A result of filling successive blocks with data for a single file is that when the file is closed and garbage collected, some of the file data may occupy only a portion of a memory cell block. Further, data of a small file may not even fill an entire block. This would result in a considerable amount of the space of individual blocks going unused if only data of one file could be stored in a block. Pages of storage capacity within individual blocks would remain erased and available to store data but would not be utilized.

Therefore, some memory cell blocks desirably store smaller amounts of data from each of two or more files, either entire small files and/or residual file data left over after other blocks have been filled. Residual file data are data of a closed file that do not occupy a full block, and may include one or more data groups. A file map can keep track of data groups of more than one file in a single memory cell block in the same manner as if all the data groups in the block are all of one file. The map of the individual data groups includes the fileID of which the data group is a part. A primary purpose of using common blocks is to minimize unused physical memory storage capacity that can result from writing data of files into the memory as described above. Most commonly, residual data of one or more data groups resulting from the garbage collection of a file will be written into a common block as part of the garbage collection. An example is the garbage collected file of FIG. 15, where the last data group (F3,D3) occupies only a small portion the last block. If it remained that way, most of that last block would go unused. The data group (F3,D3) of FIG. 15 can be written into a common block containing one or more data groups from another one or more files, or that last memory block may be designated as a common block. In the later case, data groups from one or more other files would then subsequently be written into that same block.

Alternatively, residual file data may be written directly from the host to a common block during garbage collection when the amount of residual data is known to be an amount that will fit into erased space within one of the designated common blocks. The Close_after command (FIG. 12B) can be used to identify residual file data and allow it to be written to an open common block that has enough space to store the amount of data specified as part of the command, rather than writing the residual file data into an erase pool block that will not be completely filled. This may eliminate the need to copy the residual data during a subsequent garbage collection operation.

When a new data file is programmed into the memory, the data may be written into an open common block containing residual data for one or more other files, beginning at the first available physical location in the block and proceeding through the locations of the block sequentially in order, as an alternative to the method for writing data described previously and illustrated in FIG. 13A. If the host sends an Open command for a file, followed immediately by a Close_after command before sending data for the file, it can be determined that the full data for the file may fit within an open common block and that the file will be closed before the end of the open common block is reached. Data for a new file may also be written into an open common block even if the length of file data is unknown.

Therefore, a number of common blocks are desirably maintained in the memory system for storing common data groups of two or more different files. A common data group may have a size up to that of the storage capacity of a block, with a granularity of one byte. Only one of the common blocks preferably contains data of a given file but may contain more than one data group of the file. Also, a common data group is preferably stored in only one common block, and not divided for storage in multiple common blocks. This avoids garbage collection in multiple common blocks when the data group becomes obsolete. A common block is subject to garbage collection when a data group therein becomes obsolete. Any remaining valid data group(s) in such a common block are written into available erased space in another common block or to an erased pool block, and the common block is then erased. If the common block being garbage collected contains two or more valid data groups from different files, they need not be kept together but rather can be copied to different blocks.

An example of a common block is shown in FIG. 16, having been programmed with a common data group from each of three different data files. Because writing data is constrained in popular NAND arrays to progress from the pages at one end of the block to the other, the data groups are stored contiguously with each other. The white space at the end of the block indicates the pages of the block that have had no data written into them. It is difficult to perfectly fit available data groups into the entire common block.

The number of blocks designated by the memory system as open common blocks to which residual data of more than one file may be written will normally be just a few but may become many if a large number of files that are garbage collected have residual file data that does not fit the available space in any existing open common block. Residual file data are written into one of the open common blocks that best utilizes the overall memory capacity. When there is not enough erased space in any of the open common blocks, one of the existing common blocks is closed and another common block is opened in its place. Alternatively, an existing open common block need not be closed, and the number of open common blocks may be allowed to increase. The new common block may designated as one of the erased pool blocks but is preferably an incompletely written block that already contains some residual file data, when available, such as the last block in FIG. 15 that contains only the residual file data group (F3,D3). For the garbage collection of a common block, however, an erased pool block is preferably designated as a new common block when necessary.

FIG. 17 illustrates an example process of writing residual file data in a case where there are five residual or common units (each a different a block or metablock) that already contain one or more data groups of residual data from another file. The last data group (F3,D3) resulting from the garbage collected file of FIG. 15 is an example of such residual file data, although it could include more than one data group from a single file. There are three possibilities shown. The first possibility (A) writes the residual data to residual unit 2 because it has the most erased space available. The second possibility (B) chooses residual unit 5 for the residual file data because that is the best fit among the five residual units. The residual file data nearly fills the unit 5 and thereby leaves the larger space available in unit 2 for receiving a larger amount of data in the future. There is not enough space in any of the units 1, 3 or 4 to take the residual data so these units are ruled out right away.

The third possibility (C) writes the residual file data into a block or metablock unit from the erase pool. Once the residual file data have been written into the completely erased unit, then it becomes a residual unit, and can later be opened by the memory system controller as a common block. In the example shown, possibility (C) would not normally be used since there is room in either of the residual units 2 or 5 for the residual file data.

Alternatively, residual data for a file may be allowed to split into two or more parts for storage in different common blocks. For example, no existing open common block may have sufficient available space for storage of residual data for a specific file and no erased block may be available to be opened as a new common block for the residual file data. In this case, the residual file data may be split between two or more open common blocks.

A common block can be closed before it is full of data. As mentioned above, an open common block with the least amount of erased space available will generally be closed when it is necessary to open another common block in order to store a given amount of residual data of a file. This is in part a consequence of the preferred operation where residual data for a file are not split for storage in different common blocks. When the memory system reports the amount of available memory storage space for new data to the host by responding to the host's Size command (FIG. 12E), these small amounts of unused capacity in closed common blocks are not included since they are not immediately useable.

Because residual file data become obsolete due to the files of which they are a part being deleted or erased, data within the common blocks are also consolidated. For example, whenever residual file data within a common block is designated as obsolete, for whatever reason, that block is added to either the obsolete file data block queue discussed above or another queue. If the data become obsolete because of a host Delete command for its file, then the common block is placed at the end of the queue. But if it results from an Erase command, the common block goes to the head of the queue or otherwise is given priority for garbage collection.

Instead of a single queue, there may be the five different garbage collection queues maintained by the controller during operation of the memory system, entries in the first two queues being given priority:

(1) a priority queue of obsolete blocks, namely those blocks containing only obsolete data as the result an Erase command (FIG. 12B) for a file;

(2) a priority queue of common blocks that contain data rendered obsolete by an Erase command for a file but that also contain some valid data;

(3) a queue of obsolete blocks (blocks containing only obsolete data) that result from execution of the Update or Delete commands (FIGS. 12A and 12B) or because all their valid data have been copied to another block during garbage collection;

(4) a queue of common blocks containing some obsolete data but which also contain valid data, in response to the Delete command or the discovery during garbage collection that obsolete data exist in a common block; and (5) a queue of files for which either the Close or the Close_after commands have been received.

These five queues may be given priority in the order listed above, all the items in queue (1) being garbage collected before those of queue (2), and so on. The blocks are listed in the priority queues (1) and (2) because all or some, respectively, of their data have been rendered obsolete by the Erase command rather than by the Delete command. Blocks and files are added to each of the queues in the order identified during operation of the memory system, the oldest in each queue being garbage collected first (first-in-first-out, or FIFO). These five queues are illustrated in FIG. 34.

The priority of items listed in the queues (4) and (5) are about the same, so could be reversed. Alternatively, there can be a more complicated priority system where files and common blocks are selected from the queues (4) and (5) according to a set criteria, perhaps even before one or more of the higher priority queues are empty. There are two goals of managing the garbage collection of common blocks. One is to minimize disruption to normal operation of the memory system that can result from garbage collection of a common block when a data group within the common block becomes obsolete. The other is to minimize indexing updates when a data group from a common block is relocated during garbage collection of the block.

During garbage collection of a common block, all common groups of valid data remaining in the block are copied one at a time to one of the common blocks that have the space. If there is no room in an opened common block for a common group being copied, the common group is written into a block from the erase pool and this block may then be designated as a common block. One of the opened common blocks is then typically closed as part of the process. As with all garbage collection operations, the file index table (FIT) is updated to reflect the new storage locations of the copied data groups.

The garbage collection queues should be recorded in the non-volatile memory. A read-modify-write operation on a page or metapage containing queue information should be performed to add or to remove an entry. Pages containing garbage collection queue information may be in a dedicated block or metablock, or may share a block or metablock with other types of pages, such as a swap block.

Buffering and Use of Metapages During Programming

The foregoing describes operation of a memory system without particular regard to whether the memory cell blocks are linked together as metablocks or not. The file-based interface between the host and memory system, and the related memory system operation described above, work in a memory system using metablocks as well as in one that does not. The trend is definitely to increase the amount of data that are written and read at one time (degree of parallelism) since this directly improves memory performance. The effective width of the individual memory cell blocks in terms of a number of data bits is increased by the use of metablocks formed of two or more such blocks.

Referring to FIG. 3, for example, all of the memory cells along each of the word lines within a single block can be programmed and read together as a page, potentially storing several one, two, four or more sectors of 512 bytes of user data in each row. And when two or more blocks are logically linked into a metablock, all of the memory cells in one row of each of the two or more blocks can be programmed and read together. The two or more pages from two or more blocks that are programmed and read together form a metapage. With the ability to program that much data at one time, some staging of data within a metapage can be helpful to fully utilize this available parallelism.

One metapage of data for each of three host files are illustrated in FIG. 18, each metapage being shown to include only two pages for simplicity. The data of each page of a metapage are programmed into a different block of a metablock.

For host file 1, the metapage is shown in FIG. 18A to be filled with data having contiguous offsets (logical addresses), as a part of a single data group 0. These data are programmed in parallel into a metapage next in order within a metablock receiving data for file 1. In FIG. 18B, host file 2 of this example is shown to be different in that a portion of its first page includes part of data group 1 with continuous offsets and the remainder of the metapage contains part of another data group 2 having continuous offsets. Although there can be a discontinuity in the offsets of the data where the two data groups join within the file 2 metapage, these data are programmed together in a single metapage. As previously described, the direct file storage interface writes data of a host file as it is received from the host, regardless of the order of the offsets of the data within the file.

Some flash memories do not allow the programming of data into an erased page more than once. In this case, both of the data groups 1 and 2 of FIG. 18B are programmed at the same time. But if the memory allows partial page programming, the two data groups of file 2 can be programmed into a single metapage of the non-volatile memory at different times. In this case, page 0 would be programmed at different times, first with data group 1 and then when data group 2 is programmed into the remainder of page 0 and into all of page 1. However, it is normally preferred to program both data groups in parallel, in order to increase system performance.

In FIG. 18C, the end of a single data group 3 is shown to have been written into a metapage for file 3. There are certain conditions when such a small amount of data are programmed into a metapage of the non-volatile memory while the remaining portions of that metapage remain erased. One is when the host issues a Close command (FIG. 12B) for the file of which data group 3 is the residual file data. File 3 could also be closed by the memory controller if the host seeks to open a number of files in excess of the permitted number and file 3 is chosen for closure in order to allow another more active file to be opened instead. The memory controller could also close file 3 if there is insufficient capacity in the buffer memory for all the file metapage buffers that have been opened. In any of these cases, it is desirable to write the partial data contents of a file buffer to the non-volatile memory right away ("flush" the file buffer). The host can also send a Shut-down command (FIG. 12D), which means that power could be lost to the memory and all data within its volatile buffer memory lost if not programmed into the non-volatile memory right away.

If it is later desired to write the beginning of another data group 4 of file 3 to the memory metapage of FIG. 18C and the memory does not allow partial page programming, the first page of data group 4 is written into the second page of the file 3 metapage, as shown in FIG. 18D. This can result in some unused memory capacity, as indicated by the blank portion between the data groups 3 and 4 of FIG. 18D, within the non-volatile memory metapage. This unused capacity may be recovered by a garbage collection operation performed after file 3 is closed, or may be allowed to persist since this situation is likely to occur infrequently.

It is significant to note that the direct file storage technique of the present invention can tolerate such unfilled gaps within blocks of the non-volatile memory. Such gaps cannot easily be tolerated by current systems, where the memory system interfaces with the host through a logical address space, as illustrated by FIGS. 7 and 8. Logical data groups the same size as the memory blocks or metablocks are mapped into such blocks or metablocks. If a gap were to be present in the data stored within a block or metablock of an existing memory system, logical data addresses that are mapped into the gap would effectively be unusable by the host. The host assumes in such an existing interface that it has the entire logical address space available to it but it is very difficult, if even possible, for new data to be written at logical addresses that designate the gap.

A portion of the buffer memory in the system controller, such as memory 31 of FIG. 2, is typically utilized as programming data buffers. Buffer capacity in this memory should exist for each active file being written by the host. Each such "file buffer" should have capacity equal to at least one metapage in flash memory. An active file is an open file to which data has been recently written by the host.

The number of active host files with which the memory system deals at any one time may be equal to the number of currently open memory system files, or may be a lesser number. If the allowed maximum number of active files is less than the allowed maximum number of open files, provision must be made for changing the status of a file between active and open and vice versa. To allow this, a temporary storage block in flash memory is designated as a swap block, and data that are less than one metapage in length may be written from a file buffer to a metapage in the swap buffer, and vice versa. An index of valid swapped file buffers is maintained in the swap block. File buffer data are copied to the swap block as an integral number of pages, followed by a single page providing an index of the length and location of each copied file buffer, and the file to which it relates. The swap block is periodically compacted and written to an erased block when it becomes full.

When an open file A must be made active as a result of a host write operation to it, for example, the least recently written active file B is identified, and its file buffer data copied from the controller buffer memory to the next available pages in the swap block. The file buffer data for file A is then identified in the swap block, and are copied to the available space in the controller buffer memory previously allocated to file B.

Data from a file buffer are preferably written to the next available metapage in the open write block for that file in flash memory according to one of the cases shown in FIG. 18. In FIG. 18A, when sufficient data forming part of a single data group 0 within file 1 is present in the file 1 buffer, it is programmed to a full metapage in a single operation. In FIG.

18B, when sufficient data forming the end of data group 1 and the start of data group 2 within file 2 is present in the file 2 buffer, they are programmed to a full metapage in a single operation. If the flash memory device supports multiple programming operations on a single page (partial page programming), when sufficient data forming the end of data group 1 within file 2 is present in the file 2 buffer, they may be programmed to part of page 0. When sufficient data forming the start of data group 2 within file 2 becomes available in the file 2 buffer, they may be subsequently programmed to the remainder of the same metapage in a separate programming operation.

As shown in FIG. 18C, when data forming the end of data group 3 within file 3 are present in the file 3 buffer, and a buffer flush operation must be performed, they are programmed to part of page 0. If the flash memory device does not support multiple programming operations on a single page (partial page programming), when sufficient data forming the start of data group 4 within file 3 becomes available in the file 3 buffer, it is subsequently programmed to page 1 in the same metapage in a separate programming operation.

The metapage file buffers are also used during garbage collection. Valid data groups of a file can be read from the non-volatile memory and written into the controller buffer metapage for that file. If the file is being reordered at the same time, the data groups are written into the buffer in the order of their host data offsets. The data in each data group, of course, has contiguous logical offsets. Once the metapage buffer is full, its data are programmed in parallel into a new block of the non-volatile memory.

File Indexing

Each file stored in the memory system is defined by its own sequence of index entries, as described above, particularly with respect to FIGS. 13-16. These entries change over time as data for a file are appended, inserted or updated therein, and when the file is subjected to garbage collection. FIG. 19 illustrates a sequence of index entries in a file index table (FIT) for one file at each of several different times 0, 2, 4 and 5. These are the sequences described above with respect to FIGS. 14A, 14C, 14E and 15, respectively. Data in the FIT are preferably written and kept current by the memory controller without assistance from the host system. The host system supplies the pathnames, the filenames and the offsets of data within the file when writing the data to the memory system but the host does not participate in defining the data groups or where they are stored in the memory cell array. In the entries of FIG. 19, the memory cell blocks of FIGS. 14 and 15 are numbered from the left beginning with 1. So for the file in the state illustrated in FIG. 14C, for example, its third data group (F6,D7) is noted in FIG. 19 to be stored in block 004, the fourth block from the left, D7 bytes from that block's initial address. The length of each data group is also preferably included with each entry of the table.

The sequence index entries shown in FIG. 19 for one file are rewritten by the memory controller when a change to the file results in a modification to the data groups of the file, or at other less frequent intervals. The controller can store such changes in its memory, and then write many of them to the flash memory at one time. Only one valid set of indices exists for a file at any one time; four such sets of indices being shown in FIG. 19 that define the file at different times. The memory system controller then uses the current set of indices of the file as necessary to program additional data to the file, read data from the file, garbage collect data of the file, and potentially for other operations. The FIT is therefore easier to use if the individual file index entries are stored in order of their file offsets (Fx) but, if not, the controller can certainly read the entries in that logical order. The most common cause of the memory controller reading the index entries for a particular file is in the course of executing a host command.

FIG. 20 shows a preferred technique of maintaining and using the file index table (FIT) as part of a file map. A chain of file indexing structures is used to identify the physical location of data with a specified offset address within a file with a specified pathname. The file map includes a directory 201 that has a logical structure substantially the same as the standard disk-operating-system (DOS) root directory and sub-directory structures used with a conventional logical address interface. The file directory 201 may be stored in one or more dedicated flash blocks within the memory system. But the file directory 201 is preferably managed by the storage system instead of the host. The host directory commands of FIG. 12C herein are executed by the memory system controller but at a time and in a manner decided by the controller. The host is preferably not allowed to write directly to the file directory.

Uniformly sized entries, each identifying either a directory or a file, are kept in the file directory 201. A set of contiguous entries is used to specify the elements within a specific directory. A pointer field in an entry specifying a directory identifies the start of other contiguous entries specifying the elements within that directory. A pointer field in an entry specifying a file defines a block number and file number within an associated file index table (FIT) 203.

The FIT 203 contains uniformly sized entries of the data groups, each entry identifying the offset of the start of the data group and the physical location within the memory system of the data group. If the logical addresses are maintained with byte granularity, then the offset of each FIT entry contains a specified number of bytes from the beginning of the file that designates the start of the data group. Similarly, the physical location of the beginning of the data group may be specified with a byte granularity. The contents of FIT entries for an exemplary file at different times were described above with respect to FIG. 19. A separate entry is maintained for each data group. Each file is defined by a set of contiguous index entries of the data groups within the file. The number of such entries per file will usually vary.

The pathname supplied by the host for a file is used to traverse the hierarchy of the file directory to obtain the block number and file number within the FIT. The pathname normally includes one, two or more directories and sub-directories. These are used to access the directory within the file directory 201 that contains a file for which access is sought. The filenames within that directory are then searched to find an entry 205 for the filename supplied by the host. When found, the entry 205 provides a pointer to a group of contiguous entries in the FIT 203 for that file. These entries are in the nature of those described with respect to FIG. 19. The offsets of these entries are then compared with the offset address supplied by the host in order to identify a correct entry 207, and thus the correct data group. If there is no identical match of offsets, which may often be the case since the offsets included in the entries are only the beginning addresses of the data groups, the entry is selected that identifies a data group that contains the offset within it. The selected entry 207 of the FIT 203, in this example, contains the physical block and byte of the memory location containing data to which access is being sought by the host.

The pointer of the directory entry 205 of FIG. 20 for a file is assigned by the memory system controller when the file is first created or when the location of the data group entries for the file in the FIT 203 are changed. This pointer is an example of the file_handle discussed earlier. In order to avoid the host having to go through the hierarchy of the file directory 201 in order to find the FIT entries for a file each time it is accessed, the memory system may send the file_handle to the host so that it may thereafter directly access the FIT entries of opened files.

FIG. 21 illustrates pages within the memory system that store the individual entries in the file directory 201. Some of the entries provide pointers to directories within the file directory 201 and others to data within the FIT 203. An example entry 209, one of many stored in a single memory page, illustrates that each entry has four fields. The first contains the name of a directory or file, assigned by the host. The second field contains the attributes of the directory or file, defined by the host. A pointer in the third field, in the case of an entry for a directory, points to another entry in the file directory. In the case of an entry for a file, the third field contains a pointer to a file entry in the FIT 203, such as the entry 207. A fourth field, identified as "Data Groups," is empty in an entry for a directory but, in the case of an entry for a file, this field specifies the number of data groups containing data for the file and thus the number of entries in the FIT 203 for the file.

It will be noted that the file directory pages illustrated in FIG. 21 contain two sections. In a most recently written page 211, directory entries (one indicated at 209 in the page 213) and page pointers both exist. In other directory pages, such as a page 213, directory entries exist but a region of the page contains obsolete page pointers. Current page pointers are maintained in the same portion of the most recently written page, in this case the page 211. One page pointer exists for each logical page in the directory block, and directs the memory controller to the physical page corresponding to the logical page it is accessing. By maintaining the page pointers in the most recently written directory page, they are updated at the same time as the directory entry and without a need to then update another page. This technique is described in more detail for a logical address type of file system in U.S. patent application Ser. No. 10/917,725, filed by Gorobets et al. on Aug. 13, 2004.

In a specific implementation, the directory block contains a fixed number of logical pages, which is a designated fraction (e.g. 50%) of the total pages in a memory cell block. A directory block is preferably a metablock dedicated to storage of directory pages but may be a single erase block. It may have the same parallelism as metablocks used for storage of data groups, or it may have a reduced parallelism. When a file directory block becomes full, it is compacted by copying the valid version of each logical page to a new block, before erasing the original block. Immediately after a directory block has been compacted, only a defined fraction (such as 50%) of the pages in the new copy block are written with directory entries. The remaining pages are in the erased state to allow updated or new entries to be written.

When an entry for a directory or file is created, modified, or deleted, the set of entries for the directory containing that directory or file are rewritten in the next available erased page in the directory block, thus keeping entries for a directory contiguous. This is done by a read/modify/write operation on the page previously containing entries for that directory. The previous page then becomes obsolete. The page pointer entry for that logical page is also updated to identify its new physical page. This can be done in the same page programming operation as is used to write the entries for the directory.

If the creation of an entry would cause the set of entries for a directory to overflow a page, it may instead be written as the first entry in another page. The existing page may also be rewritten to move the set of entries for the directory to the end of the page, if necessary. The logical page numbers within the directory block may be reassigned in the page pointers to keep entries for the directory contiguous.

The file index table (FIT) 203 of FIG. 20 stores indices to the data groups making up all files in the device. The FIT is stored in one or more dedicated FIT blocks of the memory system. Each FIT block may store indices for up to a maximum number of files. The FIT is accessed by means of a logical pointer from the file directory, specifying one of the files indexed by the table. The pointer uses indirect addressing by accessing file pointers provided as part of a most recently written FIT page 217, so that it does not change as indices are updated and rewritten within a FIT block.

The FIT pointer of the file entries in the file directory 201, such as entry 205, has two primary fields. The first is a FIT block number, identifying one of the logical FIT blocks that makes up the FIT. The actual physical block address allocated to a FIT block number is separately managed. The second field of the FIT pointer is a FIT file number, identifying a logical file number within the identified FIT block. The logical file number is translated to a physical file entry location by a specific file pointer stored within the most recently written page of the FIT block.

The FIT does not have a predefined size, and the number of FIT blocks is a function of the number of files and the number of data groups into which the data is organized. New FIT blocks will be created and FIT blocks eliminated during operation of the device.

With reference to FIG. 22, the individual FIT pages have a number of data group entries, one entry 219 for each data group, as previously described with respect to FIG. 19. In this specific example, each entry 219 contains four fields. The file offset field specifies the offset address within the file of the start of the data group being identified by the entry. The block address field specifies the physical address of the block or metablock within the memory system that contains the data group. The byte address field specifies the address of the page within the block or metablock, and the byte within the page, at which the data group starts. The fourth field is the length of the data group. The data group length may not be necessary in all cases since the length of a data group can be calculated from data of adjacent entries. By maintaining the length, however, it is not necessary to make this calculation each time the length of a data group is desired. This is particularly valuable information if the data group entries are not written in the FIT in the order of their logical addresses, where the calculation then becomes more difficult.

A host file is preferably defined by a set of contiguous data group entries that together define the ordered data groups that form the file. The shaded contiguous group entries shown in the page 215 of FIG. 22 define one file, and those in the page 217 another file. For each of the individual files in the FIT, there is one file pointer 221 in the last written FIT page 217 for the individual files maintained in that block. The file pointer 221 defines the start of the file entry for a file with a specific FIT file number within the FIT block. It contains two fields. One field is the physical number of the page where the data group index entries reside, and the other field is the number of the first group entry within that page. A file pointer exists for each possible file number in the FIT block, i.e. the number of file pointers is equal to the maximum number of files in a FIT block. A reserved code (not shown) in a file pointer entry indicates that the specific file number is unused in the FIT block. Although file pointers may exist in other FIT pages, they are valid only in the most recently written page of the FIT block.

A FIT block is preferably a metablock dedicated to storage of FIT pages. It may have the same parallelism as metablocks used for storage of data groups, or it may have a reduced parallelism. A single erase block may be used instead. Immediately after a FIT block has been compacted, only a defined fraction (such as 50%) of the pages in the block should contain entries. The remaining pages should be in the erased state to allow updated or new entries to be written. More than one FIT block may be necessary when a large number of files are being maintained.

The FIT is updated by writing the data group entries of one or more complete files in the next available unprogrammed page of the FIT block. The file pointer entries for the files are also updated to identify the new locations of the file entries. Both file data group entries and the file pointers are written in the same page program operation. The previous location of the file entry then becomes obsolete in the FIT block. Alternatively, a file entry may be updated by writing it in a different FIT block or a new FIT block. In this case, the file pointer in both blocks should be updated, and the logical pointer for the file in the file directory should be modified.

When a FIT block is full, valid group entries are copied in a compacted form to a new erased block and the previous FIT block is erased. The logical FIT block number and the logical file numbers are not changed by this operation. The number of data group entries should be restricted such that only a defined fraction (such as fifty percent) of the pages are programmed in the compacted FIT block. File entries should be moved to other FIT blocks, if necessary, and their logical pointers in the file directory modified.

It is desirable to keep all the FIT entries of an individual file in one page or metapage. This makes it relatively easy to read all the entries for a file. Although the FIT entries of a file could be chained together by including in each the physical address of the next, this would likely require reading more than one FIT page or metapage. It is also desirable to keep the FIT entries contiguous within the page. This can result in frequently writing new pages as the number of FIT entries increases, particularly when a closed file is opened and data groups are added to it. As new FIT entries are written into a new page, the existing entries are copied from another page and written along with the new entries in the new page. The space taken by the obsolete data in the prior page of the existing entries is retrieved for use when the FIT block is compacted.

The individual data groups, as discussed above, are contained within a single block or metablock, may start on any byte boundary within the block, and may have a length of any integral number of bytes. A header may be added to each data group by the controller as it is written into the memory. Such a header may include two fields. A first field contains a code to identify the start of a data group. This code may be the same for all data groups and is chosen as a bit pattern that infrequently exists in the data stored as part of the groups but it is not necessarily that the code never appear in such data. The start of a data group can be found by the memory controller scanning the stored data for this code and then confirming when it finds the bit pattern of the code that it is indeed the start of a data group and not data within a group. The second field of the header allows this confirmation to be made. This second field is a pointer to the file entry in the FIT 203 (FIGS. 20 and 22) for the file containing the data group. The second field defines a FIT block number and FIT file entry. The controller then reads the FIT file entry to see if it points back to the data group from which the code was read. If so, the code is confirmed to be an indication that it is within a header of a data group. If not, the bit pattern of the code is known to have been read from other data so is ignored as a data group header.

By including such a header as part of the data stored in the individual data groups, the file to which any data group in the memory belongs may be determined by reading its header and accessing the FIT entry to which the header points. The FIT entry 219 (FIG. 22) could include the fileID. This capability is used herein, for example, to identify data groups in a common block during garbage collection of the common block. If garbage collection is instituted because one or more other data groups within the common block are obsolete, it is then desirable to be able to identify the file to which each remaining valid data group belongs.

Instead of a header being made part of each data group, one header can be provided per file. It is advantageous to be able to identify the full pathname for a file when the location of a FIT entry for a data group in the file is known, and a file header makes this possible. Such a header may be provided as the first of the set of entries in the FIT for a file, or the first of a set of entries for a directory in the file directory.

This file header contains a code to identify it as a FIT file header, and a reverse pointer to the directory entry that is pointing to it. The FIT file header may also contain additional information, such as the length of the file and the number of data groups. Alternatively, the header entry may occupy the space of one or more normal entries.

Similarly, a directory header entry contains a code to identify it as a directory header, and a reverse pointer to the directory entry that is pointing to it. The root directory is identified explicitly in its header. The directory header may also contain additional information, such as the number of entries in the directory.

As an alternative to use of such data group or file headers, an index may be written at the end of each common block to identify the file to which each data group in the common block relates. When a common block is closed, such an index may be written. The index preferably contains a physical byte address within the common block where each data group in that block starts, and a pointer to the FIT entry for that data group. The file to which each common block data group is a part may then be determined by reference to the FIT entry provided in the data group's index entry.

The data group header described above may still be retained, even if these common block indices are employed, if it is desired to have some redundancy of file identification for the data groups stored in the memory.

Since the memory device manages the file directory and file indexing, it may therefore control device configuration parameters that are reported to a host. This is not normally possible when the file system for a device is managed by the host, as in current commercial systems. The memory device may vary the reported storage capacity, for example, both the capacity of the total device and the available unwritten capacity.

The pathname that is used for files at the Direct-File Interface may identify the ID of the storage device itself, and a partition within the storage device. It may be an advantage to allow the memory device to modify the size and number of partitions. If a partition becomes full, unused capacity from one or more other partitions may be reassigned to the full partition. Similarly, unused capacity from other partitions may be assigned if a new partition is created. The device may modify reported capacity for the various partitions, as above.

The directory structure shown in FIGS. 20 and 21 uses a pointer in a directory entry to identify the start of a set of other contiguous entries for elements within that directory. This pointer points to a logical page within a directory block, and remains unchanged when the physical page corresponding to that logical page is changed. However, the number of elements within a directory is frequently changed, and the set of entries for a specific directory will frequently need to be moved from one logical page to another, or be moved within its current logical page. This can result in a frequent need to update pointer references within the directory blocks. An alternate entry indexing technique for the directory structure to that of FIG. 21 is shown in FIG. 23, where its corresponding elements are identified with the same reference numbers but with a prime (') added.

The structure of FIG. 23 is the same as that of the FIT of FIG. 22 but with different terminology that relates to directories. Specific entries are pointed to rather than just a page as done in FIG. 21. This provides a more efficient method of indirect addressing within a directory block for a set of entries for a specified directory than that described above with respect to FIG. 21. It is appropriate to use the same indexing scheme for directory (FIG. 23) and FIT (FIG. 22) blocks, because both have very similar characteristics and requirements. They each store sets of contiguous entries, relating to either directories or files. The updating of a set of entries may consist of either changing the content of existing entries, or changing the number of entries.

The method described with respect to FIG. 22 for updating FIT entries leaves a fraction (e.g. 50%) of the pages in a physical block containing the FIT entries in the erased state after compaction of the block. This then allows for updated FIT entries to be written into the remainder of the compacted block. All FIT blocks incorporate this capacity overhead, even when no files indexed by a block are actually open. The FIT therefore occupies more memory capacity than is desirable.

An alternative FIT update method causes updated sets of FIT entries to be written in a separate FIT update block, rather than into available erased capacity in the blocks in which they were originally located. FIGS. 24 and 25 outline indexing techniques for the file directory and the FIT, respectively, that utilize update blocks. The techniques are identical, with only terminology differences for the directory and the FIT.

The description below relates to updating group entries in a FIT block as shown in FIG. 25 but is equally applicable to updating group entries in a file directory (FIG. 24).

Reading group entries from the FIT block is as described above. The FIT Block No field of the FIT Pointer defines the logical FIT block. A FIT Block List is contained in a data structure in flash, and provides the information to translate the FIT Block No to the physical address of the block in which it is located. A block address in the FIT Block List is updated whenever a FIT Block is moved during a compaction or consolidation operation.

The File Pointers region of the most recently written page in that block allows the FIT File No value in the FIT Pointer to be translated to a File Pointer designating the start of the set of File Group Entries for the specified file. The File Group Entries may then be read from the FIT Block.

When the content of a group entry, or the number of group entries in the set for a file, is updated, the complete set of entries is rewritten in an erased page. (This is based on as assumption that a page being the minimum unit of programming in the flash memory, with multiple write operations to the same page prohibited between erase operations.) The set may occupy multiple pages, if required.

In the technique currently being described, this page is the next available page in the FIT block. In the revised scheme, this page is the next available page in a separate FIT Update Block. A FIT update block has the same page structure as a FIT block, as shown in FIG. 23. Its existence is identified by the presence of the target FIT Block No in a FIT Update Block List, which also contains the physical block address for the update block and an Update File No corresponding to the original FIT File No. There may be a separate FIT Update Block for each FIT Block being updated, or preferably a FIT Update Block may relate to multiple FIT Blocks. A single FIT Block may also relate to multiple FIT Update Blocks.

When a FIT Update Block becomes filled, its valid data may be written in compacted form to an erased block, which becomes a new FIT Update Block. There may be as little as a single page of valid data, if updates have related to only a few files. Multiple FIT Update Blocks may be compacted together to a single block. Block compaction is preferred to block consolidation if the update block related to a file or files that are still open, which may continue to be updated.

When group entries for a file are updated in a FIT Update Block, the entries for that file in the original FIT Block become obsolete. At some stage, the original FIT Block must undergo a garbage collection operation to clean it up. This may be clone by consolidating valid data in the FIT Block and FIT Update Block into an erased block.

If the number of entries has increased during the update process, and valid data cannot be consolidated into a single erased block, files originally assigned to that FIT block may be reassigned to two or more FIT blocks, and the consolidation may be performed to two or more blocks.

Entries from a FIT Update Block may be consolidated with entries from a FIT Block, and therefore eliminated from the FIT Update Block, whilst entries for other files may remain in the FIT Update Block.

As a further alternative, the Directory Block and FIT Block structures may be merged into a single Index Block structure, which may contain both directory entries and file group entries. An Index Update Block may act as an update block for both directory entries and file group entries, either when there are separate Directory Block and FIT Block structures, or when there is a combined Index Block structure.

It will be recognized that the file directory and FIT described above with respect to FIGS. 20-25 are modeled on DOS systems. Alternatively, they may be modeled on Linux, Unix, the NT File System (NTFS) or some other known operating system.

Specific Memory System Operation Example

Operational flowcharts of FIGS. 26-32 provide an example of the operation of a memory system constructed as described above with respect to FIGS. 2-6 but with use of a specific combination of the direct file interface techniques described with respect to FIGS. 9 and 10-22. The functions included in the flowcharts of FIGS. 26-32 are carried out primarily by the controller 11 (FIG. 2) executing its stored firmware.

Referring initially to FIG. 26, an overall system operation is shown. In a first step 251, the memory system is initialized, which includes the processor 27 (FIG. 2) executing boot code in the ROM 29 to load firmware from the non-volatile memory into the RAM 31. After initialization, under control of this firmware, the memory system then looks for a command from the host system, as indicated by step 253. If a host command is pending, the command is identified from among those listed in FIG. 12. If a Read command (FIG. 12A), it is identified in a step 255 and executed by a process indicated at 257 that is more fully described below with respect to FIG. 27. If not a read command, any one of the Write, Insert or Update programming commands of FIG. 12A is identified at a step 259 of FIG. 26 and executed by a process 261 that is the subject of FIG. 28. If a Delete or Erase command (FIG. 12B), it is identified in a step 262 and executed in a step 263, as described in more detail in FIG. 30. An Idle command (FIG. 12D) from the host is identified at 264 of FIG. 26 and results in a garbage collection operation 265 that is shown in a flowchart of FIG. 31. This example of FIGS. 26-32 is described for a memory system operating with metapages and metablocks, as previously described, but can also be executed by a memory system organized in pages and/or blocks.

If the host command is other than Read, Write, Insert, Update, Delete, Erase or Idle, in this specific example, such another command is executed by a step 267 of FIG. 26. Among these other commands are those that cause a garbage collection operation to be added to a queue, such as the Close and Close_after commands listed in FIG. 12B and described above. After executing a received command by any of the steps 257, 261, 263, 265 or 267, a next step 268 inquires whether the priority garbage collection queues are empty or not. If so, the processing returns to the step 253 to execute a pending host command, if one exists. If not, the processing returns to the step 265 to continue garbage collection rather than allow the possibility of another host command to be executed. For the specific example described with respect to the flowcharts of FIGS. 26-32, there are the five different garbage collection queues described above: two priority queues for obsolete metablocks (metablocks with only obsolete data) and common metablocks with obsolete data, wherein the obsolete data result from an Erase command; two other queues for obsolete metablocks and common metablocks with obsolete data, wherein the obsolete data result from other than execution of Erase commands; and one queue for files to be garbage collected. For garbage collection listed in the three non-priority queues, another pending host command is given priority to carrying out the listed garbage collection operations. However, for those in the priority queues, garbage collection is given priority over execution of a new host command. That is, the host can be made to wait until any priority garbage collection operations are completed before a new host command may be executed. This is because the host has previously given priority to erasure of data in the metablocks in the priority queues by use of the Erase command. The priority garbage collection also results in additional erased metablocks being generated with relatively little processing time. But if not priority, garbage collection is performed in the background, when the host is idle, or interleaved with other operations when necessary to maintain the erased block pool. If it is determined by the step 268 that there are no priority garbage collection operations pending, the next step is then step 253, where a new host command, if any, is executed.

Returning to the step 253 of FIG. 26, if no host command is pending, garbage collection 265 is carried out, including non-priority garbage collection, if it is determined by a step 269 that the host has been inactive or idle for a predetermined length of time, or that the most recently received host command was the Idle command, or by the step 264 that the pending host command is the Idle command. Under these circumstances, the garbage collection is then most likely performed entirely in the background.

Execution of a Read command in the step 257 of FIG. 26 is the subject of the flowchart of FIG. 27. A first step 271 is to read the file index table (FIT), as described above with respect to FIGS. 19 and 22. The host Read command includes the fileID and the offset within the file where reading is to start (see FIG. 12A). All of the FIT entries for the file to be read, or portions thereof, are preferably read from the non-volatile memory into the controller memory 31 (FIG. 2) in order to avoid the necessity to read the FIT from the non-volatile memory each time some data are needed from it. In a step 273, a data group number counter is initialized to the number of the data group making up the requested file where the starting offset lies. This is done by comparing the host specified starting offset with those of the data groups in the FIT entries for the host designated file. Next, in a step 275, a data group length counter is initialized to the amount of data within the initial data group from the host-supplied offset to the end of the data group. One data group is read at a time, and steps 273 and 275 set up two counters that manage the reading of the first data group. The beginning physical byte address within the non-volatile memory of the data to be read is determined from the FIT entry for the initial data group. The logical offset and physical byte address of data within a group are linearly related, so the starting byte address, if reading is not starting at the beginning of the data group, is calculated from the host supplied beginning offset within the file. Alternatively, in order to simplify initialization of the data group length counter, the length of the each data group can be added to its record 219 of the FIT (FIG. 22).

It is assumed for the rest of this description of the flowcharts that the memory system is operating with metablocks and data are read and programmed in units of metapages, as previously described. A data metapage is read in a step 277 from the initial data group stored in the non-volatile memory that includes the starting byte address. The read data are typically then written into a controller buffer memory (RAM 31 of FIG. 2, for example) for transfer to the host. The data group length counter is then, at a step 279, decremented by the one metapage. That counter is then read in a step 281 to determine whether it has reached zero. If not, there are more data of the initial data group to be read. But before returning to the step 277 to read the next metapage of data in order, a step 283 checks whether the host has issued another command. If so, the reading operation is terminated and the process returns to step 253 of FIG. 26 to identify the received command and then execute it. If not, reading of the initial data group continues by reading its next metapage in steps 277 and 279 of FIG. 27. This continues until the data group length counter is determined by the step 281 to have reached zero.

When this occurs, the FIT entries for the file are again read, in a step 285, to determine, in a step 287, whether there are any further data groups of the current file to be read. If so, the data group number counter is updated in a step 289 to identify the next data group, and the data group length counter is initialized in a step 291 to the length of the data in the new group. The first metapage of the new data group is then read in a step 277, if it is determined by the step 283 that no other host command is pending. The steps 277 and 279 are then repeated for each metapage of the new data group until all of its data are read, at which time the steps 285 and 287 determine whether yet another data group exists, and so on. When it is determined by the step 287 that all the data groups of the file after the host supplied offset have been read, the processing returns to the step 253 of FIG. 26 to execute another host command.

In a special case where, a file is being used as a circular buffer, reading of the file may be repeated after the step 287 of FIG. 27, rather than returning to the step 253 of FIG. 26. This can occur in the case where data of the current file are being programmed by the host during reading by responding in the step 283 to a host command to write data to the same file.

An example of the data programming operation 261 of FIG. 26 is given in the flowchart of FIG. 28. When one of the data programming commands of FIG. 12A is received from the host, that command includes a fileID of the file to which data are to be written. A first step 295 determines whether that designated file is currently opened for programming. If so, a next step 297 determines whether there are data in the controller buffer (such as RAM 31 of FIG. 2) for that file. Data are transferred by the host system into the controller buffer memory, and then by the memory system controller into the flash memory.

But if the host designated file is determined by the step 295 not to be opened, a next step 299 asks whether the number of files currently opened by the memory system for programming is equal to or greater than a maximum number N1 that is allowed by the memory system to be open at the same time. The number N1 is preset within the memory system, and can be 5, 8 or some other number of files. If the number of opened files is less than N1, a next step 301 causes a new file to be opened by providing system resources necessary to program data to that file, and the processing proceeds to the step 297. If the number of open files is determined in the step 299 to be equal to or greater than N1, however, a currently opened file first needs to be closed, as indicated by a step 303, before the new file can be opened in the step 301. The basis upon which an open file is selected to be closed in the step 303 can vary but most commonly will be the opened file to which data has least recently been written by the host. It is presumed from this that the host is unlikely to write data to this file in the near future. But if it does, then that file is reopened after another open file is closed, if necessary at that time.

When it is determined in step 297 that at least a metapage of data of the current file are in the controller buffer, a next step 305 determines whether a metablock within the memory array has been opened for programming. If so, data are then programmed from the controller buffer memory into the open metablock, in a step 307. If not, a metablock is first opened, in a step 308, by providing the system resources necessary to program data to that metablock. Data are written into the open memory metablock, in this example, in units of one metapage at a time. Once this unit of data is written, a next step 309 determines whether the opened write metablock is full of data. If not, the process normally proceeds through steps 311 and 313 and back to the step 297 to repeat the process for programming the next metapage of data in the currently opened file.

If the write metablock is determined by the step 309 to be full, however, that metablock is closed, in a step 315, and the FIT is updated, in a step 317, including closing the current data group since a memory metablock boundary has been reached. Metablock entries of the lower priority obsolete metablock garbage collection queue are then updated, in a step 318. During the FIT update in the step 317, it is determined whether filling the write metablock has created another metablock that contains all obsolete data of the current file or is a common metablock containing obsolete data of the current file. If so, that metablock is added to an appropriate lower priority metablock queue by the step 318 for garbage collection. The processing then returns to the step 311 and passes through the step 313 back to the step 297. This time through the steps 305 and 307, the step 308 will open a new write metablock since the previous metablock has just been closed by the step 315.

The step 311 asks, after each metapage of data have been written by a path including the step 307, whether the number of metablocks currently existing in the erased metablock pool is in excess of a minimum number N2 that has been determined necessary to efficiently operate the memory system. If so, the step 313 asks whether another host command has been received. If no other host commend is pending, the step 297 is repeated for the next metapage of data to be programmed into the memory. But if a host command has been received, the FIT is updated, in a step 319, to close the data group that has been written. After updating the metablock entries in a lower priority obsolete metablock garbage collection queue in a step 320 (similar to the step 318 described above), the process returns to the step 253 of FIG. 26.

But if it is determined in the step 311 of FIG. 28 that there is a shortage of erased metablocks for the storage of data (equal to or less than the preset number N2), a sub-routine is executed to garbage collect a file or common metablock in the foreground, in order to increase the number of erased metablocks. Such garbage collection is preferably not performed after each metapage of data are written into the memory but rather only after each N3 metapages have been written. A write metablock metapage program counter maintains a count of a number of metapages of host data that have been programmed in succession without any garbage collection in between them. This counter is reset to zero each time garbage collection is performed and then incremented by one each time a metapage of data are programmed. In step 321, it is determined whether that count is in excess of the predetermined number N3. If not, the counter is incremented by one, in a step 323, to record that a metapage was written into the memory in the step 307. But if the count of the program counter is in excess of the number N3, then garbage collection takes place by steps 325, 327 and 329, followed by the program counter being reset to zero in step 331.

The purpose of the garbage collection at this point in the process is to create additional erased metablocks for the erased metablock pool. But only a portion of a garbage collection operation is preferably performed each time by execution of the steps 325, 327 and 329. The copy operation is divided into smaller operations that are spread out over time in order to minimize the duration of the intervals that the memory is unavailable to the host, thereby to minimize the adverse impact on data programming performance. And the partial garbage collection operation is performed only every N3 programming cycles for that same reason. Although the numbers N2 and N3 can be preset in the system, they may alternatively be determined during operation of the memory system to adapt to particular conditions that may be encountered.

Since most of the time required by a complete garbage collection operation on a file or common metablock to provide one or more additional erased metablocks is taken by copying valid data into one or more copy metablocks, it is this copying that is primarily interleaved in FIG. 28 with the data programming. A step 325 selects a foreground mode for the garbage collection 329, which is described with respect to the flowchart of FIG. 31. A certain preset number of metapages of a data group are then copied in succession from a metablock being garbage collected and into a previously erased copy metablock. The step 327 resets a counter of the metapages copied in this interleaved fashion, so that in the step 329 the preset numbers of metapages are copied before the operation returns out of the garbage collection step and back into the data programming loop. The write metablock metapage program counter referenced by the step 321 is then reset by a step 331 after each garbage collection operation 329. This causes N3 metapages of data to be written into the memory before another garbage collection operation takes place in the foreground, and thereby spreads out any delays in data programming that are caused by the garbage collection.

The interleaved nature of this garbage-programming algorithm is illustrated by a timeline of FIG. 29. N3 metapages of data from the host are written consecutively into the memory between garbage collection operations. Each garbage collection operation is limited to copying N4 metapages of data, after which programming of another N3 metapages of data takes place. While in the garbage collection phase, the host may be caused to wait for the memory system to complete it before transferring additional metapages of data to the memory system controller buffer.

Execution of the delete file routine 263 of FIG. 26 is shown by the flowchart of FIG. 30. Its primary purpose is to identify obsolete blocks and common blocks with obsolete data of the file being deleted, and then place those blocks in the appropriate garbage collection queues. When either a Delete or Erase command (FIG. 12B) is received by the memory system along with the name or other identification of the file to be deleted, a step 335 initializes a data group number counter to zero. In a step 337, the file directory and file index table (FIT) are read to obtain the identities of the data groups stored in the memory that make up the designated file. Each data group of the file is then examined one at a time by incrementing the data group number counter that points to each data group in logical sequence.

A first inquiry 339 for a data group is whether it lies in a common metablock or not. If so, a step 341 adds that metablock to one of the common block garbage collection queues. The metablock is placed in the priority common metablock queue if the file is being deleted by an Erase command, and in the other common metablock queue if by the Delete command. Any common metablock with a data group of a file to be deleted is scheduled for garbage collection. If it is determined by the step 339 that the data group is not in a common metablock, a next inquiry 343 determines whether the data group is within a metablock already scheduled for garbage collection by being in the obsolete metablock garbage collection queue. If the metablock is already scheduled for garbage collection, it should not again be added to that same queue. But if not so scheduled, such it is added by a step 345 to one of the obsolete metablock garbage collection queues. The metablock is placed in the priority obsolete metablock queue if the file is being deleted by an Erase command, and in the other obsolete metablock queue if by the Delete command.

After either of the steps 341 or 345 has been executed, or the inquiry of the step 343 is positive, the process for one data group is completed. A next step 347 increments the data group number counter. An inquiry 349 is then made as to whether there is another data group in the file. If so, the processing returns to the step 339 and is repeated for that next data group. If not, it is then known that all metablocks containing data of the file to be deleted have been entered into the obsolete and common metablock garbage collection queues. The FIT is then updated, in a step 351, to obsolete the data group records of the file to be deleted. Records in the FIT of obsolete data groups are then typically eliminated when the FIT is compacted. In a final step 353, the file directory 201 (FIG. 20) is updated to remove the deleted file from it.

The flowchart of FIG. 31 illustrates a specific example of the garbage collection operations 265 of FIGS. 26 and 329 of FIG. 28. This algorithm is entered in the background when the host sends an Idle command (step 264 of FIG. 26) or the host has been idle for a time (step 265 of FIG. 26), or in the foreground during a programming operation (step 329 of FIG. 28) when fewer than N2 erased metablocks remain in the erased metablock pool. A first inquiry 355 is whether there is a garbage collection operation in progress that has not yet been completed. It will be seen from this description of FIG. 31 that the processing comes out of garbage collection under certain circumstances, such as when a host issues another command or when data copying is interleaved with other operations. So if there is an uncompleted garbage collection operation pending, a step 357 is next since a pending garbage collection is given priority. But if it is determined by the step 355 that there is no pending garbage collection operation, a next step 356 then looks at the various garbage collection queues to see if there is at least one entry in them. If so a next step 358 selects one of the entries, if there are more than one, in accordance with the priorities discussed above. Garbage collection of a next in order metablock in the obsolete metablock block queue will generally be given priority over a metablock on the common metablock queue or a file on the queue of files to be garbage collected. This is because the size of the erased metablock pool can be increased more quickly by means of garbage collecting obsolete metablocks since no data need be copied.

A next set of steps 360, 362 and 366 determine the object of the garbage collection for the selected queue entry, since the process is different for files, common metablocks and obsolete metablocks. The inquiry 360 asks whether it is a file that is being garbage collected. If so, the FIT entries for the file are read in order, in steps 370 and 372, to set certain counters and a count. In the step 370, a first counter is set to the number of data groups in the file and a second counter is set to the number of metapages (length) of data in the first data group of the file. This length may be calculated from the FIT data group entries if their lengths are not part of their entries. Alternatively, the length of each data group may be included as part of its entry in the FIT, as shown in FIGS. 20 and 22, in order to eliminate the need to calculate a data group length each time it is needed. In the step 372, a third counter is set to the number of metapages of current file data stored in memory blocks containing obsolete data or data from other files. These are the data of the current file that need to be moved. This third count preferably ignores all obsolete and invalid data groups within the file. Finally, a count is made of a number of residual metapages of data that would result if the valid data of the file were compacted into and filled an integral number of metablocks. That is, the residual metapage count is an amount of data of the file, less than a metablock, that would have to occupy a common or partially filled metablock should all the metablocks containing data of the file be included in the garbage collection. After these three counters are set and the residual metapage count made and stored, a next step 359 begins garbage collecting data of the file.

Returning to the step 360, if the entry selected by the step 358 is not a file, a next inquiry 362 determines whether it is a common metablock that is to be garbage collected. If so, common metablock garbage collection 364 of FIG. 32 is carried out. If not, an inquiry 366 determines whether the selected entry is for an obsolete metablock, such as one added to an obsolete metablock queue by the step 345 of FIG. 30. If so, the selected metablock is erased in a step 368. After the common metablock garbage collection 364, the metablock erasure 368 or if the inquiry 366 results in a negative response, the processing returns to the step 253 of FIG. 26. If the garbage collection operation remains incomplete, then it will be resumed the next time the garbage collection algorithm is entered.

Returning to the step 355, if there is a pending garbage collection, that will be further processed. The step 357 of FIG. 31 determines whether the pending operation is for a file or not, like the step 360 for a new item selected from a garbage collection queue. If not for a file, the process of the steps 362, 364, 366 and 368, described above for a new item, are executed and garbage collection then ended by returning to the step 253 of FIG. 26.

If it is determined by the step 357 of FIG. 31 that the resumed garbage collection is for a file, the inquiry 359 is made next. The processing that follows is substantially the same for a file for which garbage collection is resumed (through the step 357) or for a new file selected from a queue (through the step 360) for which its counters and residual metapage count are set by the steps 370 and 372. When garbage collection of a file is in progress and being resumed through the step 357, the data group number and file metapage number counters and the residual metapage count were set when the garbage collection of the file was first begun. The data group number and metapage counters have likely been decremented to different values than originally calculated by the earlier partial garbage collection of the current file. All four are stored when garbage collection of a file is suspended and then accessed during the resumed processing of the same file.

The common step 359 inquires whether there are one or more metapages within the current data group that have yet to be copied. This is determined by reference to the data group length counter. One metapage of a valid data group is examined and copied at a time by the subsequent steps. If data are determined by the step 359 to remain in a pending data group, a next inquiry 361 determines whether a copy metablock is open. If so, a metapage of data of the current data group of the file being garbage collected is read from the metablock in which it is stored, by a step 363, and written into the copy metablock, in step 365. The data group length counter is then decremented in a step 367 by one metapage, and the file metapage counter is decremented by one in a step 369.

If it is determined by the step 361 that a copy metablock is not opened, a next step 371 determines whether the file being garbage collected is an open file. If so, a next step 373 opens a copy metablock, and the process then proceeds to the step 363 previously described. But if not an open file, a next step 375 inquires whether the decremented count of the file metapage counter equals the residual metapage count. If not, a copy metablock is opened by the step 373. But if they are equal, that means that there is not a metablock of data remaining in the current file to be copied. Therefore, in a step 377, an open common metablock is identified for copying residual data into it. The processing of steps 363 and beyond then copies the remaining metapages of the current data group of the current file are copied into a common metablock. This path is not taken when it is an open file that is being garbage collected, as determined by the step 371, since other data groups could be written to the current file that would fill out another metablock. After the open file is closed, it is placed in a queue for garbage collection, at which time any residual data are copied to a common metablock by the step 377.

An inquiry 379 of FIG. 31 determines whether the copy metablock is now full, after writing this additional metapage of data. If so, the copy metablock is closed in a step 381 and the FIT is updated by a step 383 to reflect that fact. If the copy metablock is not full, or after step 383, an inquiry 385 determines whether all the data in the metablock being garbage collected have now been rendered obsolete. If so, the metablock is erased, in a step 387. If not, or after the metablock erasure, an inquiry 389 asks whether the foreground mode was set by the step 325 of FIG. 28 during a programming operation. If not, a step 391 of FIG. 31 determines whether a host command is pending. If so, and if the garbage collection in progress is not a priority, as determined by a step 392, the garbage collection is suspended by updating the FIT in a step 393 and then returning to the step 253 of FIG. 26. However, If a host command is not pending, as determined by the step 391, or if there is a pending host command and the garbage collection in progress is not a priority, as determined by the step 392, the processing returns to the inquiry 359 to copy the next metapage of data from the current file metablock into the copy metablock.

If the inquiry 389 of FIG. 31 determines that the foreground mode has been set, a next step 395 increments the copy metablock metapage counter that was reset by the step 327 of FIG. 28. If a step 397 determines that a preset number N4 of metapages have been copied in succession, then a next step 399 resets the foreground mode and the FIT is updated by the step 393. But if there are more metapages to be copied before the number N4 is reached, the process continues with the step 359 unless the inquiry 391 determines that there is a host command pending. If there is a host command pending, the copy operation is interrupted and the process returned to step 253 of FIG. 26.

Returning to the inquiry 359, if the data group length count is zero, that means that copying of one data group from the file metablock to the copy metablock has been completed. In this circumstance, a step 401 updates the FIT to reflect this condition. Next, it is determined in a step 403, by reference to the data group number counter, whether the current file being garbage collected includes another data group. If not, garbage collection of the file has been completed. The process then returns to the step 356 to garbage collect the next file or metablock in order from a queue. It will not return to the step 355 since completion of garbage collection of the current file means that there could no longer be garbage collection of a file in progress and which could be resumed.

If from the step 403 it is known that there is at least one more data group of the current file to be copied, it is then determined, in a step 405 whether the metablock containing this next data group also includes other data that is obsolete. As described earlier, metablocks containing obsolete data of a file are garbage collected but those which do not contain obsolete data of a file are preferably not garbage collected unless the metablock is a common metablock or an incomplete metablock containing residual data of the file. Therefore, if it is determined by the step 405 that there are obsolete data in the metablock of the next data group, the data group number counter is updated to the number of the next in order data group, by a step 407, and the data group length counter is initialized in a step 409 with the amount of data in the new data group. The processing then proceeds to the step 361 to copy data of the first metapage from the new data group of the file to the next erased metapage in a copy metablock, in the manner previously described.

But even if it is determined by the step 405 that there are no obsolete data in the metablock in which the next data group exists, garbage collection of the data in that metablock can still occur if either (1) the next data group is in a common metablock or (2) is in an incomplete metablock and the file is a closed file. An inquiry 411 is first made as to whether the current data group is in a common metablock or not. If it is, then a next step 413 adds the common metablock to the common metablock garbage collection queue for later garbage collection, but the processing proceeds with the steps 407 and 409 to update the data group number counter and the data group length counter to that of the next metablock for copying by the steps 361 et seq. However, if the current data group is not in a common metablock, a step 415 inquires whether the current data group is in an incomplete metablock. That is, the step 415 determines whether the current data group exists in a metablock that still has at least a minimum amount of erased capacity (such as the data group F3,D3 of FIG. 15). If not, the current data group is not copied but rather the processing returns to the step 403 to deal with the next data group of the file, if one exists. But if the current data group is in an incomplete metablock, a next inquiry 417 asks whether the incomplete metablock contains data of an open file. If so, copying of the current data group is also skipped by returning to the inquiry 403 to proceed with any further data group of the file. But if the metablock in which the next data group exists does not contain data of an open file, then the steps 407, 409, 361, et seq., are carried out on that next data group.

Returning to the step 356 of FIG. 31, garbage collection may take place even if it is there determined that no file or metablock are present in a garbage collection queue. If there are not, rather than ending the process, a step 421 checks whether there are more than N2 erased metablocks in the erased metablock pool. If so, then the garbage collection process ends and returns to the step 253 of FIG. 26. But if there are not more than N2 erased metablocks in the system, then the opportunity is taken to perform garbage collection from the step 421. Such garbage collection can occur, as indicated by a step 423, on an open file, if one exists. Since nothing is in a queue, there is likely no other potential source of more erased metablocks when the number of erased metablocks in the pool is N2 or less. If there is more than one open file, one of them is selected in a step 425. The processing then proceeds for the opened file through the steps 370, 372 and 359, as previously described.

When it is determined by the inquiry 362 of FIG. 31 that the current garbage collection operation is being carried out with data groups in a common metablock, the garbage collection 364 is somewhat different from that described above for other metablocks. The flowchart of FIG. 32 outlines garbage collection of a common metablock. A step 431 asks whether a garbage collection is in progress and thus being resumed. If so, the data group length counter retains the last value when the garbage collection was suspended. If not, the data group number counter is first initialized in a step 435 by reference to the FIT for the first data group that is the subject of the processing and then the length of this data group is then determined by the step 433.

When the data group length counter is determined by the step 433 to be greater than zero, copying of the current data group commences. By a step 437, a metapage of the current data group is read from the common metablock and, by a step 439, programmed into an open common metablock. In a step 441, the data group length counter is then decremented by one metapage. If doing garbage collection in the foreground, as indicated by the step 443, a step 445 causes the copy metablock metapage counter to be incremented by one. This counter keeps track of the number of metapages of data that have been copied in the current sequence. If this count is determined by a step 447 to be in excess of the predetermined number N4, the process then exits the foreground mode in a step 449. This is followed by the FIT being updated, in a step 451, and the processing then returns to the step 253 of FIG. 26.

If the copy metablock metapage counter is determined by the step 447 of FIG. 32 to have a value of N4 or less, a next step inquires whether a host command is pending. If so, the FIT is updated in the step 451 and the processing returned to the step 253 of FIG. 26, in order that the pending host command may be executed. If not, the processing returns to the step 433 of FIG. 32 to inquire whether another data metapage exists in the current data group and, if so, to copy it from the obsolete common metablock to the open common metablock, and so forth. Similarly, if, in the step 443, it is determined that the garbage collection is not being performed in the foreground, the step 453 is executed next. Unless a host command is pending, as determined by a step 453, the processing then returns to the step 433 to potentially copy the next metapage of data in the current data group, regardless of whether the copy metablock metapage counter is in excess of N4, since the step 447 is bypassed. The garbage collection in this case is being performed in the background.

Returning to the step 433 of FIG. 32, if the data group length count is not greater than zero, it is then known that all the metapages of the current data group have been copied. The FIT is then updated, in a step 455, and it is determined by a step 457 whether there is another data group in the common metablock being garbage collected. If not, the obsolete common metablock is erased, in a step 459, and the processing returns to the step 253 of FIG. 26. But if there is another data group in the common metablock, the data group number counter is updated by a step 461. The FIT pointer from the common metablock index is then read, in a step 463, and the FIT entry defined by that pointer is read, in a step 465. If the FIT entry matches the current data group, as determined by a step 467, an inquiry 468 determines whether the current data group is part of residual data that has already been identified. If so, a step 469 causes the data group length counter to be initialized to the length of the data group as read from the FIT.

But if in step 468 it is determined that the current data group is not in existing residual data, new residual data of which it is a part is then identified, in a step 470. In a step 471, open common block with sufficient space to store all of the data of the new residual data is then identified. This prevents splitting residual data of a file between two or more different metablocks when the residual data contain two or more data groups. This could otherwise happen if the two or more data groups are copied independently. In that case, the first data group could be copied to a common block with enough erased space to store that data group but without enough space to also store the second data group. The second data group would then be copied to a different common block. This would be undesirable since residual data of a file should not be split between two different metablocks. If they are so split, garbage collection of the file or of the common blocks would then take more time.

The data group length counter for the current data group is then initialized by the step 469. The first metapage of data of the current data group is copied from the common metablock into the identified open common metablock, by the steps 437 and 439. However, if the FIT entry is determined by the step 467 not to match the current data group, the processing returns to the step 457 to determine whether another data group exists in the common metablock.

The garbage collection shown in the flowchart of FIG. 32 continues until all the valid data groups of the current common metablock have been copied to a previously erased metablock, which then becomes a new common metablock, or to one or more open common metablocks. Data groups of different files may be copied to different open common metablocks. The common metablock was previously placed in a garbage collection queue because it contained an obsolete data group. The complete transfer of all metapages of data of each valid data group in the common metablock takes one pass through the steps of FIG. 32 for each such metapage. This copying may be interrupted every N4 metapages if the garbage collection is being done in the foreground, or when a new host command is received when operating in either the foreground or background.

As an alternative to permanently presetting the numbers N3 and N4, they may be changed by the memory system controller in response to data programming patterns of the host, in order to sustain a uniform data programming speed.

Various States of Memory Blocks During Operation

The diagram of FIG. 33 shows various individual states of the memory blocks or metablocks of the system, and transitions between those states, within a direct file storage memory system of the type described above.

In the left-hand column, a block 501 is shown to be in an erased state, within an erased block pool.

In the next column, blocks 503, 505 and 507 each contain some valid data but also have erased capacity in which data from the host may be written. The Write Block 503 is partially written with valid data for a single file, and further data for the file should be written to this block when supplied by the host. The Copy Block 505 is partially written with valid data for a single file, and further data for the file should be written to it when copied during garbage collection of the file. The Open Common Block 507 is partially written with valid data for two or more files, and a residual data group for any file may be written to it during garbage collection.

Blocks 509 and 511 of the next column are full of file data. The File Block 509 is filled with valid data for a single file. The Common Block 511 is filled with valid data for two or more files.

The next to the right hand column of FIG. 33 includes blocks 513, 515, 517, 519 and 521 that each contain some obsolete data. The Obsolete File Block 513 is filled with any combination of valid data and obsolete data for a single file. The Obsolete Write Block 515 is partially written with any combination of valid data and obsolete data for a single file, and further data for the file should be written to it when supplied by the host. The Obsolete Copy Block 517 is partially written with any combination of valid data and obsolete data for a single file. The Obsolete Open Common Block 519 is partially written with any combination of valid data and obsolete data for two or more files. The Obsolete Common Block 521 is filled with any combination of valid data and obsolete data for two or more files.

An obsolete block 523 in the right hand column of FIG. 33 contains only obsolete data.

Transitions of individual blocks among the block states illustrated in FIG. 33 are also shown by lines labeled with small letters. These transitions are as follows:

a—Erased Block 501 to Write Block 503: Data of a single host file are written to an erased block.

b—Write Block 503 to Write Block 503: Data for a single file from the host is written to a write block for that file.

c—Write Block 503 to File Block 509: Data for a single file from the host is written to fill a write block for that file.

d—File Block 509 to Obsolete File Block 513: Part of the data in a file block becomes obsolete as a result of an updated version of the data being written by the host in a write block for the file.

e—Obsolete File Block 513 to Obsolete Block 523: All valid data in an obsolete file block becomes obsolete as a result of the data being copied to another block during a garbage collection or of the file being deleted by the host.

f—Write Block 503 to Obsolete Write Block 515: Part of the data in a write block becomes obsolete as a result of an updated version of the data being written by the host in the same write block, or of the data being copied to another block during a garbage collection.

g—Obsolete Write Block 515 to Obsolete Write Block 513: Data for a single file from the host is written to an obsolete write block for that file.

h—Obsolete Write Block 515 to Obsolete File Block 513: Data for a single file from the host is written to fill an obsolete write block for that file.

i—Obsolete Write Block 515 to Obsolete Block 523: All valid data in an obsolete write block becomes obsolete as a result of the data being copied to another block during a garbage collection or of the file being deleted by the host.

j—Erased Block 501 to Copy Block 505: Data for a single file is copied from another block to an erased block during a garbage collection.

k—Write Block 503 to Copy Block 505: Data for a single file is copied from another block to a write block for that file during a garbage collection.

l—Copy Block 505 to Copy Block 505: Data for a single file is copied from another block to a copy block for that file during a garbage collection.

m—Copy Block 505 to File Block 509: Data for a single file is copied from another block to fill a copy block for that file during a garbage collection.

n—Copy Block 505 to Write Block 503: Data for a single file from the host is written to a copy block for that file when the file is reopened during a garbage collection.

o—Copy Block 505 to Obsolete Copy Block 517: Part or all of the data in a copy block becomes obsolete as a result of an updated version of the data being written by the host in a write block for the file, or of the file being deleted by the host.

p—Obsolete Copy Block 517 to Obsolete Block 523: All valid data in an obsolete copy block becomes obsolete as a result of the data being copied to another block during a garbage collection or of the file being deleted by the host.

q—Write Block 503 to Open Common Block 507: Residual data for a file is written to a write block for a different closed file during garbage collection.

r—Copy Block 505 to Open Common Block 507: Residual data for a file is written to a copy block containing residual data for a different file during garbage collection.

s—Open Common Block 507 to Open Common Block 507: Residual data for a file is copied from a different block to an open common block during garbage collection.

t—Open Common Block 507 to Obsolete Open Common Block 519: Part or all of the data for one file in an open common block becomes obsolete as a result of an updated version of the data being written by the host in a write block for the file, of the data being copied to another block during a garbage collection, or of the file being deleted by the host.

u—Obsolete Open Common Block 519 to Obsolete Block 523: All valid data in an obsolete open common block becomes obsolete s a result of the data being copied to another block during a garbage collection or of the file being deleted by the host.

v—Open Common Block 507 to Common Block 511: A residual data group for a file is copied from another block to fill an open common block for that file during a garbage collection.

w—Common Block 511 to Obsolete Common Block 521: Part or all of the data for one file in a common block becomes obsolete as a result of an updated version of the data being written by the host in a write block for the file, of the data being copied to another block during a garbage collection, or of the file being deleted by the host.

x—Obsolete Common Block 521 to Obsolete Block 523: All valid data in an obsolete common block becomes obsolete as a result of the data being copied to another block during a garbage collection or of the file being deleted by the host.

y—Write Block 503 to Obsolete Block 523: All valid data for a single file in a write block becomes obsolete as a result of the file being deleted by the host.

z—Copy Block 505 to Obsolete Block 523: All valid data in a copy block becomes obsolete as a result of the data being copied to another block during a garbage collection or of the file being deleted by the host.

aa—File Block 509 to Obsolete Block 523: All data in a file block becomes obsolete as a result of the file being deleted by the host.

ab—Obsolete Block 523 to Erased Block 501: An obsolete block is erased during a garbage collection.

CONCLUSION

Although the various aspects of the present invention have been described with respect to exemplary embodiments thereof, it will be understood that the present invention is entitled to protection within the full scope of the appended claims.

It is claimed:

1. A method of operating a re-programmable non-volatile memory system with a host system that generates a plurality of data files having unique individual file identifiers and offsets, the memory system having blocks of memory cells that are erased prior to new data being written therein, comprising:

maintaining a pool of erased blocks available for storage of data of the files, the blocks in the pool having been erased prior to being needed for the storage of data of the files, receiving from the host data of the files and their unique individual file identifiers and offsets, storing the received data files individually in one or more of the erase pool blocks of the memory system, recording in a directory the identity of the blocks and locations therein in which data of the uniquely identified files are stored by their offset addresses without the use of any intermediate logical address conversion, thereafter receiving from the host a command to delete from the memory system one of the stored data files by its unique file identifier, thereafter identifying each of one or more blocks of memory cells containing data of the file being deleted, thereafter rendering obsolete all the data of the file being deleted that are stored in the identified one or more blocks, wherein thereafter no valid data remain in the memory system for the unique identifier of the file being deleted, and thereafter reclaiming space occupied by the obsolete data of the file being deleted in a manner that increases a number of erased blocks in the pool, wherein executing the received command to delete said one of the stored data files causes the number of erased blocks in the pool to be increased and no data to remain in the memory system for the unique identifier of the deleted file.

2. The method of claim 1, wherein at least one block of memory cells identified to contain data of the file being deleted is full of obsolete data of the file being deleted.

3. The method of claim 1, wherein at least one block of memory cells identified to contain data of the file being deleted also contains valid data from at least one other file.

4. The method of claim 3, wherein reclaiming space occupied by the obsolete data of the file being deleted additionally comprises copying into another block in the pool of erased blocks the data from the at least one block of memory cells identified to also contain valid data from at least one other file and thereafter erasing data from the at least one block of memory cells identified to also contain valid data from at least one other file.

5. The method of claim 1, wherein receiving from the host data of the files and their unique file identifiers includes receiving data of the files and their unique file identifiers generated by application programs being run on the host and addressed with offsets of data within the individual identified files.

6. A memory system capable of storing data of multiple files that are received by the memory system with unique file identifiers and offsets of data within individual files, comprising:

an array of non-volatile charge storing semiconductor memory cells organized into a plurality of individual blocks of memory cells that are simultaneously erased prior to new data being written therein, a directory including records that identify one or more of the blocks of memory cells in which data of individual ones of the received files are stored, and a controller connected with the memory cell array that operates to (a) maintain a pool of erased blocks available for storage of data of the files, (b) cause data received by the memory system of the uniquely identified files to be individually stored in an identified one or more of the erase pool blocks of memory cells, (c) record in the directory the identity of the blocks of memory cells and locations therein in which data of the uniquely identified files are stored by their offset addresses without the use of any intermediate logical address conversion, (d) in response to receiving a command to delete a specific file, identify from the directory one or more blocks of memory cells in which data of the specific file are stored, (e) cause all the data of the specific file stored in the identified one or more blocks of memory cells to be marked as obsolete, and (f) thereafter cause the obsolete data of the selected file to be erased in a manner that adds at least one erased block to the erase pool blocks, and (g) remove the directory record for the selected file, wherein all data and the directory record of the selected file are deleted from the memory system.

7. The memory system of claim 6, wherein the controller further operates (d) in response to identifying at least one of the one or more blocks to contain received data of only the specific file, to then (f) subsequently cause the at least one block to be erased.

8. The memory system of claim 7, wherein the controller further operates (d) in response to identifying at least one of the one or more blocks to also contain valid data of another file, then (f) subsequently causing the valid data of the at least one block to be consolidated with other valid data in another block, and thereafter causing the at least one block to be erased.

9. The memory system of claim 6, wherein the controller further operates to cause data of the specific file stored in the selected one or more blocks to be deleted by first listing the selected one or more blocks in a queue that also lists other blocks as a result of operations not involving receipt of a command to delete a file, and then later deleting the data of the selected one or more blocks and other blocks in order of their position within the queue.

10. The memory system of claim 6, additionally comprising:

a first queue that lists a plurality of said blocks of memory cells which contain only data identified in the directory records to be obsolete, and a second queue that lists a plurality of said blocks of memory cells which are storing obsolete data of one of the multiple files and valid data of at least one other of the multiple files, and wherein the controller further operates to (d) list in the first queue any of the one or more blocks of memory cells identified to store data of the specific file whose data are all marked in the directory records to be obsolete, and list in the second queue any of the one or more blocks of memory cells identified to store data of the specific file that also stores valid data of some other file, and (f) thereafter erase the data stored in the blocks listed in the first queue and garbage collect the data stored in the blocks of memory cells listed in the second queue.

11. A memory system capable of storing data of multiple files that are received by the memory system with unique file identifiers and offsets of data within individual files, comprising:

an array of non-volatile charge storing semiconductor memory cells organized into a plurality of individual blocks of memory cells that are simultaneously erased prior to new data being written therein, the individual blocks of memory cells being further divided into a plurality of pages of memory cells that are individually programmable with data of the multiple files, a directory including records that identify one or more of the blocks and pages of memory cells within the identified blocks in which data of individual ones of the received files are stored, at least one queue in which a plurality of blocks of memory cells containing obsolete data are listed, and a controller connected with the memory cell array that is configured to (a) cause data of the uniquely identified files received by the memory system to be stored in pages of one or more of the blocks of memory cells, (b) record in the directory the identity of the blocks of memory cells and locations therein in which data of the uniquely identified files are stored by their offset addresses, the controller directly translating the file identifiers and offsets received from a host into physical addresses of blocks and pages of memory cells in which data of the individual files are written without the use of any intermediate logical address conversion, (c) read data of the stored individual files by first accessing the directory records of the individual files to ascertain the blocks and pages of memory cells in which data of the individual files are stored, (d) in response to receiving a command to delete a specific file, identify from the directory one or more blocks of memory cells and pages therein in which data of the specific file are stored, (e) cause the identified one or more blocks of memory cells and pages therein to be listed in the at least one queue, (f) thereafter cause the data stored in the blocks of memory cells and pages therein that are listed in the at least one queue to be erased and the records of the specific file in the directory to be removed.

12. The memory system of claim 11, wherein the at least one queue comprises at least first and second queues that individually list a plurality of blocks, and wherein the controller is further configured to (e) cause (i) those of the identified one or more blocks of memory cells that contain only data of the specific file to be listed in the first queue, and (ii) those of the identified one or more blocks of memory cells that contain data of the specific file as well as valid data of another file to be listed in the second queue.

13. The memory system of claim 12, wherein the controller is further configured to (f) cause the valid data of the other file stored in one of the blocks of memory cells listed in the second queue to first be copied into another block not listed in the second queue and thereafter cause the data of the specific file and the other file in the one block of memory cells listed in the second queue to be erased.

14. A memory system capable of storing data of multiple files that are received by the memory system with unique file identifiers and offsets of data within individual files, comprising:

an array of non-volatile charge storing semiconductor memory cells organized into a plurality of blocks of memory cells, wherein the memory cells of individual blocks are simultaneously erased prior to new data being written therein, a directory including a plurality of records that individually identify locations within at least one of the blocks of memory cells in which data of one the received files are stored, and a controller connected with the memory cell array that operates in a manner comprising:

(a) causing data received by the memory system of the uniquely identified files to be individually stored in an identified at least one of the blocks of memory cells, (b) recording in the directory the identity of the at least one of the blocks of memory cells and locations therein in which data of the uniquely identified files are stored by their offset addresses, without the use of any intermediate logical address conversion, (c) in response to receiving a command to replace at least a portion of the data of a first one of the received files with update data, (i) causing update data received by the memory system along with the command to update data of the first one of the received files to be written into one or more blocks of memory cells, (ii) causing one of the records in the directory for the first one of the received files to be updated to identify the one or more blocks of memory cells in which update data are stored, (iii) marking as obsolete the at least a portion of the data stored for the first one of the received files that was replaced by the update data, and (iv) thereafter causing the obsolete data of the first one of the received files to be erased, (d) in response to receiving a command to delete a second one of the received files, (i) identifying from the directory one or more blocks of memory cells in which data of the second one of the received files are stored, (ii) causing all the data of the second one of the received files stored in the identified one or more blocks of memory cells to be marked as obsolete, and (iii) thereafter causing the obsolete data of the second one of the received files to be erased and the directory record for the second one of the received files to be removed from the directory, whereby the second one of the received files has been removed from the memory system.

15. The memory system of claim 14, wherein the controller operations of causing the obsolete data of the first or second one of the received files to be erased comprises:

recognizing when one or more blocks of memory cells contain only data marked obsolete, and thereafter causing all the data of the one or more recognized blocks of memory cells to be erased.

16. The memory system of claim 14, wherein the controller operations of causing the obsolete data of the first or second one of the received files to be erased comprises:

recognizing when one or more blocks of memory cells contain both data marked obsolete and valid data, thereafter causing the valid data of the recognized one or more blocks of memory cells to be consolidated with other valid data that are together stored in another block of memory cells, and thereafter causing the recognized one or more blocks to be erased.

17. The memory system of claim 14, wherein the controller additionally maintains a first queue of a plurality of blocks of memory cells that contain only data marked obsolete and a second queue of a plurality of blocks of memory cells that contain both data marked obsolete and valid data, wherein the controller operations of causing the obsolete data of the first or second of the received files to be erased comprises:
  recognizing when one or more blocks of memory cells contain only data marked obsolete, and add the one or more blocks of obsolete data to the first queue,
  thereafter causing all the data of the one or more blocks of memory cells listed in the first queue to be erased in an order specified by their position in the first queue,
  recognizing when one or more blocks of memory cells contain both data marked obsolete and valid data, and add the one or more blocks of obsolete and valid data to the second queue, and
  thereafter causing the data within the one or more blocks of memory cells listed in the second queue to be garbage collected in an order specified by their position in the second queue.

18. In a re-programmable non-volatile memory system with memory cells organized into blocks of memory cells that are erased together prior to new data being written into the blocks of memory cells, a method of operating the memory system when connected with a host, comprising:
  receiving data of files from the host, along with unique identifiers of the individual data files received,
  writing the individual received data files into one or more erased blocks of the memory system in which data of the identified files are written without the use of any intermediate logical address conversion,
  maintaining a directory of records for the data files written in the memory system, the records individually listing, for one of the unique file identifiers, the one or more blocks in which data of the identified file have been written,
  reading data of individual files stored in the memory system by first identifying the directory records for the files by their unique file identifiers, and thereafter reading data from the one or more blocks listed in the directory records for the individual files,
  receiving from the host a command to delete from the memory system one of the data files identified by its unique file identifier,
  identifying one or more blocks of memory cells containing data of the file to be deleted by reference to the directory record for the unique file identifier received from the host for the file to be deleted,
  marking as obsolete all the data of the file being deleted that are written in the identified one or more blocks,
  reclaiming data storage space occupied by the data of the file marked as obsolete in a manner to provide at least one erased block for the storage of additional data of files from the host, and
  deleting from the directory the record for the unique file identifier of the file being deleted,
  wherein execution of the command to delete from the memory system said one of the data files increases a number of erased blocks available for storing data files by at least one and neither data nor the directory record remain in the memory system for the unique file identifier of the deleted file.

19. The method of claim 18, wherein the blocks of memory cells of the memory system are individually divided into a plurality of pages of memory cells, and wherein the records of the directory also specify one or more pages of the blocks in which data of the files have been written.

20. The method of claim 18, wherein reclaiming data storage space occupied by the data of the file marked as obsolete additionally comprises:
  scheduling for erase any of the blocks containing only data of the file to be deleted that have been marked as obsolete, and
  scheduling for garbage collection any of the blocks containing valid data of another file in addition to data of the file to be deleted that have been marked as obsolete.

21. The method of claim 18, wherein receiving data of files and unique identifiers of the individual data files includes receiving data of files and unique identifiers for the individual data files that are generated by application programs being run on the host and includes receiving offset addresses of data within the received individual files.

22. The method of claim 21, wherein writing the individual received data files into one or more blocks of the memory system comprises writing the data as a plurality of separately identified groups of data contained within individual memory cell blocks and which individually contain data of the received files with continuous offset addresses.

23. The method of claim 22, further wherein the individual directory records additionally list the groups of data making up the data file represented by the record, the individual groups of data being designated by at least a physical memory cell block address and a corresponding offset address of data within the group.

24. The method of claim 23, further wherein marking as obsolete the data of the file to be deleted comprises marking one of the data groups of the record at a time as obsolete until all the data groups of the file to be deleted have been marked as obsolete.

25. The method of claim 24, further wherein (1) the marking as obsolete of a data group within one of the blocks into which data of only single file are written are placed in a queue for subsequent erasure, and (2) the marking as obsolete of a data group within one of the blocks into which data of another file exists is placed in a queue for subsequent garbage collection.

26. The method of claim 18, wherein reclaiming data storage space occupied by the data of the file marked as obsolete additionally comprises causing valid data of another file to be moved from at least one of the identified one or more blocks to another one or more blocks, and then the identified one or more blocks to be erased.

27. The method of claim 18, wherein receiving data of files from the host includes receiving data of files containing different amounts of data.

28. A method of operating a re-programmable non-volatile memory system with a host system whose application programs generate a plurality of data files assigned unique individual file identifiers with offsets of data within the individual files, the memory system having blocks of memory cells that are erased together prior to new data being written therein, comprising:
  maintaining a pool of erased blocks available for storage of data of the files, the blocks in the pool having been erased prior to being needed for the storage of data of the files,
  receiving from the host data of the files and their unique individual file identifiers,
  storing the received data files individually in one or more of the erase pool blocks of the memory system,
  directly translating file identifiers and offsets received from a host into physical addresses of blocks and pages of memory cells in which data of the individual files are written without the use of any intermediate logical address conversion, in response to receiving from the host a command to update one of the stored data files identified by its unique file identifier and an offset address that designates a portion of the data within the file that are to be replaced,
- writing into at least one block of the memory system updated data received from the host for the identified file, and
- marking obsolete original data of the identified file that have been updated, in response to receiving from the host a command to delete from the memory system one of the stored data files identified by its unique file identifier,
- identifying each of one or more blocks of memory cells containing data of the file being deleted,
- thereafter rendering obsolete all the data of the file being deleted that are stored in the identified one or more blocks, wherein thereafter no valid data remain in the memory system for the unique identifier of the file being deleted, and
- thereafter reclaiming space occupied by the obsolete data of the file being deleted in a manner that increases a number of erased blocks in the pool, wherein executing the received command to delete said one of the stored data files causes the number of erased blocks in the pool to be increased and no data to remain in the memory system for the unique identifier of the deleted file.

* * * * *